(12) United States Patent
Yi et al.

(10) Patent No.: US 11,755,116 B2
(45) Date of Patent: *Sep. 12, 2023

(54) FEEDBACK DEVICE AND METHOD FOR PROVIDING THERMAL FEEDBACK BY MEANS OF SAME

(71) Applicant: TEGWAY CO., LTD., Daejeon (KR)

(72) Inventors: Kyoung Soo Yi, Daejeon (KR); Se Hwan Lim, Daejeon (KR)

(73) Assignee: TEGWAY CO., LTD., Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/677,913

(22) Filed: Feb. 22, 2022

(65) Prior Publication Data

US 2022/0179493 A1 Jun. 9, 2022

Related U.S. Application Data

(63) Continuation of application No. 16/925,193, filed on Jul. 9, 2020, now Pat. No. 11,287,890, which is a
(Continued)

(30) Foreign Application Priority Data

May 19, 2017 (KR) .................. 10-2017-0062591
May 19, 2017 (KR) .................. 10-2017-0062592
(Continued)

(51) Int. Cl.
*G06F 3/01* (2006.01)
*A63F 13/285* (2014.01)
*H10N 10/13* (2023.01)

(52) U.S. Cl.
CPC ............ *G06F 3/016* (2013.01); *A63F 13/285* (2014.09); *G06F 3/011* (2013.01); *H10N 10/13* (2023.02)

(58) Field of Classification Search
None
See application file for complete search history.

(56) References Cited

U.S. PATENT DOCUMENTS

| 5,709,219 A | 1/1998 | Chen et al. |
| 5,803,810 A | 9/1998 | Norton et al. |
| | (Continued) | |

FOREIGN PATENT DOCUMENTS

| EP | 2 128 907 A1 | 12/2009 |
| EP | 2 511 793 A2 | 10/2012 |
| | (Continued) | |

OTHER PUBLICATIONS

Notice of Allowance_KR Patent Application No. 10-2017-0062591, dated Nov. 29, 2021.
(Continued)

*Primary Examiner* — Fekadeselassie Girma
(74) *Attorney, Agent, or Firm* — Maschoff Brennan

(57) ABSTRACT

The present invention relates to a feedback device and a thermal feedback provision method using the same. The thermal feedback provision method may include checking first operating power applied to a first thermoelectric couple group for a first thermoelectric operation and second operating power applied to a second thermoelectric couple group for a second thermoelectric operation when the first thermoelectric operation is initiated in the first thermoelectric couple group to initiate the output of the first thermal feedback after the second thermoelectric operation is initiated in the second thermoelectric couple group to initiate the output of the second thermal feedback and include applying cognitive enhancement power for enhancing a user's cognition to the first thermoelectric couple group from a time point at which the output of the first thermal feedback is
(Continued)

1640

| Thermal feedback intensity | Number of thermoelectric couple groups to which voltage is applied | Thermoelectric couple groups for heat distribution uniformity |
|---|---|---|
| Highest level | 5 | 1,2,3,4,5 |
| Higher middle level | 4 | 1,2,4,5 |
| Middle level | 3 | 1,3,5 |
| Lower middle level | 2 | 2,4 |
| Lowest level | 1 | 3 | initiated up to a first time point so that the user's cognition of the first thermal feedback is enhanced.

20 Claims, 61 Drawing Sheets

Related U.S. Application Data continuation of application No. 16/310,432, filed as application No. PCT/KR2017/010429 on Sep. 22, 2017, now Pat. No. 10,747,323.

(60) Provisional application No. 62/415,437, filed on Oct. 31, 2016.

(30) Foreign Application Priority Data

| May 19, 2017 | (KR) | ................ 10-2017-0062593 |
| Aug. 31, 2017 | (KR) | ................ 10-2017-0111462 |
| Aug. 31, 2017 | (KR) | ................ 10-2017-0111465 |

(56) References Cited

U.S. PATENT DOCUMENTS

| 5,952,728 | A | 9/1999 | Imanishi et al. |
| 6,353,623 | B1 | 3/2002 | Munks et al. |
| 6,362,740 | B1* | 3/2002 | Jung .................. G08B 3/1041 607/104 |
| 6,496,200 | B1* | 12/2002 | Snibbe .................. G06F 3/016 715/702 |
| 8,016,673 | B2 | 9/2011 | Takatsuka |
| 8,550,905 | B2 | 10/2013 | Mikhailov |
| 8,902,159 | B1* | 12/2014 | Matthews .............. G06F 3/039 463/47 |
| 9,672,702 | B2 | 6/2017 | Coish et al. |
| 10,101,810 | B2* | 10/2018 | Li .......................... G06F 3/016 |
| 10,408,688 | B2 | 9/2019 | Yi |
| 10,533,780 | B2 | 1/2020 | Yi |
| 10,533,900 | B1* | 1/2020 | Yi .......................... G08B 6/00 |
| 10,736,576 | B2 | 8/2020 | Yi |
| 10,747,323 | B2* | 8/2020 | Yi .......................... H10N 10/13 |
| 11,207,032 | B2* | 12/2021 | Yi .......................... G06F 3/016 |
| 11,287,890 | B2* | 3/2022 | Yi .......................... A63F 13/285 |
| 2005/0091989 | A1 | 5/2005 | Leija et al. |
| 2009/0149928 | A1* | 6/2009 | Relin .................... A61F 7/02 607/99 |
| 2010/0154856 | A1 | 6/2010 | Hiroyama et al. |
| 2010/0207573 | A1* | 8/2010 | Mo ........................ F21V 13/14 320/101 |
| 2012/0198616 | A1 | 8/2012 | Makansi et al. |
| 2012/0258800 | A1* | 10/2012 | Mikhailov .............. A63F 13/285 463/36 |
| 2013/0021234 | A1 | 1/2013 | Umminger et al. |
| 2013/0135214 | A1* | 5/2013 | Li .......................... G09F 19/00 345/173 |
| 2014/0165607 | A1 | 6/2014 | Alexander |
| 2014/0194726 | A1* | 7/2014 | Mishelevich ........ A61B 5/0036 600/545 |
| 2014/0338713 | A1 | 11/2014 | Nakanuma |
| 2014/0364212 | A1 | 12/2014 | Osman et al. |
| 2016/0056360 | A1 | 2/2016 | Cho et al. |
| 2016/0098095 | A1 | 4/2016 | Gonzalez-Banos et al. |
| 2016/0133151 | A1* | 5/2016 | O'Dowd ................ G06F 3/011 434/236 |
| 2016/0153508 | A1* | 6/2016 | Battlogg ................ A61F 2/38 188/267.2 |
| 2016/0238040 | A1* | 8/2016 | Gallo .................... A61B 34/74 |
| 2016/0246370 | A1* | 8/2016 | Osman .................. G06F 3/012 |
| 2016/0312505 | A1* | 10/2016 | Wuerth ................. H02J 50/10 |
| 2017/0084137 | A1* | 3/2017 | Coish .................... G08B 6/00 |
| 2017/0354190 | A1* | 12/2017 | Cauchy .................. A47C 7/744 |
| 2017/0365764 | A1 | 12/2017 | Shingai et al. |
| 2018/0095534 | A1 | 4/2018 | Omote |
| 2018/0098635 | A1* | 4/2018 | Jeon .................... A47C 15/004 |
| 2018/0335231 | A1* | 11/2018 | Gillen .................. H10N 10/13 |
| 2019/0063797 | A1* | 2/2019 | Yi .......................... F25B 21/04 |
| 2019/0148617 | A1* | 5/2019 | Yi .......................... H01L 23/373 136/205 |
| 2019/0250710 | A1* | 8/2019 | Yi .......................... A63F 13/28 |
| 2019/0381314 | A1* | 12/2019 | Howard .............. A61B 5/0071 |
| 2020/0025424 | A1* | 1/2020 | Cauchy ............... A41D 13/0005 |
| 2020/0046936 | A1* | 2/2020 | Nofzinger .............. A61F 7/10 |
| 2020/0060905 | A1* | 2/2020 | Bogie .................... G01C 3/08 |
| 2020/0341552 | A1* | 10/2020 | Yi .......................... H05K 7/20 |

FOREIGN PATENT DOCUMENTS

| JP | 2005-77066 A | 3/2005 |
| JP | 2008-227178 A | 9/2008 |
| JP | 2012-217861 A | 11/2012 |
| JP | 2013-175627 A | 9/2013 |
| KR | 10-2007-0066931 A | 6/2007 |
| KR | 10-1056950 B1 | 8/2011 |
| KR | 10-2013-0137417 A | 12/2013 |
| KR | 10-2014-0105045 A | 9/2014 |
| KR | 10-1493792 B1 | 2/2015 |
| KR | 10-1493797 A | 2/2015 |
| KR | 10-2015-0035634 A | 4/2015 |
| KR | 10-2010-0051386 A | 5/2015 |
| KR | 10-2016-0001312 | 1/2016 |
| KR | 10-2016-0033585 A | 3/2016 |
| KR | 10-2016-0036383 A | 4/2016 |
| KR | 10-2016-0117944 A | 10/2016 |
| KR | 10-2016-0124388 A | 10/2016 |
| KR | 10-2017-0089441 A | 8/2017 |

OTHER PUBLICATIONS

Office Action_KR Patent Application No. 10-2017-0062592, dated Nov. 29, 2021.
Office Action_KR Patent Application No. 10-2017-0062593, dated Nov. 29, 2021.
EP Search Report in Application No. 17863485.3 dated Oct. 6, 2020.
U.S. Notice of Allowance in U.S. Appl. No. 16/310,432 dated May 27, 2020.
U.S. Office Action in U.S. Appl. No. 15/633,341 dated Jun. 13, 2019.
U.S. Notice of Allowance in U.S. Appl. No. 15/858,351 dated Jun. 25, 2019.
U.S. Office Action in U.S. Appl. No. 15/633,501 dated Jun. 27, 2019.
ISR in application No. PCT/KR2017/010428 dated Jan. 8, 2018.
ISR in application No. PCT/KR2017/010430 dated May 29, 2018.
ISR in application No. PCT/KR2017/011865 dated Feb. 13, 2018.
ISR in application No. PCT/KR2017/011867 dated Mar. 19, 2018.
U.S. Notice of Allowance in U.S. Appl. No. 15/633,501 dated Apr. 2, 2020.
U.S. Office Action in U.S. Appl. No. 16/221,509 dated Jul. 31, 2020.

* cited by examiner

1640

| Thermal feedback intensity | Number of thermoelectric couple groups to which voltage is applied | Thermoelectric couple groups for heat distribution uniformity |
|---|---|---|
| Highest level | 5 | 1,2,3,4,5 |
| Higher middle level | 4 | 1,2,4,5 |
| Middle level | 3 | 1,3,5 |
| Lower middle level | 2 | 2,4 |
| Lowest level | 1 | 3 |

FIG. 18

| Grade | Forward voltage | Thermal feedback saturation temperature | Reverse voltage | Thermal feedback saturation temperature |
|---|---|---|---|---|
| 1 | V1+ | ΔT1+ | V1− | ΔT1−=−ΔT1+ |
| 2 | V2+ | ΔT2+=2ΔT1+ | V2− | ΔT2−=−2ΔT1+ |
| 3 | V3+ | ΔT3+=3ΔT1+ | V3− | ΔT3−=−3ΔT1+ |
| 4 | V4+ | ΔT4+=4ΔT1+ | V4− | ΔT4−=−4ΔT1+ |
| 5 | V5+ | ΔT5+=5ΔT1+ | V5− | ΔT5−=−5ΔT1+ |

| Neutral ratio | First thermoelectric element application voltage | Second thermoelectric element application voltage |
|---|---|---|
| 2 | V1+, V2+ | V2−, V4− |
| 2.5 | V2+ | V5− |
| 3 | V1+ | V3− |
| 4 | V1+ | V4− |
| 5 | V1+ | V5− |

FEEDBACK DEVICE AND METHOD FOR PROVIDING THERMAL FEEDBACK BY MEANS OF SAME

TECHNICAL FIELD

The present invention relates to a feedback device configured to output a thermal feedback and a thermal feedback providing method using the same.

BACKGROUND ART

Recently, with the development of technologies for virtual reality (VR) and augmented reality (AR), demands for providing feedback through various senses to improve user's immersion in content have been increasing. In particular, in the 2016 Consumer Electronics Show (CES), virtual reality technology was introduced as one of future promising technologies. With this trend, research is being actively carried out to provide a user experience with respect to all human senses including an olfactory sense and a tactile sense beyond a user experience (UX) which is mainly limited to a visual sense and an auditory sense.

A thermoelement (TE) is a device which produces an exothermic reaction or an endothermic reaction through a Peltier effect by receiving electric energy. The thermoelement is expected to be used for providing thermal feedback to a user. However, a conventional thermoelement mainly using a flat substrate has been limited in application thereof because it is difficult to press the conventional thermoelement against a user's body part.

However, in recent years, as development of a flexible thermoelement (FTE) has reached a successful stage, the flexible thermoelement is expected to overcome the problems of the conventional thermoelectric devices and to effectively transfer thermal feedback to a user.

DETAILED DESCRIPTION OF THE INVENTION

Technical Problem

The present invention is directed to providing a feedback device configured to provide a thermal feedback to a user and a thermal feedback providing method using the same.

The present invention is also directed to providing a thermal feedback providing method capable of improving a user's cognition of a thermal feedback.

The present invention is also directed to providing a thermal feedback providing method capable of reducing a sensing time of a user with respect to a thermal feedback.

The present invention is also directed to providing a thermal feedback providing method capable of reducing an output end time of a thermal feedback.

The present invention is also directed to providing a feedback device capable of improving waste heat dissipation performance and cold sensation provision performance.

The technical problem of the present invention is not limited to the aforementioned problems, and other problems which are not mentioned here can be clearly understood by those skilled in the art from the following description and the accompanying drawings.

Technical Solution

According to an aspect of the present invention, a method for providing a thermal feedback performed by a feedback device outputting the thermal feedback by transferring heat generated by a thermoelectric operation including at least one of an exothermic operation and an endothermic operation of a thermoelectric element to which power is applied to a user through a contact surface which contacts with the user's body part, wherein the thermoelectric element is provided by a thermoelectric couple array including a first thermoelectric couple group and a second thermoelectric couple group which are individually controllable, and wherein the contact surface includes a first contact surface corresponding to the first thermoelectric couple group and a second contact surface corresponding to the second thermoelectric couple group may comprise: when a first thermoelectric operation is initiated at the first thermoelectric couple group and an output of a first thermal feedback is initiated after a second thermoelectric operation is initiated at the second thermoelectric couple group and an output of a second thermal feedback is initiated, checking a first operating power applied to the first thermoelectric couple group for the first thermoelectric operation and a second operating power applied to the second thermoelectric couple group for the second thermoelectric operation, the first operating power being determined according to a type and an intensity of the first thermal feedback, the second operating power being determined according to a type and an intensity of the second thermal feedback; and applying a cognitive enhancing power to the first thermoelectric couple group for the user's cognitive enhancement from an output start time point of the first thermal feedback to a first time point so that the user's cognition to the first thermal feedback is enhanced.

Technical solutions of the present invention are not limited to the aforementioned solutions, and other solutions which are not mentioned here can be clearly understood by those skilled in the art from the following description and the accompanying drawings.

Advantageous Effects of the Invention

According to the present invention, it is possible to provide a thermal feedback to a user.

According to the present invention, it is also possible to improve a user's cognition of a thermal feedback.

According to the present invention, it is also possible to reduce a sensing time of a user with respect to a thermal feedback.

According to the present invention, it is also possible to reduce an output end time of a thermal feedback.

Advantageous effects of the invention are not limited to the aforementioned effects, and other advantageous effects which are not mentioned here will be clearly understood by those skilled in the art from the following description and the accompanying drawings.

DESCRIPTION OF THE DRAWINGS

FIG. 18 is a table regarding a voltage for providing a neutral thermal grill feedback through voltage adjustment according to an embodiment of the present invention.

BEST MODE

Figure 1:
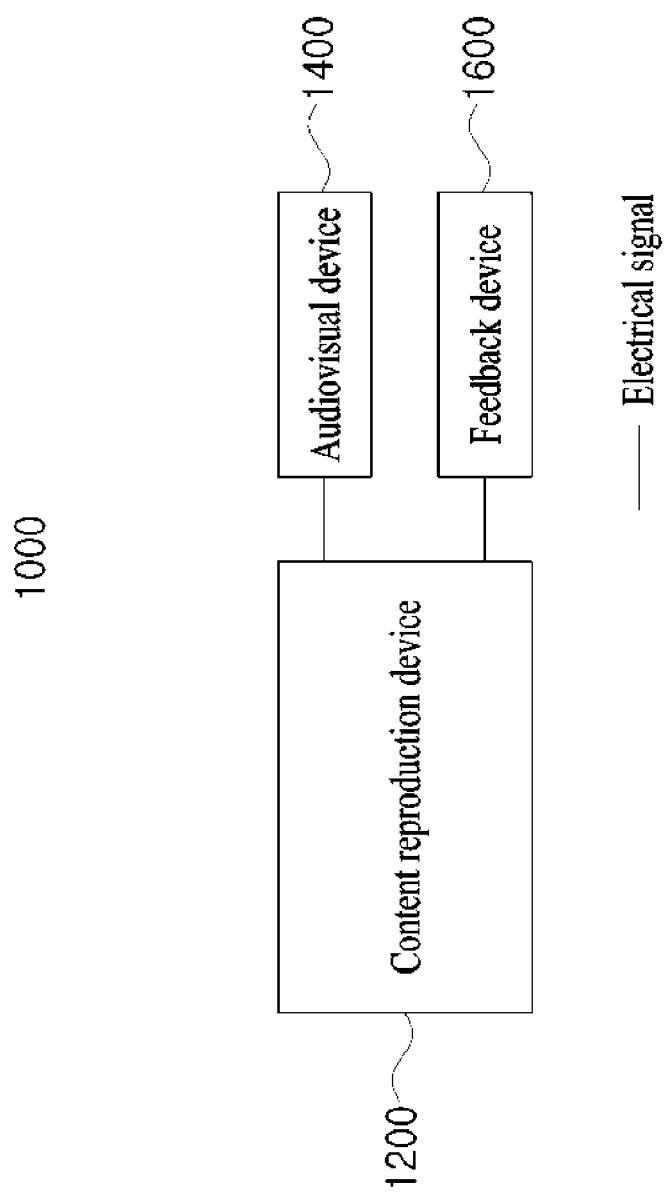
FIG. 1 is a block diagram showing a configuration of a thermal experience providing system 1000 according to an embodiment of the present invention.

To solve the above technical problems, according to an embodiment of the present invention, there is provided a method for providing a thermal feedback performed by a feedback device outputting the thermal feedback by transferring heat generated by a thermoelectric operation including at least one of an exothermic operation and an endothermic operation of a thermoelectric element to which power is applied to a user through a contact surface which contacts with the user's body part, wherein the thermoelectric element is provided by a thermoelectric couple array including a first thermoelectric couple group and a second thermoelectric couple group which are individually controllable, and wherein the contact surface includes a first contact surface corresponding to the first thermoelectric couple group and a second contact surface corresponding to the second thermoelectric couple group may comprise: when a first thermoelectric operation is initiated at the first thermoelectric couple group and an output of a first thermal feedback is initiated after a second thermoelectric operation is initiated at the second thermoelectric couple group and an output of a second thermal feedback is initiated, checking a first operating power applied to the first thermoelectric couple group for the first thermoelectric operation and a second operating power applied to the second thermoelectric couple group for the second thermoelectric operation, the first operating power being determined according to a type and an intensity of the first thermal feedback, the second operating power being determined according to a type and an intensity of the second thermal feedback; and applying a cognitive enhancing power to the first thermoelectric couple group for the user's cognitive enhancement from an output start time point of the first thermal feedback to a first time point so that the user's cognition to the first thermal feedback is enhanced.

Mode of the Invention

Hereinafter, embodiments will be described in detail with reference to the accompanying drawings. However, the present invention is not restricted or limited to the embodiments. Like reference numerals in the drawings denote like elements.

According to an aspect of the present invention, a method for providing a thermal feedback performed by a feedback device outputting the thermal feedback by transferring heat generated by a thermoelectric operation including at least one of an exothermic operation and an endothermic operation of a thermoelectric element to which power is applied to a user through a contact surface which contacts with the user's body part, wherein the thermoelectric element is provided by a thermoelectric couple array including a first thermoelectric couple group and a second thermoelectric couple group which are individually controllable, and wherein the contact surface includes a first contact surface corresponding to the first thermoelectric couple group and a second contact surface corresponding to the second thermoelectric couple group may comprise: when a first thermoelectric operation is initiated at the first thermoelectric couple group and an output of a first thermal feedback is initiated after a second thermoelectric operation is initiated at the second thermoelectric couple group and an output of a second thermal feedback is initiated, checking a first operating power applied to the first thermoelectric couple group for the first thermoelectric operation and a second operating power applied to the second thermoelectric couple group for the second thermoelectric operation, the first operating power being determined according to a type and an intensity of the first thermal feedback, the second operating power being determined according to a type and an intensity of the second thermal feedback; and applying a cognitive enhancing power to the first thermoelectric couple group for the user's cognitive enhancement from an output start time point of the first thermal feedback to a first time point so that the user's cognition to the first thermal feedback is enhanced.

Herein, the cognitive enhancing power may include a first excess power generating a first excess time interval in which a temperature of the first contact surface exceeds a first target temperature according to a type and an intensity of the first thermal feedback, and the applying the cognitive enhancing power may be applying the first excess power from an output start time point of the first thermal feedback to the first time point.

Herein, the method for providing a thermal feedback according an aspect of the present invention may further comprise applying the first operating power to the first thermoelectric couple group such that a temperature of the first contact surface reaches to the first target temperature at the elapse of the first time point.

Herein, the first excess power may be a power in the same direction as the first operating power.

Herein, the first excess power may be in the same direction as the first operating power, and a voltage level of the first excess power is greater than a voltage level of the first operating power.

Herein, the applying the cognitive enhancing power may be applying the first excess power in the form of a duty signal.

Herein, when performing the applying the cognitive enhancing power, when a 1-1 excess power having a first voltage level is applied to the first thermoelectric couple group, a temperature of the first contact surface may exceed the first target temperature faster than applying a 1-2 excess power having a second voltage level to the first thermoelectric couple group, wherein the second voltage level is less than the first voltage level.

Herein, when performing the applying the cognitive enhancing power, when the first excess power is applied from an output start time point of the first thermal feedback to the first time point, a temperature variance of the first contact surface may be larger than a temperature variance of applying the first excess power from the output start time point of the first thermal feedback to a predetermined time point, wherein the predetermined time point is a time point before the first time point.

Herein, when performing the applying the cognitive enhancing power, when an intensity of the first thermal feedback is a first intensity, and the first target temperature is a 1-1 target temperature corresponding to the first intensity, the first excess power may be applied so that a temperature of the first contact surface does not reach a 1-2 target temperature corresponding to a second intensity higher than the first intensity in the first excess time interval.

Herein, when performing the applying the cognitive enhancing power, the first time point for applying the first excess power may be determined such that an application of the first excess power is stopped after a temperature of the first contact surface exceeds the first target temperature by applying the first excess power.

Herein, the applying the cognitive enhancing power may be applying the first excess power such that a temperature variance of the first contact surface during a time interval from an output start time point of the first thermal feedback to the first time point that the first excess power is applied is greater than a temperature variance of the first contact surface during the time interval that the first operating power.

Herein, a second excess power generating a second excess time interval in which a temperature of the second contact surface exceeds a second target temperature according to a type and an intensity of the second thermal feedback may be applied to the second thermoelectric couple group from an output start time point of the first thermal feedback to a second time point so that the user's cognition to the second thermal feedback is enhanced.

Herein, the applying the cognitive enhancing power may be determining an output start time point of the first thermal feedback to be any one of a time point between an output start time point of the second thermal feedback and the second time point so that the first excess time interval overlaps at least a portion of the second excess time interval.

Herein, the applying the cognitive enhancing power may be determining an output start time point of the first thermal feedback to the second time point so that a temperature change of the first contact surface starts when a temperature change direction of the second contact surface changes.

Herein, the applying the cognitive enhancing power may be determining an output start time point of the first thermal feedback to a time point after the second time point so that the first excess time interval does not overlap the second excess time interval.

Herein, when performing the recognizing the cognitive enhancing power, the cognitive enhancing power may include the first operating power, and when an intensity of the first thermal feedback is higher than an intensity of the second thermal feedback, the first operating power may be applied from an output start time point of the first thermal feedback.

Herein, when performing the recognizing the cognitive enhancing power, the cognitive enhancing power may include the first operating power, and when an intensity of the first thermal feedback is lower than an intensity of the second thermal feedback, the first operating power may be applied from an output start time point of the first thermal feedback.

Herein, when performing the recognizing the cognitive enhancing power, when an intensity of the first thermal feedback is lower than an intensity of the second thermal feedback, the first excess power may be applied from an output start time point of the first thermal feedback to the first time point.

Herein, when performing the recognizing the cognitive enhancing power, when an intensity of the first thermal feedback is lower than an intensity of the second thermal feedback, a power having a voltage level smaller than the first operating power may be applied during a predetermined period of time from an output start time point of the first thermal feedback so that a temperature of the first contact surface gradually reaches the first target temperature.

Herein, when performing the checking the second operating power, if it is confirmed that a direction of the first operating power and a direction of the second operating power is different, when performing the recognizing the cognitive enhancing power, the cognitive enhancing power may include the first operating power, and the first operating power may be applied from an output start time point of the first thermal feedback.

Herein, when performing the checking the second operating power, if the first operating power is confirmed as a power for outputting cold feedback to make the user feel cold, when performing the recognizing the cognitive enhancing power, the cognitive enhancing power may include the first operating power, and the first operating power may be applied from an output start time point of the first thermal feedback.

Herein, when performing the checking the second operating power, if the first operating power is confirmed as a power for outputting warm feedback to make the user feel warm, when performing the recognizing the cognitive enhancing power, the first excess power may be applied from an output start time point of the first thermal feedback to the first time point.

According to another aspect of the present invention, a method for providing a thermal feedback performed by a feedback device outputting the thermal feedback by transferring heat generated by a thermoelectric operation to a user through a contact surface which contacts with the user's body part by using a heat output module in which a plurality of thermoelectric couple groups are arranged in one direction individually performing the thermoelectric operation which includes at least one of an exothermic operation and an endothermic operation may comprise: taking instruction to output the thermal feedback of a specific intensity of which a saturation temperature is a first temperature sequentially from a first thermoelectric couple group to a Nth thermoelectric couple group wherein the N is a natural number of 2 or more; maintaining a temperature of a n−1th thermoelectric couple group to a first temperature which is a thermoelectric couple group neighboring a nth thermoelectric couple group wherein the n is a natural number of N or less; instantaneously adjusting a temperature of the nth thermoelectric couple group to a second temperature higher than the first temperature so that the user's cognition to a thermal feedback corresponding to the nth thermoelectric couple group is enhanced; and maintaining a temperature of the nth thermoelectric couple group to the first temperature.

According to another aspect of the present invention, a method for providing a thermal feedback performed by a feedback device outputting the thermal feedback by transferring heat generated by a thermoelectric operation to a user through a contact surface which contacts with the user's body part by using a heat output module in which a plurality of thermoelectric couple groups are arranged in one direction individually performing the thermoelectric operation which includes at least one of an exothermic operation and an endothermic operation may comprise: taking instruction to output the thermal feedback of a specific intensity of which a saturation temperature is a first temperature sequentially from a first thermoelectric couple group to a Nth thermoelectric couple group wherein the N is a natural number of 2 or more; applying a first voltage to a nth thermoelectric couple group for reaching a temperature of the nth thermoelectric couple group to a second temperature which is a saturation temperature higher than the first temperature wherein the n is a natural number of less than N; applying a second voltage to the nth thermoelectric couple group for reaching a temperature of the nth thermoelectric couple group to the first temperature so that a temperature of the nth thermoelectric couple group is maintained to the first temperature when a temperature of the nth thermoelectric couple group reaches to a third temperature between the first temperature and the second temperature; applying the first voltage to a n+1th thermoelectric couple group such that a temperature of the n+1th thermoelectric couple group neighboring the nth thermoelectric couple group reaches the third temperature after a temperature of the nth thermoelectric couple group becomes lower than the second temperature; and applying the second voltage to the nth thermoelectric couple group so that a temperature of the n+1 thermoelectric couple group is maintained to the first temperature when a temperature of the n+1 thermoelectric couple group reaches the third temperature.

According to another aspect of the present invention, a feedback device may comprise: a heat output module outputting a thermal feedback by transferring heat generated by a thermoelectric operation to a user through a contact surface comprising: a thermoelectric element performing a thermoelectric operation including at least one of an exothermic operation and an endothermic operation, a power terminal supplying power to the thermoelectric element for the thermoelectric operation and a contact surface which is provided on one side of the thermoelectric element and contacts with the user's body part, wherein the thermoelectric element is provided by a thermoelectric couple array including a first thermoelectric couple group and a second thermoelectric couple group which can be individually controllable; and when a second thermoelectric operation is initiated at the second thermoelectric couple group and an output of a second thermal feedback is initiated after a first thermoelectric operation is initiated at the first thermoelectric couple group and an output of a first thermal feedback is initiated, a feedback controller applying excess power which causes an excess section in which a temperature of the second thermoelectric couple group exceeds a saturation temperature according to an intensity of the second thermal feedback for a predetermined time point from an output start time point of the second thermal feedback so that the user's cognition to the second thermal feedback is enhanced.

According to an aspect of the present invention, a thermal feedback provision method, which is performed by a feedback device configured to output a thermal feedback by transferring, to a user through a contact surface in contact with the user's body part, heat generated by a thermoelectric operation including at least one of an exothermic operation and an endothermic operation of a thermoelectric element to which power is applied, may include checking operating power applied to the thermoelectric element in order to output the thermal feedback, the operating power being determined according to the type and intensity of the thermal feedback; applying reduction power greater than the operating power during a predetermined time after a time point at which the output of the thermal feedback is initiated to reduce the time it takes for the temperature of the contact surface to reach a target temperature corresponding to the type and intensity of the thermal feedback; and applying the operating power to the thermoelectric element after the predetermined time elapses.

Herein, the reduction power may be in the same direction as the operating power.

Herein, the applying of the reduction power may include applying the reduction power in the form of a duty signal.

Herein, in the applying of the reduction power, the temperature of the contact surface may more quickly reach the target temperature when a first reduction voltage having a first voltage magnitude is applied to the thermoelectric element than when a second reduction voltage having a second voltage magnitude, which is smaller than the first voltage magnitude, is applied to the thermoelectric element.

Herein, in the applying of the reduction power, the temperature of the contact surface may more quickly reach the target temperature when the reduction power is applied during a first time interval from the output initiation time point than when the reduction power is applied to the thermoelectric element during a second time interval, which is smaller than the first time interval, from the output initiation time point.

Herein, the applying of the reduction power may include applying the reduction power so that the target temperature is not exceeded after the temperature of the contact surface reaches the initial temperature.

Herein, the applying of the reduction power may include determining the voltage magnitude of the reduction power so that the temperature of the contact surface does not reach the target temperature during the predetermined time during which the reduction power is applied.

Herein, the applying of the reduction power may include determining the predetermined time so that the temperature of the contact surface does not reach the target temperature during the predetermined time during which the reduction power is applied.

Herein, the applying of the reduction power may include applying the reduction power so that a temperature variation of the contact surface during the predetermined time during which the reduction power is applied is greater than a temperature variation of the contact surface after the application of the reduction power is stopped.

Herein, the feedback device may adjust the intensity of the thermal feedback to a plurality of intensities and may apply the reduction power only when the intensity of the thermal feedback is greater than or equal to a predetermined intensity.

Herein, the feedback device may adjust the intensity of the thermal feedback to a plurality of intensities, and the thermal feedback provision method may further include acquiring the intensity of the thermal feedback; generating the operating power on the basis of the intensity of the thermal feedback; and determining whether to apply the end power according to whether the intensity of the thermal feedback is greater than or equal to a predetermined intensity.

Herein, the thermoelectric element may be provided as a thermoelectric couple array including a plurality of individually controllable thermoelectric couple groups, and the applying of the reduction power may include applying the reduction power to at least one of the plurality of thermoelectric couple groups.

Herein, the checking of the operating power may include acquiring thermal feedback data from an external apparatus and checking the operating power on the basis of the thermal feedback data.

Herein, the thermal feedback provision method of the present invention may further include acquiring thermal feedback data including information regarding the time point at which the output of the thermal feedback is initiated from an external apparatus, and the applying of the reduction power may include determining a time point at which the reduction power is applied to the thermoelectric element at a time point preceding the output initiation time point of the thermal feedback included in the thermal feedback data in consideration that the time it takes for the temperature of the contact surface to reach the target temperature when the reduction power is applied is reduced and applying the reduction power at the time point at which the reduction power is applied to the thermoelectric element.

According to another aspect of the present invention, a thermal experience provision method may include reproducing multimedia content including image data regarding a video and thermal feedback data regarding a thermal feedback linked to a specific scene in the video, acquiring a thermoelectric operation initiation time point set as a time point preceding an output time point of the specific scene in consideration of a delay time it takes for a user to sense the thermal feedback after a thermoelectric operation for the thermal feedback is initiated, and transmitting a feedback initiation message to a feedback device that outputs the thermal feedback by transferring heat generated in the thermoelectric element by the thermoelectric operation to the user through a contact surface in contact with the user's body part when a reproduction time point of the multimedia content reaches the thermoelectric operation initiation time point and outputting the specific scene through a display when the reproduction time point of the multimedia content reaches the output time point of the specific scene so that the specific scene is provided to the user with linkage to the thermal feedback at the output time point of the specific scene, wherein the acquiring of the thermoelectric operation initiation time point includes determining the thermoelectric operation initiation time point, considering that when the feedback device applies reduction power, which is power for reducing a response time it takes for the temperature of the contact surface to reach a target temperature according to the type and intensity of the thermal feedback, to the thermoelectric element, the delay time is reduced as the response time is reduced.

Herein, the delay time when the reduction power is applied from the feedback device to the thermoelectric element may be shorter than the delay time when the reduction power is not applied from the feedback device to the thermoelectric element.

Herein, the thermoelectric operation initiation time point may precede the reproduction time point of the specific scene by the delay time.

According to another aspect of the present invention, a feedback device may include a heat output module including a thermoelectric element configured to perform a thermoelectric operation including at least one of an exothermic operation and an endothermic operation, a power terminal configured to supply power for the thermoelectric operation to the thermoelectric element, and a contact surface provided on one side surface of the thermoelectric element to come into contact with a user's body part, the heat output module being configured to output a thermal feedback by transferring the heat generated by the thermoelectric operation to the user through the contact surface and include a feedback controller configured to check operating power applied to the thermoelectric element in order to output the thermal feedback, the operating power being determined according to the type and intensity of the thermal feedback and configured to apply reduction power greater than the operating power during a predetermined time after a time point at which the output of the thermal feedback is initiated to reduce the time it takes for the temperature of the contact surface to reach a target temperature corresponding to the type and intensity of the thermal feedback.

According to another aspect of the present invention, a feedback device that provides a thermal feedback for providing a thermal experience accompanied by multimedia content with linkage to a content reproduction device for driving the multimedia content may include a communication module configured to communicate with the content reproduction device; a heat output module including a thermoelectric element configured to perform a thermoelectric operation including at least one of an exothermic operation and an endothermic operation, a power terminal configured to supply power for the thermoelectric operation to the thermoelectric element, and a contact surface provided on one side surface of the thermoelectric element to come into contact with a user's body part, the heat output module being configured to output a thermal feedback by transferring the heat generated by the thermoelectric operation to the user through the contact surface; and a feedback controller configured to receive information regarding the thermal feedback from the content reproduction device through the communication module, select an operating voltage from among a plurality of predetermined voltages on the basis of the intensity of the thermal feedback corresponding to the information regarding the thermal feedback, acquire a reduction voltage higher than the operating voltage, and apply the reduction voltage during a predetermined time from a time point at which the output of the thermal feedback is initiated to reduce the time it takes for the temperature of the contact surface to reach a target temperature corresponding to the intensity of the thermal feedback.

According to another aspect of the present invention, a gaming controller that acquires a user's manipulation used for multimedia content including a game and a haptic application and provides a thermal feedback for providing a thermal experience accompanied by the multimedia content with linkage to a content reproduction device for driving the multimedia content may include a casing configured to form an outer appearance of the gaming controller, the casing including a grip part grasped by the user; an input module configured to receive a user input according to the user's manipulation; a communication module configured to communicate with the content reproduction device; a heat output module including a thermoelectric element configured to perform a thermoelectric operation, a power terminal configured to supply power to the thermoelectric element, and a contact surface provided at the grip part and configured to transfer heat generated by the thermoelectric operation of the thermoelectric element to the user, the heat output module being configured to output the thermal feedback by transferring the heat generated by the thermoelectric operation to the user through the contact surface; and a controller configured to acquire the user input received through the input module, transmit the user input to the content reproduction device through the communication module, receive information regarding the thermal feedback from the content reproduction device through the communication module, select an operating voltage from among a plurality of predetermined voltages on the basis of the intensity of the thermal feedback corresponding to the information regarding the thermal feedback, acquire a reduction voltage higher than the operating voltage, and apply the reduction voltage during a predetermined time from a time point at which the output of the thermal feedback is initiated to reduce the time it takes for the temperature of the contact surface to reach a target temperature corresponding to the intensity of the thermal feedback.

According to another aspect of the present invention, a thermal feedback provision method, which is performed by a feedback device configured to output a thermal feedback by transferring, to a user through a contact surface in contact with the user's body part, heat generated by a thermoelectric operation including at least one of an exothermic operation and an endothermic operation of a thermoelectric element to which power is applied, may include applying operating power to the thermoelectric element in order to output the thermal feedback; checking a time point at which the thermal feedback ends; applying end power for stopping the output of the thermal feedback to the thermoelectric element so that a rate at which the temperature of the contact surface changed according to the output of the thermal feedback reaches an initial temperature, which is a temperature before the output of the thermal feedback is initiated, during a predetermined time from the time point at which the thermal feedback ends; and stopping application of the end power after the predetermined time elapses.

Herein, the end power may be in the opposite direction to the operating power.

Herein, the end power may be in the opposite direction to the operating power, and the end power may have the same voltage magnitude as the operating power.

Herein, the end power may be in the opposite direction to the operating power, and the end power may have a different voltage magnitude from the operating power.

Herein, the applying of the end power may include applying the end power in the form of a duty signal.

Herein, in the applying of the end power, the temperature of the contact surface may more quickly reach the initial temperature when a first end voltage having a first voltage magnitude is applied to the thermoelectric element than when a second end voltage having a second voltage magnitude, which is smaller than the first voltage magnitude, is applied to the thermoelectric element.

Herein, in the applying of the end power, the temperature of the contact surface may more quickly reach the initial temperature when the end voltage is applied during a first time interval from the end time point than when the end voltage is applied to the thermoelectric element during a second time interval, which is smaller than the first time interval, from the end time point.

Herein, the applying of the end power may include applying the end power so that the initial temperature is not exceeded after the temperature of the contact surface reaches the initial temperature.

Herein, the applying of the end power may include determining the voltage magnitude of the end power so that the temperature of the contact surface does not reach the initial temperature during the predetermined time during which the end power is applied.

Herein, the applying of the end power may include determining the predetermined time so that the temperature of the contact surface does not reach the initial temperature during the predetermined time during which the end power is applied.

Herein, when the thermal feedback is a hot feedback for making the user feel a hot sensation, the operating voltage may be a forward voltage causing the exothermic operation in the thermoelectric element, and the end voltage may be a reverse voltage being applied in the opposite direction to the forward voltage.

Herein, when the thermal feedback is a cold feedback for making the user feel a cold sensation, the operating voltage may be a reverse voltage causing the endothermic operation in the thermoelectric element, and the end voltage may be a forward voltage being applied in the opposite direction to the reverse voltage.

Herein, the thermoelectric element may be provided as a thermoelectric couple array including a plurality of individually controllable thermoelectric couple groups, and the applying of the end power may include applying the end power to at least one of the plurality of thermoelectric couple groups.

Herein, when the thermal feedback is a thermal grill feedback that makes the user feel a pain sensation, the thermoelectric couple array may include a first thermoelectric couple group and a second thermoelectric couple group that are individually controllable. In the applying of the operating power to the thermoelectric element, a first forward voltage causing the exothermic operation in the first thermoelectric couple group may be applied to the first thermoelectric couple group, and a first reverse voltage causing the endothermic operation in the first thermoelectric couple group may be applied to the second thermoelectric couple group. In the applying of the end power, a second reverse voltage being applied in the opposite direction to the first forward voltage may be applied to the first thermoelectric couple group, and a second forward voltage being applied in the opposite direction to the first reverse voltage may be applied to the second thermoelectric couple group.

Herein, the checking of the end time point may include acquiring thermal feedback data including information regarding at least one of the type or intensity of the thermal feedback from an external apparatus and checking the end time point on the basis of the thermal feedback data.

Herein, when a first thermal feedback and then a second thermal feedback are output from the feedback device, the applying of the operating power to the thermoelectric element may include determining a time point at which the application of the operating power for outputting the second thermal feedback is applicable to the thermoelectric element according to the time it takes for the temperature of the contact surface to reach the initial temperature after the output of the first thermal feedback ends.

Herein, the applying of the end power may include applying the end power so that a temperature variation of the contact surface during the predetermined time during which the end power is applied is greater than a temperature variation of the contact surface after the application of the end power is stopped.

Herein, the feedback device may adjust the intensity of the thermal feedback to a plurality of intensities and may apply the end power only when the intensity of the thermal feedback is greater than or equal to a predetermined intensity.

Herein, the feedback device may adjust the intensity of the thermal feedback to a plurality of intensities, and the thermal feedback provision method may further include acquiring the intensity of the thermal feedback, generating the operating power on the basis of the intensity of the thermal feedback, and determining whether to apply the end power according to whether the intensity of the thermal feedback is greater than or equal to a predetermined intensity.

According to another aspect of the present invention, a feedback device may include a heat output module including a thermoelectric element configured to perform a thermoelectric operation including at least one of an exothermic operation and an endothermic operation, a power terminal configured to supply power for the thermoelectric operation to the thermoelectric element, and a contact surface provided on one side surface of the thermoelectric element to come into contact with a user's body part, the heat output module being configured to output a thermal feedback by transferring the heat generated by the thermoelectric operation to the user through the contact surface and include a feedback controller configured to apply operating power to the thermoelectric element in order to output the thermal feedback and configured to apply end power for stopping the output of the thermal feedback to the thermoelectric element at a first time point so that the temperature of the contact surface changed according to the output of the thermal feedback quickly reaches an initial temperature, which is a temperature before the output of the thermal feedback is initiated, when the output of the thermal feedback ends.

According to another aspect of the present invention, a feedback device that provides a thermal feedback for providing a thermal experience accompanied by multimedia content with linkage to a content reproduction device for driving the multimedia content may include a communication module configured to communicate with the content reproduction device; a heat output module including a thermoelectric element configured to perform a thermoelectric operation including at least one of an exothermic operation and an endothermic operation, a power terminal configured to supply power for the thermoelectric operation to the thermoelectric element, and a contact surface provided on one side surface of the thermoelectric element to come into contact with a user's body part, the heat output module being configured to output a thermal feedback by transferring the heat generated by the thermoelectric operation to the user through the contact surface; and a feedback controller configured to receive information regarding the thermal feedback from the content reproduction device through the communication module, select an operating voltage from among a plurality of predetermined voltages on the basis of the intensity of the thermal feedback corresponding to the information regarding the thermal feedback, generate operating power on the basis of the operating voltage, apply the operating power to the power terminal so that the heat output module outputs the thermal feedback, and apply, to the thermoelectric element, end power for stopping output of the thermal feedback at a first time point so that the temperature of the contact surface increasing along with the output of the thermal feedback quickly reaches an initial temperature, which is a temperature before the output of the thermal feedback is initiated when the output of the thermal feedback ends.

According to another aspect of the present invention, a gaming controller that acquires a user's manipulation used for multimedia content including a game and a haptic application and provides a thermal feedback for providing a thermal experience accompanied by the multimedia content with linkage to a content reproduction device for driving the multimedia content may include a casing configured to form an outer appearance of the gaming controller, the casing including a grip part grasped by the user; an input module configured to receive a user input according to the user's manipulation; a communication module configured to communicate with the content reproduction device; a heat output module including a thermoelectric element configured to perform a thermoelectric operation, a power terminal configured to supply power to the thermoelectric element, and a contact surface provided at the grip part and configured to transfer heat generated by the thermoelectric operation of the thermoelectric element to the user, the heat output module being configured to output the thermal feedback by transferring the heat generated by the thermoelectric operation to the user through the contact surface; and a controller configured to acquire the user input received through the input module, transmit the user input to the content reproduction device through the communication module, receive information regarding the thermal feedback from the content reproduction device through the communication module, select an operating voltage from among a plurality of predetermined voltages on the basis of the intensity of the thermal feedback corresponding to the information regarding the thermal feedback, generate operating power on the basis of the operating voltage, apply the operating power to the power terminal so that the heat output module outputs the thermal feedback, and apply, to the thermoelectric element, end power for stopping output of the thermal feedback at a first time point so that the temperature of the contact surface increasing along with the output of the thermal feedback quickly reaches an initial temperature, which is a temperature before the output of the thermal feedback is initiated when the output of the thermal feedback ends.

1. Thermal Experience Providing System

A thermal experience providing system 1000 according to an embodiment of the present invention will be described below.

1.1. Overview of Thermal Experience Providing System

A thermal experience providing system 1000 according to an exemplary embodiment of the present invention is a system which allows a user to experience a thermal experience (TX). Specifically, the thermal experience providing system 1000 may allow a user to experience a thermal experience by outputting thermal feedback as a part of a formed of a representation of content when multimedia content is reproduced.

Herein, the thermal feedback is a kind of thermal stimulation which allows a user to feel a thermal sensation by stimulating thermal sensory organs mainly distributed in a user's body and in the present specification the thermal feedback should be interpreted to include all the thermal stimuli which stimulate a thermal sensory system of the user.

Representative examples of the thermal feedback include hot feedback and cold feedback. The hot feedback means thermal feedback which allows a user to feel a hot sensation by applying hot heat to a hot spot distributed on a user's skin and the cold feedback means thermal feedback which allows a user to feel a cold sensation by applying cold heat to a cold spot distributed on a user's skin.

Herein, since the heat is a physical quantity represented by a scalar form, the expression, "applying cold heat," or "transferring cold heat," may not be an exact expression from a physical point of view. However, for convenience of description in the present description, a phenomenon in which heat is applied or transferred is expressed as "applying hot heat" or "transferring hot heat", and a phenomenon opposite to the phenomenon, i.e., a phenomenon in which heat is absorbed is expressed as "applying cold heat" or "transferring cold heat".

In addition, the thermal feedback in the present specification may further include thermal grill feedback in addition to the hot feedback and the cold feedback. When the hot heat and the cold heat are applied at the same time, a user perceives a pain sensation instead of individually perceiving a hot sensation and a cold sensation. The pain sensation is referred to as a so-called thermal grill illusion (TGI) (hereinafter, referred to as a "thermal pain sensation"). That is, thermal grill feedback means thermal feedback in which a combination of hot heat and cold heat is applied, and may be provided mainly by concurrently outputting the hot feedback and the cold feedback. In addition, the thermal grill feedback may be referred to as "thermal pain sensation feedback" in terms of providing a sensation close to pain. The thermal feedback will be described below in detail.

Herein, the multimedia content may include various kinds of content including a video, a game, a virtual reality application, and an augmented reality application.

In general, the multimedia content is provided to a user mainly in accordance with an audiovisual expression form based on an image and a voice. However, in the present invention, a thermal expression based on the above-mentioned thermal feedback may be included as an essential expression form.

Meanwhile, the "reproduction" of multimedia content should be interpreted to include all operations of executing and representing the multimedia content to a user. Therefore, the term "reproduction" in the present specification should be interpreted to include not only an operation of simply playing a video through a media player but also all operations of executing a game program, a training program, a virtual reality application, an augmented reality application, and the like.

1.2. Configuration of Thermal Experience Providing System

FIG. 1 is a block diagram showing a configuration of a thermal experience providing system 1000 according to an embodiment of the present invention.

Referring to FIG. 1, the thermal experience providing system 1000 may include a content reproduction device 1200, an audiovisual device 1400, and a feedback device 1600.

Herein, the content reproduction device 1200 may reproduce multimedia content, the audiovisual device 1400 may output an image or voice according to content reproduction, and the feedback device 1600 may output a thermal feedback according to content reproduction.

For example, the content reproduction device 1200 may decode video content including image data, voice data, or thermal feedback data and may deliver an image signal, a voice signal, or a thermal feedback signal to the audiovisual device 1400 and the feedback device 1600. The audiovisual device 1400 may receive an image signal and a voice signal and then output images and voice, and the feedback device 1600 may receive a thermal feedback signal and then output a thermal feedback.

The components of the thermal experience providing system 1000 will be described below in more detail.

1.2.1. Content Reproduction Device

The content reproduction device 1200 reproduces multimedia content.

Figure 2:
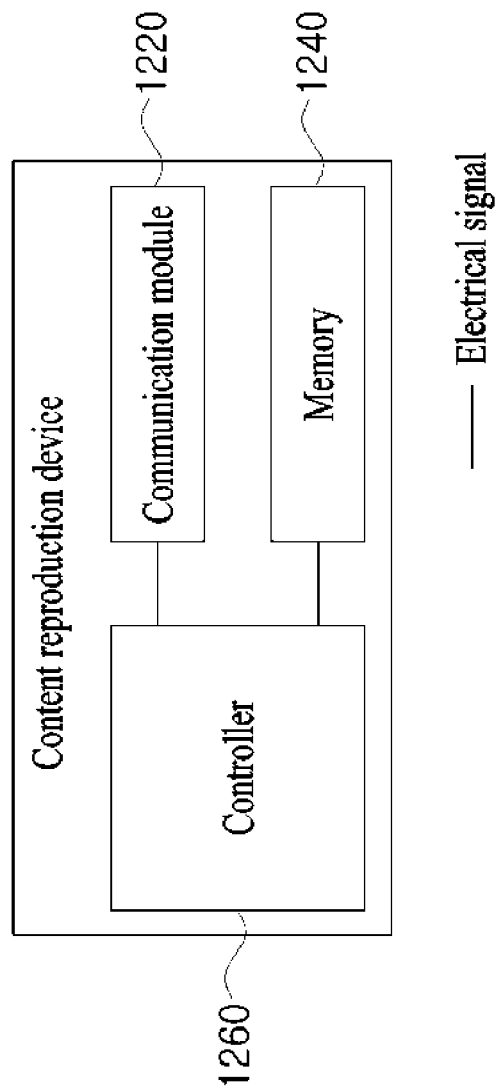
FIG. 2 is a block diagram showing a content reproduction device 1200 according to an embodiment of the present invention.

FIG. 2 is a block diagram showing the content reproduction device 1200 according to an embodiment of the present invention.

Referring to FIG. 2, the content reproduction device 1200 may include a communication module 1220, a memory 1240, and a controller 1260.

The communication module 1220 may communicate with an external apparatus. The content reproduction device 1200 may transmit or receive data to or from the audiovisual device 1400 or the feedback device 1600 through the communication module 1220. For example, through the communication module 1220, the content reproduction device 1200 may deliver an A/V signal to the audiovisual device 1400 or deliver a thermal feedback signal to the feedback device 1600. In addition, the content reproduction device 1200 may access the Internet through the communication module 1220 and then download multimedia content.

The communication module 1220 is largely divided into a wired communication module and a wireless communication module. Since the wired communication module and the wireless communication module each have advantages and disadvantages, the content reproduction device 1200 may be provided with both of the wired communication module and the wireless communication module.

Typically, the wired communication module may use, for example, local area network (LAN), universal serial bus (USB) communication, or other schemes.

The wireless communication module may use a wireless personal area network (WPAN)-based communication scheme such as Bluetooth or Zigbee. However, since a wireless communication protocol is not limited thereto, the wireless communication module may use a wireless local area network (WLAN)-based communication scheme such as Wi-Fi or other known communication schemes.

Meanwhile, as the wired/wireless communication protocol, an independent protocol developed by a game console manufacturer may be used.

The memory 1240 may store various kinds of information. The memory 1240 may temporarily or semi-permanently store data. Examples of the memory 1240 may include a hard disk drive (HDD), a solid state drive (SSD), a flash memory, a read-only memory (ROM), a random access memory (RAM), etc. The memory 1240 may be built into, or detachable from, the content reproduction device 1200.

An operating system (OS) for driving the content reproduction device 1200 or various kinds of data needed for operation of the content reproduction device 1200 in addition to content to be executed by the content reproduction device 1200 may be stored in the memory 1240.

The controller 1260 may control overall operation of the content reproduction device 1200. For example, the controller 1260 may load or reproduce multimedia content from the memory 1240 or may generate a control signal for controlling an image or voice or a thermal feedback output according to content reproduction.

The controller 1260 may be implemented as a central processing unit (CPU) or the like in hardware, software, or a combination thereof. The controller 1260 may be provided in the form of an electronic circuit for processing an electric signal to perform a control function when being implemented in hardware and may be provided in the form of a program or codes for driving a hardware circuit when being implemented in software.

1.2.2. Audiovisual Device

The audiovisual device 1400 may output images and voice according to multimedia reproduction.

Figure 3:
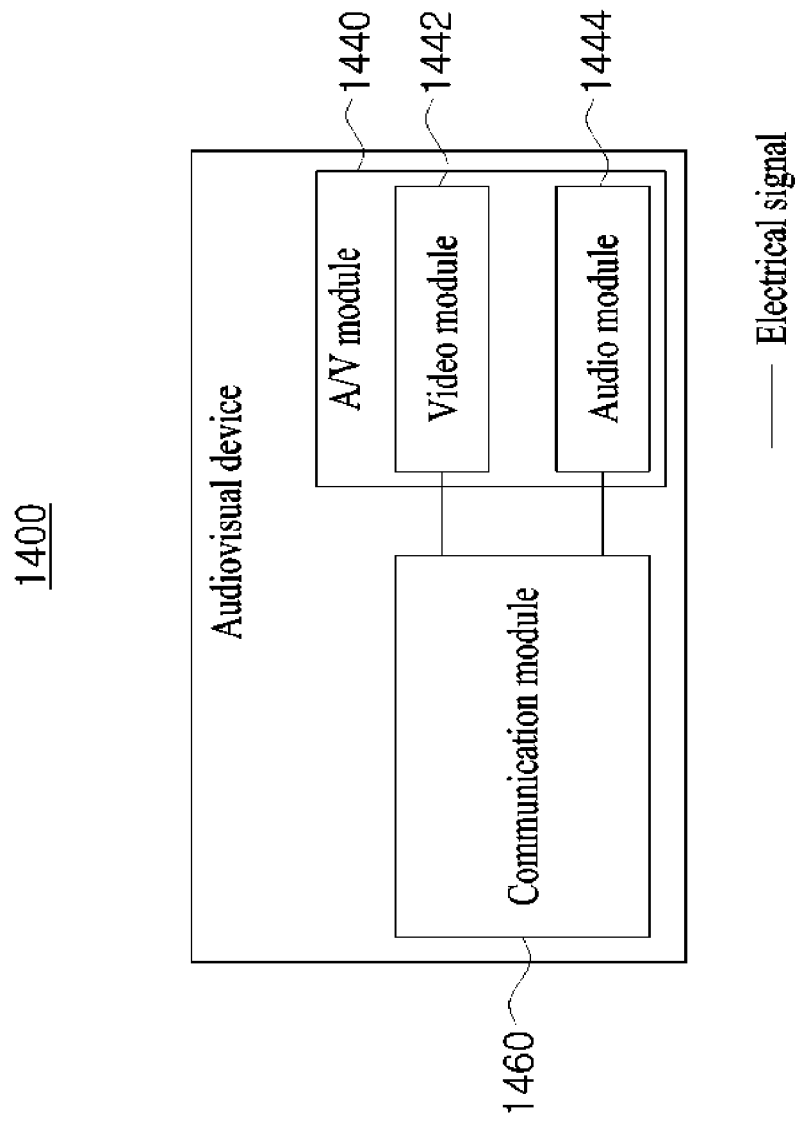
FIG. 3 is a block diagram showing a configuration of an audiovisual device 1400 according to an embodiment of the present invention.

FIG. 3 is a block diagram showing a configuration of the audiovisual device 1400 according to an embodiment of the present invention.

Referring to FIG. 3, the audiovisual device 1400 may include a communication module 1420 and an A/V module 1440.

The communication module 1420 may communicate with an external apparatus. The audiovisual device 1400 may transmit or receive data to or from the content reproduction device 1200 through the communication module 1420. For example, the audiovisual device 1400 may receive an A/V signal from the content reproduction device 1200 or the feedback device 1600 through the communication module 1420.

The communication module 1420 of the audiovisual device 1400 may be similar to the communication module 1220 of the content reproduction device 1200, and thus a detailed description thereof will be omitted.

The A/V module 1440 may provide images or voice to a user. To this end, the A/V module 1440 may include a video module 1442 and an audio module 1444.

The video module 1442 may be generally provided in the form of a display and may output an image according to an image signal received from the content reproduction device 1200 or the feedback device 1600. The audio module 1444 may be generally provided in the form of a speaker and may output voice according to a voice signal received from the content reproduction device 1200 or the feedback device 1600.

1.2.3. Feedback Device

The feedback device 1600 may output a thermal feedback according to multimedia reproduction.

Figure 4:
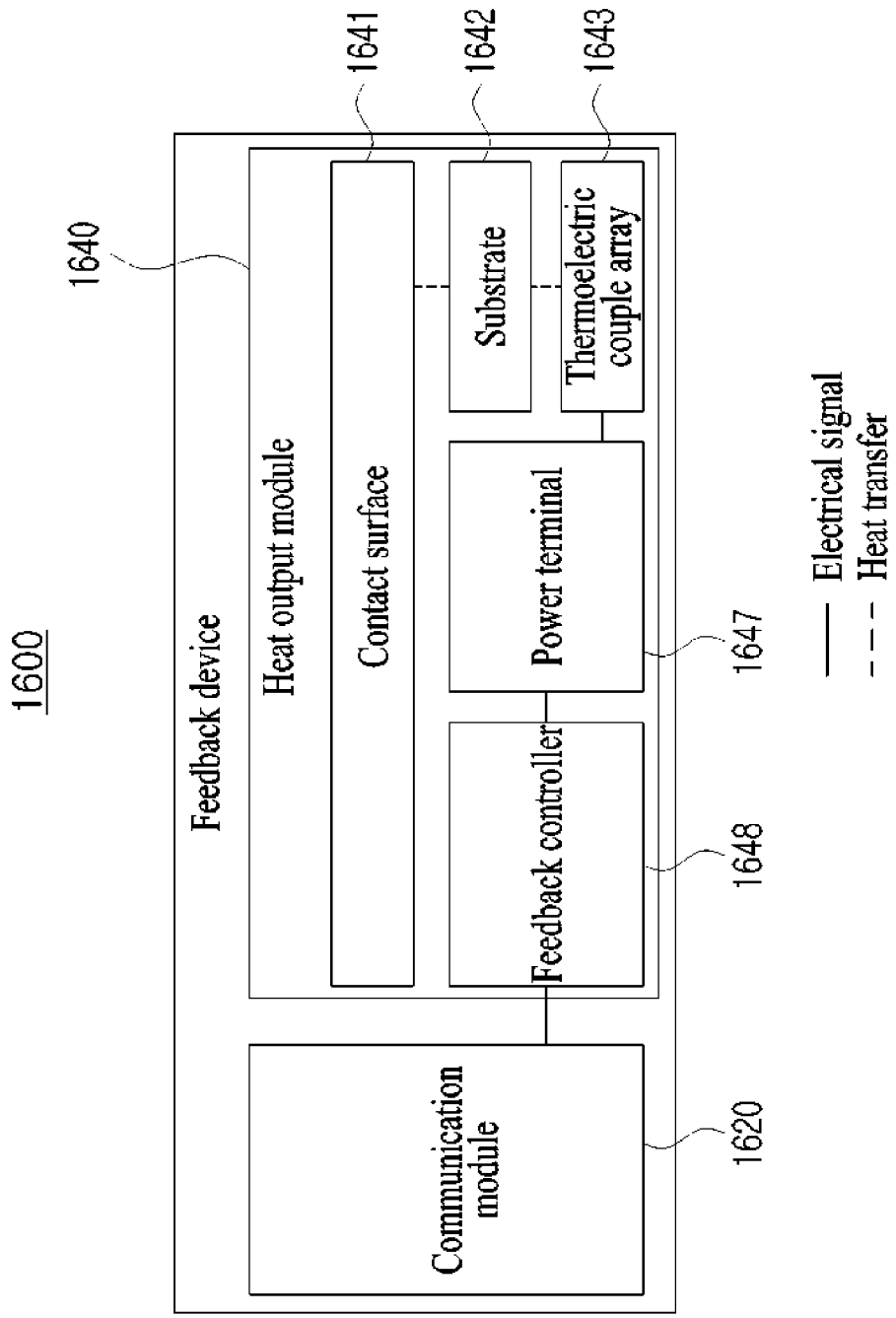
FIG. 4 is a block diagram showing a configuration of a feedback device 1600 according to an embodiment of the present invention.

FIG. 4 is a block diagram showing a configuration of the feedback device 1600 according to an embodiment of the present invention.

Referring to FIG. 4, the feedback device 1600 may include a communication module 1620 and a heat output module 1640.

According to an embodiment of the present invention, a feedback controller 1648 may be either separate from or included in the heat output module 1640. Also, the present invention is not limited thereto, and when the feedback controller 1648 is present outside the heat output module 1640, a separate feedback controller may be present inside the heat output module 1640 independently of the feedback controller 1648. In this specification, for convenience of description, it will be presumed that the feedback controller 1648 is included in the heat output module 1640.

The communication module 1620 may communicate with an external apparatus. The feedback device 1600 may transmit or receive data to or from the content reproduction device 1200 through the communication module 1620. For example, the feedback device 1600 may receive thermal feedback data from the content reproduction device 1200 through the communication module 1620. As another example, the feedback device 1600 may transmit a voice signal and/or an image signal to the audiovisual device 1400 through the communication module 1620.

The heat output module 1640 may output a thermal feedback. The thermal feedback may be output by the heat output module 1640, which includes a contact surface 1641 brought into contact with a user's body and a thermoelectric element connected to the contact surface 1641, applying hot heat or cold heat, which is generated in the thermoelectric element when power is applied, to the user's body through the contact surface 1641.

The heat output module 1640 may perform an exothermic operation, endothermic operation, or thermal grill operation according to the thermal feedback data received from the content reproduction device 1200 through the communication module 1620 to output a thermal feedback, and the user may experience a thermal experience by the output thermal feedback.

A detailed configuration or operation scheme of the heat output module 1640 will be described below in more detail.

2. Heat Output Module

The heat output module 1640 according to an embodiment of the present invention will be described below.

2.1. Overview of Heat Output Module

A heat output module 1640 may output thermal feedback for transferring hot heat and cold heat to a user by performing an exothermic operation, an endothermic operation, or a thermal grill operation. In a thermal experience providing system 1000, when a feedback device 1600 receives a thermal feedback signal, the heat output module 1640 mounted on the feedback device 1600 may output thermal feedback to allow the thermal experience providing system 1000 to provide thermal experience to a user.

In order to perform the above-described exothermic operation, endothermic operation, or thermal grill operation, the heat output module 1640 may use a thermoelectric element such as a Peltier element.

The Peltier effect is a thermoelectric phenomenon discovered by Jean Peltier in 1834. According to the Peltier effect, when an electric current is made to flow through a junction between dissimilar metals, an exothermic reaction occurs at one side of the junction and an endothermic reaction occurs at the other side of the junction according to a current direction. The Peltier element is an element which causes such a Peltier effect. The Peltier element was originally made of a joined body of dissimilar metals such as bismuth and antimony. However, recently, the Peltier element has been manufactured through a method of disposing N-P semiconductors between two metal plates so as to have higher thermoelectric efficiency.

When a current is applied to the Peltier element, heat generation and heat absorption may instantaneously occur at both metal plates, a switching between the heat generation and the heat absorption may be made according to a current direction, and a degree of the heat generation or absorption may be relatively precisely adjusted according to a current amount. Thus, the Peltier element is suitable to be used for an exothermic operation or an endothermic operation for thermal feedback. In particular, recently, as a flexible thermoelectric element has been developed, it has been possible to manufacture the flexible thermoelectric element in a form with which a user's body easily comes into contact therewith such that commercial availability of the flexible thermoelectric element as the feedback device 1600 has been increasing.

Therefore, as electricity is applied to the above-described thermoelectric element, the heat output module 1640 may perform an exothermic operation or an endothermic operation. Physically, an exothermic reaction and an endothermic reaction concurrently occur in the thermoelectric element to which electricity is applied. However, in the present specification, in the case of the heat output module 1640, an operation in which a surface in contact with a user's body generates heat is defined as an exothermic operation, and an operation in which the surface in contact with the user's body absorbs heat is defined as an endothermic operation. For example, the thermoelectric element may be manufactured by disposing N-P semiconductors on a substrate 1642. When a current is applied to the thermoelectric element, heat generation occurs at one side of the thermoelectric element, and heat absorption occurs at the other side of the thermoelectric element. When one side of the thermoelectric element facing the user's body is defined as a front side and a side opposite to the one side is defined as a rear side, an operation in which the heat generation occurs at the front side and an operation in which the heat absorption occurs at the rear side may be defined as an operation in which the heat output module 1640 performs an exothermic operation. On the contrary, an operation in which the heat absorption occurs at the front side and the heat generation occurs at the rear side may be defined as an operation in which the heat output module 1640 performs an endothermic operation.

In addition, since a thermoelectric effect is induced by electric charges flowing in the thermoelectric element, it is possible to describe electricity inducing the exothermic operation or the endothermic operation of the heat output module 1640 in terms of a current. In the present specification, however, for convenience of description, description will be made mainly in terms of a voltage. This is merely for convenience of description, and inventive thinking is not required for a person having ordinary skill in the art to which the present invention belongs (hereinafter referred to as "a person skilled in the art") to interpret the exothermic operation or the endothermic operation in terms of a current. Therefore, the present invention is not limited to expression in terms of the voltage.

2.2. Configuration of Heat Output Module

Figure 5:
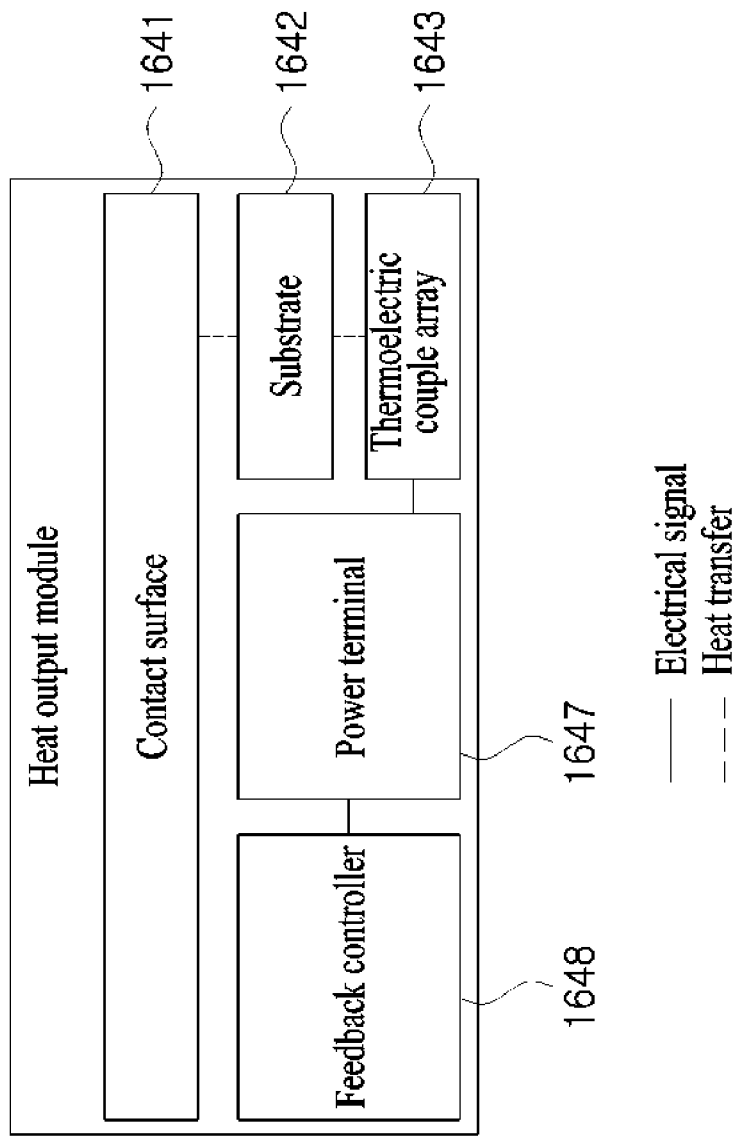
FIG. 5 is a block diagram showing a configuration of a heat output module 1640 according to an embodiment of the present invention.

FIG. 5 is a block diagram showing a configuration of the heat output module 1640 according to an embodiment of the present invention.

Referring to FIG. 5, the heat output module 1640 may include a contact surface 1641, a substrate 1642, a thermoelectric couple array 1643 disposed on the substrate 1642, a power terminal 1647 configured to apply power to the heat output module 1640, and a feedback controller 1648.

The contact surface 1641 is directly brought into contact with the user's body to transfer hot heat or cold heat generated in the heat output module 1640 to the user's skin. In other words, a portion of the outer surface of the feedback device 1600 that is directly brought into contact with the user's body may be used as the contact surface 1641. For example, the contact surface 1641 may be formed in a grip part, which is a part of the casing of the feedback device 1600 the user grasps.

As an example, the contact surface 1641 may be provided as a layer that is directly or indirectly attached to the outer surface (toward the user's body) of the thermoelectric couple array 1643 of the heat output module 1640 where an exothermic operation or endothermic operation is performed. This type of contact surface 1641 may be disposed between the user's skin and the thermoelectric couple array to perform heat transfer. To this end, the contact surface 1641 may be made of a material with high thermal conductivity to facilitate transfer of heat from the thermoelectric couple array 1643 to the user's body. Also, the layer-type contact surface 1641 also prevents direct exposure of the thermoelectric couple array 1643, thereby protecting the thermoelectric couple array 1643 from external impacts.

In the above description, the contact surface 1641 is disposed on the outer surface of the thermoelectric couple array 1643. However, the outer surface of the thermoelectric couple array 1643 itself may be the contact surface 1641. In other words, some or all of the front surface of the thermoelectric couple array 1643 may be used as the contact surface 1641.

The substrate 1642 serves to support a unit thermoelectric couple 1645 and is made of an insulating material. For example, ceramic may be selected as the material of the substrate 1642. The substrate 1642 may be of a flat plate shape, but it is not necessarily so.

The substrate 1642 may be made of a flexible material to have flexibility that may be used universally for several kinds of feedback devices 1600 having contact surfaces 1641 of various shapes. For example, for a gaming controller-type feedback device 1600, generally, a portion of the gamming controller a user grasps with the palm may be curved. In order to use the heat output module 1640 at the curved portion, it may be important that the heat output module 1640 has flexibility. To this end, the flexible material used for the substrate 1642 may be, for example, glass fiber or flexible plastic.

The thermoelectric couple array 1643 may be composed of a plurality of unit thermoelectric couples 1645 disposed on the substrate 1642. The unit thermoelectric couples 1645 may use different metal couples (e.g., Bismuth and Antimony, etc.), but N-type and P-type semiconductor couples may be used mainly.

In the unit thermoelectric couples 1645, the semiconductor couples may be electrically connected to each other at one end and may be electrically connected to the unit thermoelectric couples 1645 at the other end. Electrical connection between a couple of semiconductors 1645*a* and 1645*b* or with an adjacent semiconductor may be accomplished by a conductor member 1646 disposed on the substrate 1642. The conductor member 1646 may be a lead or an electrode made of copper, silver, or the like.

Electrical connection of the unit thermoelectric couples 1645 may be mainly accomplished as a serial connection, and the unit thermoelectric couples 1645 connected in series to one another may form the thermoelectric couple group 1644, and such thermoelectric couple groups 1644 may form the thermoelectric couple array 1643.

The power terminal 1647 may apply power to the heat output module 1640. The thermoelectric couple array 1643 may dissipate or absorb heat according to a voltage magnitude and a current direction of the power applied to the power terminal 1647. In more detail, two such power terminals 1647 may be connected to each of the thermoelectric couple groups 1644. Accordingly, when there are several thermoelectric couple groups 1644, two power terminals 1647 may be disposed for each of the thermoelectric couple groups 1644. According to such a connection scheme, a voltage magnitude or a current direction may be individually controlled for each of the thermoelectric couple groups 1644 to determine whether to perform an exothermic operation or an endothermic operation and adjust a degree to which the exothermic operation or endothermic operation is performed.

As will be described later, the power terminal 1647 may receive an electric signal output by the feedback controller 1648. As a result, the feedback controller 1648 may adjust the direction or size of the electric signal to control the exothermic operation and the endothermic operation of the heat output module 1640. Also, when there are a plurality of thermoelectric couple groups 1644, electric signals applied to power terminals 1647 may be individually adjusted to individually control the thermoelectric couple groups 1644.

The feedback controller 1648 may apply electric signals to the thermoelectric couple array 1643 through the power terminals 1647. In detail, the feedback controller 1648 may receive information regarding a thermal feedback from the controller 1260 of the content reproduction device 1200 through the communication module 1620, interpret the information regarding the thermal feedback to determine the type or intensity of the thermal feedback, and allow the thermoelectric couple array 1643 to output the thermal feedback by generating an electric signal and applying the electric signal to the power terminals 1647 according to a result of the determination.

To this end, the feedback controller 1648 may compute and process various kinds of information and output an electric signal to the thermoelectric couple array 1643 according to a result of the processing to control operation of the thermoelectric couple array 1643. Accordingly, the feedback controller 1648 may be implemented as a computer or the like in hardware, software, or a combination thereof. The feedback controller 1648 may be provided in the form of an electronic circuit for processing an electric signal to perform a control function when being implemented in hardware and may be provided in the form of a program or codes for driving a hardware circuit when being implemented in software.

Such a plurality of heat output modules 1640 may be provided to the feedback device 1600. For example, when the feedback device 1600 has a plurality of grip parts, each of the grip parts of the feedback device 1600 may be equipped with the heat output module 1640. When a plurality of heat output modules 1640 are provided to a single feedback device 1600, a feedback controller may be provided for each of the heat output modules 1640 of the feedback device 1600 or a single feedback controller for managing all the heat output modules 1640 may be provided in an integrated manner. Also, when a plurality of feedback devices 1600 are provided in the thermal experience providing system 1000, one or more heat output modules 1640 may be disposed in each of the feedback devices 1600.

2.3. Aspect of Heat Output Module

Some exemplary aspects of the heat output module 1640 will be described based on the above description of the configuration of the heat output module 1640.

Figure 6:
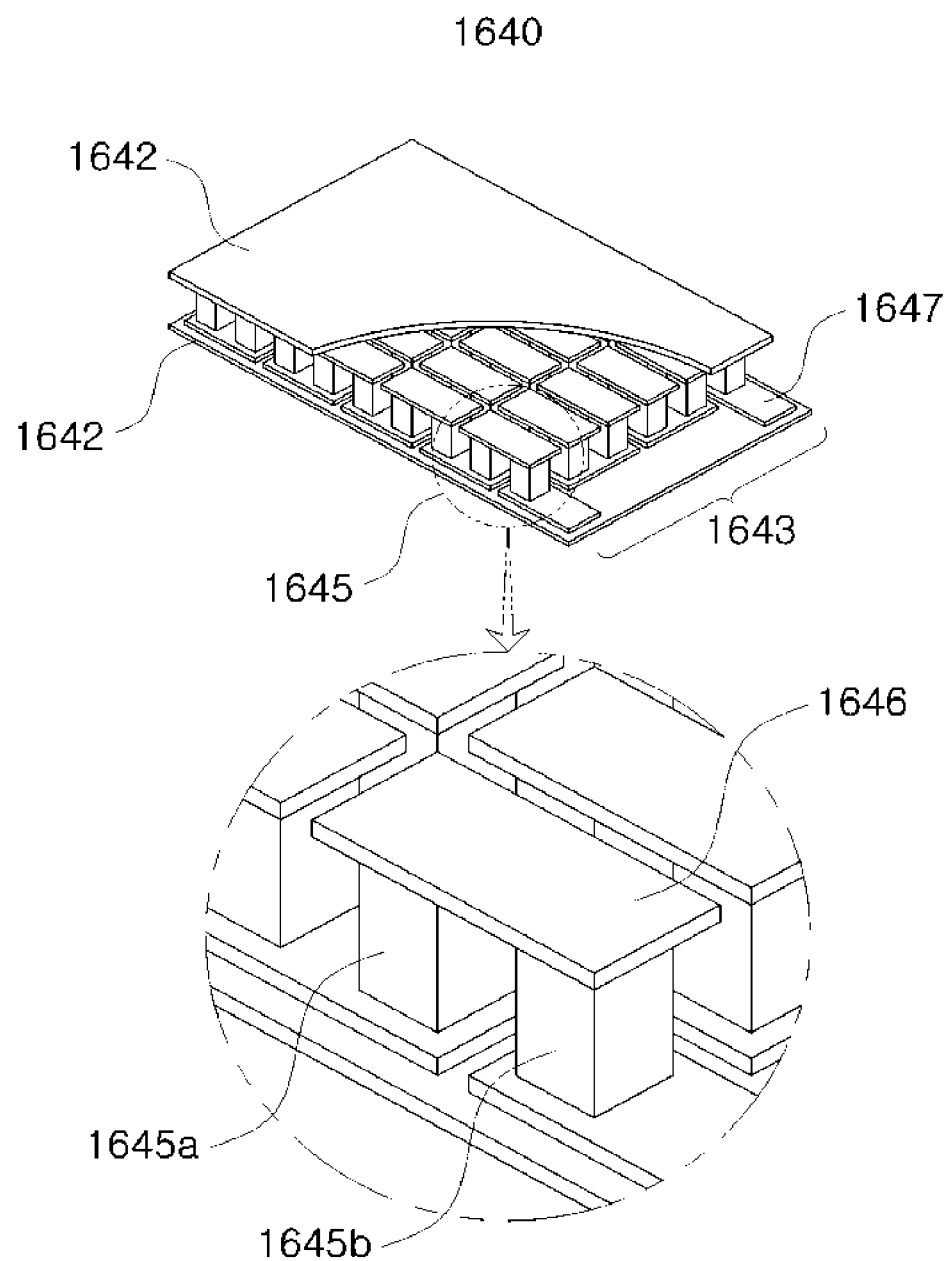
FIG. 6 is a diagram showing an aspect of the heat output module 1640 according to an embodiment of the present invention.

FIG. 6 is a diagram showing an aspect of the heat output module 1640 according to an embodiment of the present invention.

Referring to FIG. 6, according to an aspect of the heat output module 1640, a pair of substrates 1642 may be provided to face each other. A contact surface 1641 may be located outside one of the two substrates 1642 to transfer heat generated in the heat output module 1640 to a user's body. Also, when a flexible substrate 1642 is used as the substrate 1642, flexibility may be imparted to the heat output module 1640.

A plurality of unit thermoelectric couples 1645 are located between the substrates 1642. Each of the unit thermoelectric couples 1645 may be composed of a semiconductor couple of an N-type semiconductor and a P-type semiconductor. In each of the unit thermoelectric couples 1645, the N-type semiconductor and the P-type semiconductor are electrically connected to each other at one ends by a conductor member 1646. Also, the other ends of the N-type semiconductor and the P-type semiconductor of any unit thermoelectric couple 1645 are connected to the other ends of N-type semiconductor and the P-type semiconductor of an adjacent unit thermoelectric couple 1645, and thus electrical connection between the unit devices is accomplished through the conductor member 1646. Thus, the unit connection devices are connected in series to form a single thermoelectric couple group 1644. According to this aspect, the entire thermoelectric couple array 1643 is formed as a single thermoelectric couple group 1644, and all the unit thermoelectric couples 1645 are connected in series to each other between power terminals 1647. Thus, the heat output module 1640 performs the same operation over the entire front surface. That is, the heat output module 1640 may perform an exothermic operation when power is applied to the power terminals 1647 in one direction and may perform an endothermic operation when power is applied to the power terminals 1647 in the opposite direction.

Figure 7:
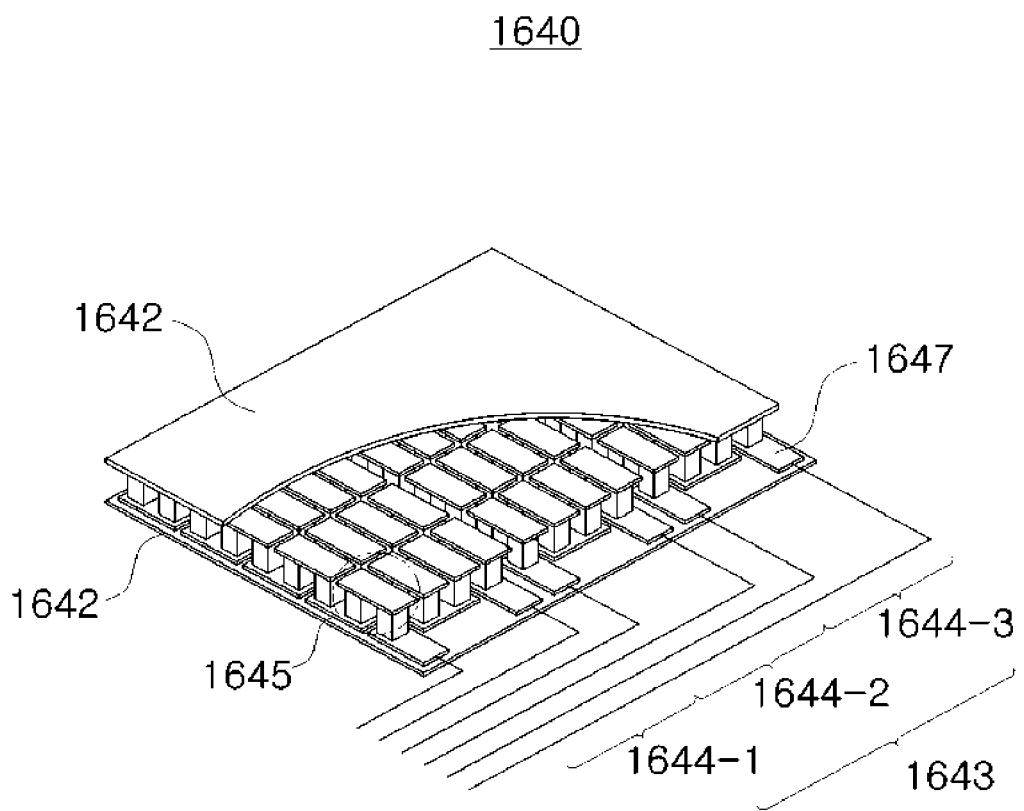
FIG. 7 is a diagram showing another aspect of the heat output module 1640 according to an embodiment of the present invention.

FIG. 7 is a diagram showing another aspect of the heat output module 1640 according to an embodiment of the present invention.

Referring to FIG. 7, the other aspect of the heat output module 1640 is similar to the above-described one aspect. However, according to this aspect, a thermoelectric couple array 1643 has a plurality of thermoelectric couple groups 1644, each of which is connected to a corresponding power terminal 1647. Thus, the thermoelectric couple groups 1644 may be individually controlled. For example, referring to FIG. 7, by applying electric current to a first thermoelectric couple group 1644 and a second thermoelectric couple group 1644 in different directions, the first thermoelectric couple group 1644 may perform an exothermic operation (in this case, the direction of electric current is set to "forward"), and also the second thermoelectric couple group 1644 may perform an endothermic operation (in this case, the direction of electric current is set to "reverse"). As another example, by applying different voltage magnitudes to a power terminal 1647 of the first thermoelectric couple group 1644 and a power terminal 1647 of the second thermoelectric couple group 1644, the first thermoelectric couple group 1644 and the second thermoelectric couple group 1644 may perform an exothermic operation or an endothermic operation to different degrees.

Figure 8:
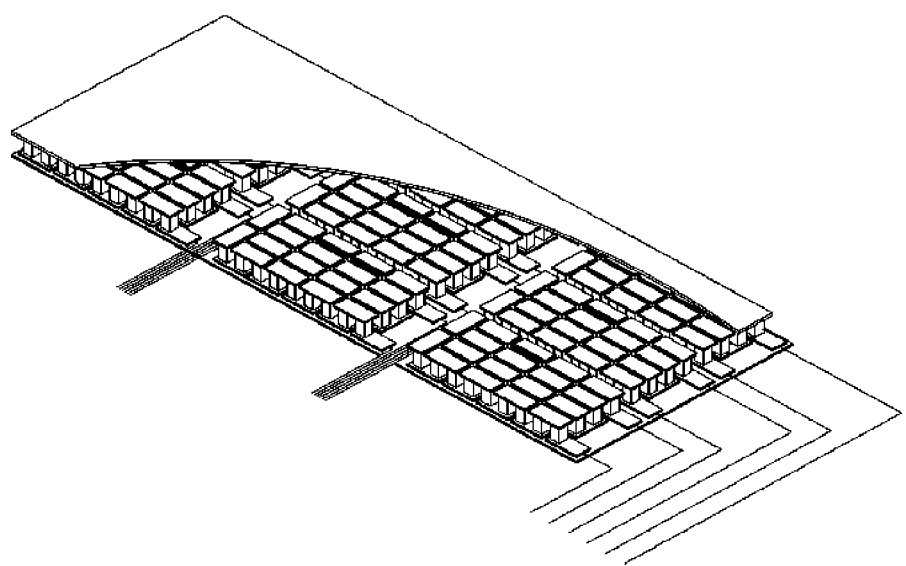
FIG. 8 is a diagram showing still another aspect of the heat output module 1640 according to an embodiment of the present invention.

In FIG. 7, it is shown that the thermoelectric couple groups 1644 are arranged in the thermoelectric couple array 1643 in one dimension. However, the thermoelectric couple groups 1644 may be arranged in two dimensions. FIG. 8 is a diagram showing still another aspect of the heat output module 1640 according to an embodiment of the present invention. Referring to FIG. 8, when thermoelectric couple groups 1644 disposed in two dimensions are used, operation control may be performed individually for more-segmented regions.

Figure 9:
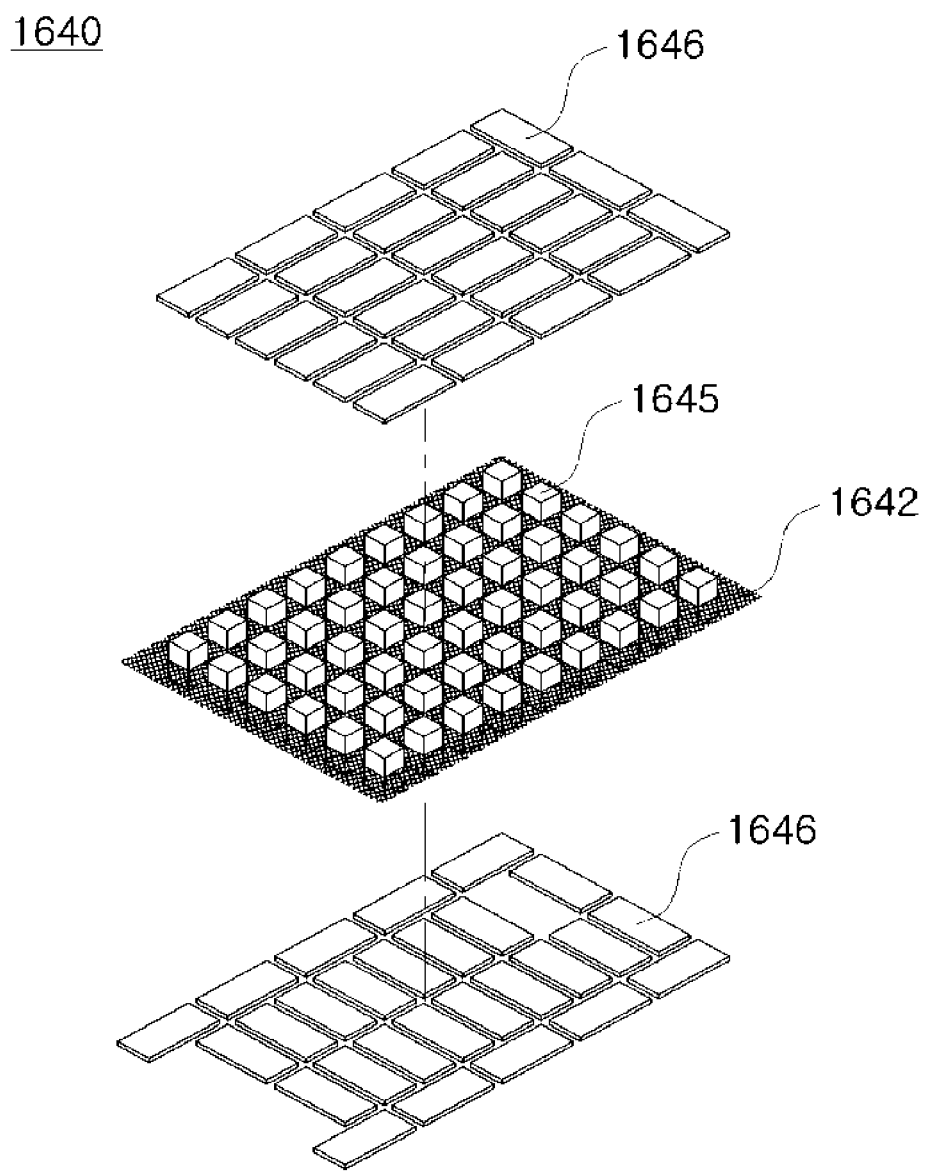
FIG. 9 is a diagram showing yet another aspect of the heat output module 1640 according to an embodiment of the present invention.

Also, according to the aspects of the heat output module 1640, it has been described that a pair of substrates 1642 facing each other are used, but a single substrate 1642 may be used. FIG. 9 is a diagram showing still another aspect of the heat output module 1640 according to an embodiment of the present invention. Referring to FIG. 9, unit thermoelectric couples 1656 and conductor members 1646 may be disposed in a single substrate 1642 by being buried into the substrate 1642. To this end, glass fiber may be used as the substrate 1642. When the single substrate 1642 according to this aspect is used, higher flexibility may be imparted to the heat output module 1640.

The various aspects of the heat output module 1640 may be combined or modified within the scope of what is obvious to those skilled in the art. For example, according to each aspect of the heat output module 1640, it has been described that the contact surface 1641 is formed on the front surface of the heat output module 1640 as a layer separate from the heat output module 1640, but the front surface of the heat output module 1640 itself may be used as the contact surface 1641. For example, according to an aspect of the heat output module 1640, an outer surface of the substrate 1642 may be used as the contact surface 1641.

2.4. Output of Thermal Feedback

A thermal feedback output operation performed by the feedback device 1600 will be described below.

The feedback device 1600 may output a thermal feedback as the heat output module 1640 performs an exothermic operation or an endothermic operation. The thermal feedback may include a hot feedback, a cold feedback, and a thermal grill feedback.

Herein, the hot feedback may be output by the heat output module 1640 performing an exothermic operation, and the cold feedback may be output by the heat output module 1640 performing an endothermic operation. Also, the thermal grill feedback may be output through a thermal grill operation in which the exothermic operation and the endothermic operation are combined.

The feedback device 1600 may output the thermal feedback at various intensities. The intensity of the thermal feedback may be adjusted by a feedback controller 1648 of the heat output module 1640 adjusting the magnitude of a voltage applied to a thermoelectric couple array 1643 through a power terminal 1647. Here, the method of adjusting the magnitude of a voltage includes a method of smoothing a duty signal and then applying power to a thermoelectric element. That is, the adjustment of the magnitude of a voltage may be regarded as including adjustment of the magnitude of a voltage by adjusting a duty rate of the duty signal.

The exothermic operation, the endothermic operation, and the thermal grill operation will be described below in more detail.

2.4.1. Exothermic/Endothermic Operation

The feedback device 1600 may perform an exothermic operation with the heat output module 1640 to provide a hot feedback to a user. Similarly, the feedback device 1600 may perform an endothermic operation to provide a cold feedback to a user.

Figure 10:
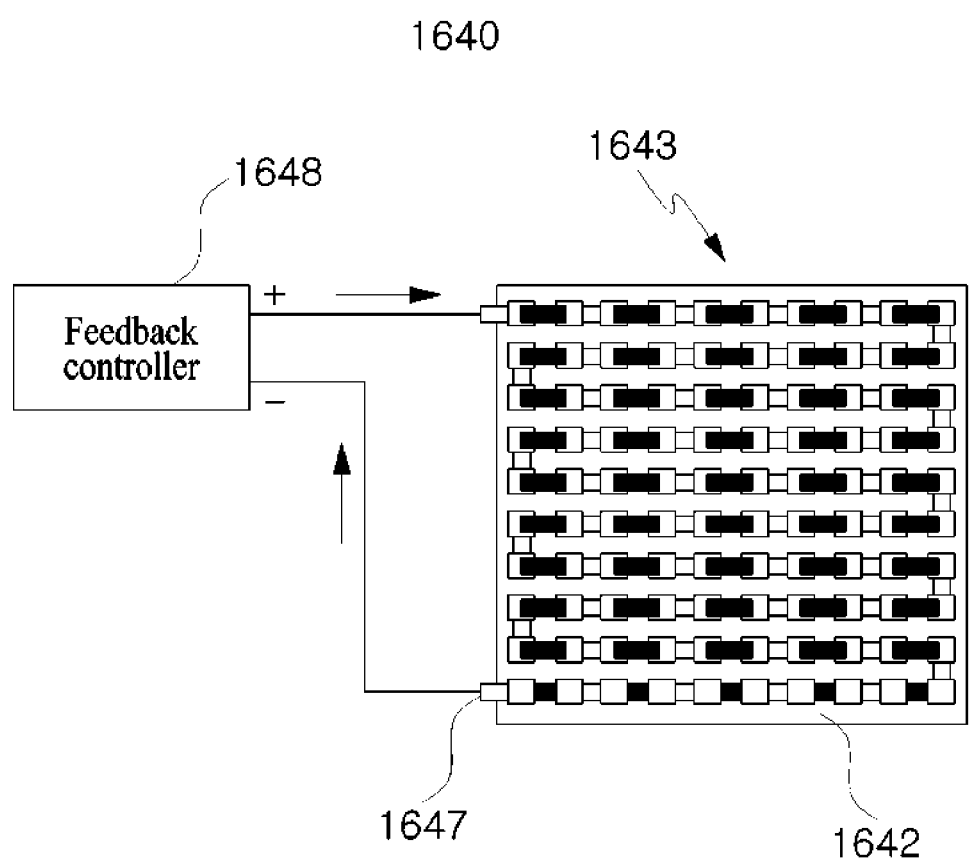
FIG. 10 is a diagram showing an exothermic operation for providing a hot feedback according to an embodiment of the present invention.
Figure 11:
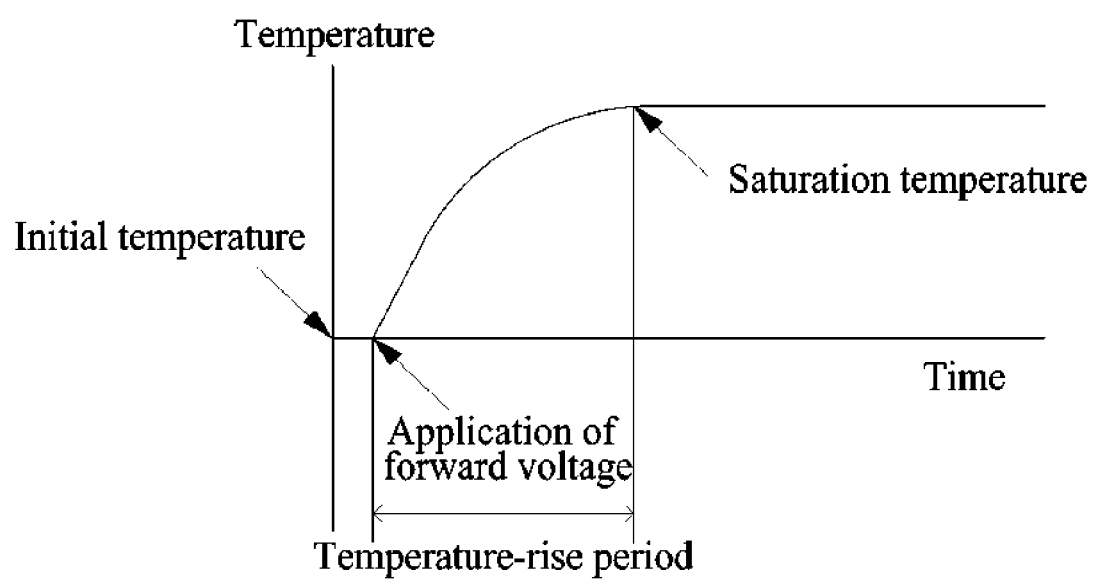
FIG. 11 is a graph showing the intensity of a hot feedback according to an embodiment of the present invention.

FIG. 10 is a diagram showing an exothermic operation for providing a hot feedback according to an embodiment of the present invention, and FIG. 11 is a graph showing the intensity of a hot feedback according to an embodiment of the present invention.

Referring to FIG. 10, the exothermic operation may be performed by the feedback controller 1648 applying a forward electric current to the thermoelectric couple array 1643 to induce an exothermic reaction toward the contact surface 1641. Here, when the feedback controller 1648 applies a certain voltage (hereinafter, a voltage causing the exothermic operation is referred to as a "forward voltage"), to the thermoelectric couple array 1643, the thermoelectric couple array 1643 initiates the exothermic operation, and the temperature of the contact surface 1641 reaches a saturation temperature over time, as shown in FIG. 11. Accordingly, a user feels no sensation or a weak hot sensation at the beginning of the exothermic operation, feels an increase in hot sensation when the saturation temperature is reached, and then receives a hot feedback corresponding to the saturation temperature after a certain period of time elapses.

Figure 12:
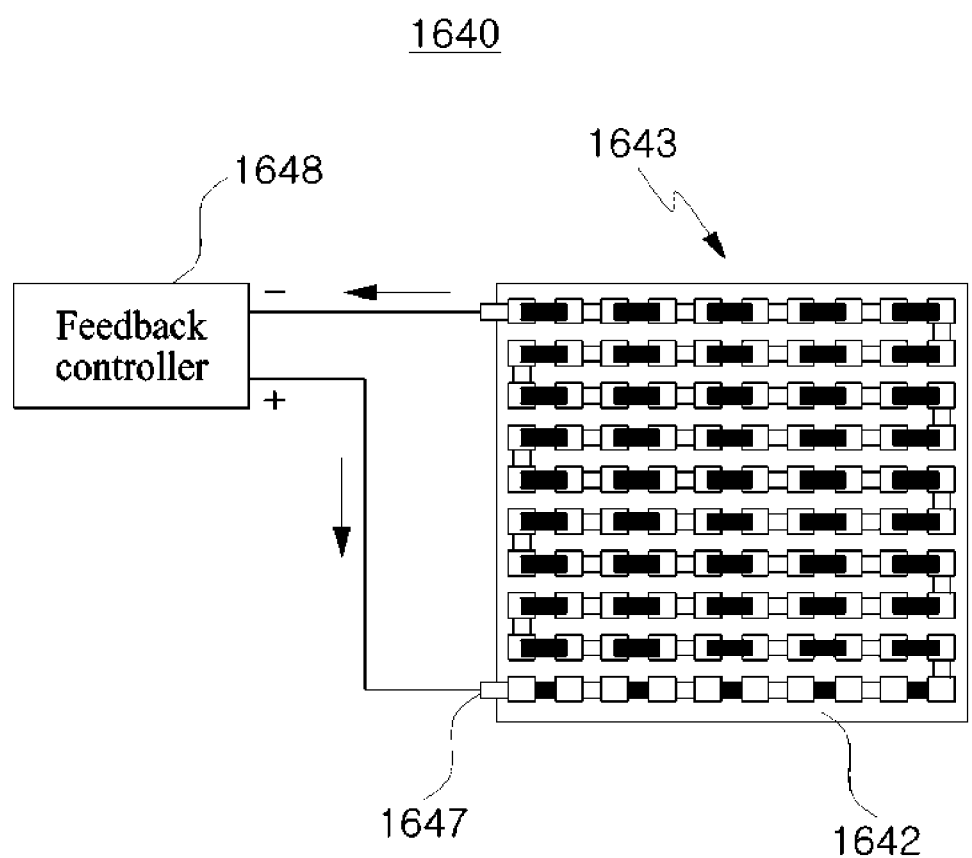
FIG. 12 is a diagram showing an endothermic operation for providing a cold feedback according to an embodiment of the present invention.
Figure 13:
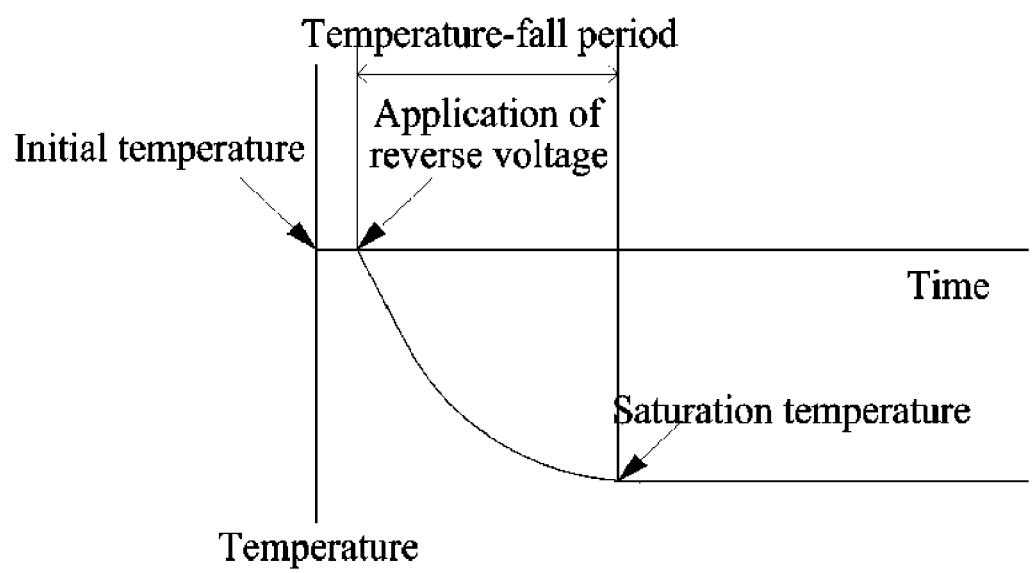
FIG. 13 is a graph showing the intensity of a cold feedback according to an embodiment of the present invention.

FIG. 12 is a diagram showing an endothermic operation for providing a cold feedback according to an embodiment of the present invention, and FIG. 13 is a graph showing the intensity of a cold feedback according to an embodiment of the present invention.

Referring to FIG. 12, the endothermic operation may be performed by the feedback controller 1648 applying a reverse electric current to the thermoelectric couple array 1643 to induce an endothermic reaction toward the contact surface 1641. Here, when the feedback controller 1648 applies a certain voltage to the thermoelectric couple array 1643 (hereinafter, a voltage causing the endothermic operation is referred to as a "reverse voltage"), the thermoelectric couple array 1643 initiates the endothermic operation, and the temperature of the contact surface 1641 reaches a saturation temperature over time, as shown in FIG. 13. Accordingly, a user feels no sensation or a weak cold sensation at the beginning of the endothermic operation, feels an increase in cold sensation when the saturation temperature is reached, and then receives a cold feedback corresponding to the saturation temperature after a certain period of time elapses.

When power is applied to the thermoelectric element, the thermoelectric element generates heat by converting electric energy into heat energy in addition to the exothermic reaction and endothermic reaction which are generated at both sides of the thermoelectric element. Accordingly, when a voltage with the same magnitude and the opposite current direction is applied to the thermoelectric couple array 1643, a temperature variation caused by the exothermic operation may be greater than a temperature variation caused by the endothermic operation. Here, the temperature variation denotes a difference between an initial temperature and a saturation temperature while the heat output module 1640 is not working.

Hereinafter, the exothermic operation and the endothermic operation, which are performed by a thermoelectric element using electric energy, are collectively referred to as a thermoelectric operation. Additionally, the thermal grill operation, which will be described below, may be interpreted as a kind of "thermoelectric operation" because the thermal grill operation is an operation into which the exothermic operation and the endothermic operation are combined.

2.4.2. Intensity Control for Exothermic/Endothermic Operation

When the heat output module 1640 performs an exothermic operation or an endothermic operation as described above, the feedback controller 1648 may control an exothermic level or an endothermic level of the heat output module 1640 by adjusting the magnitude of applied voltage. Accordingly, the feedback controller 1648 may adjust the intensity of a hot feedback or a cold feedback by adjusting the magnitude of a voltage as well as by adjusting the direction of current to select the type of a heat feedback to be provided between the hot feedback and the cold feedback.

Figure 14:
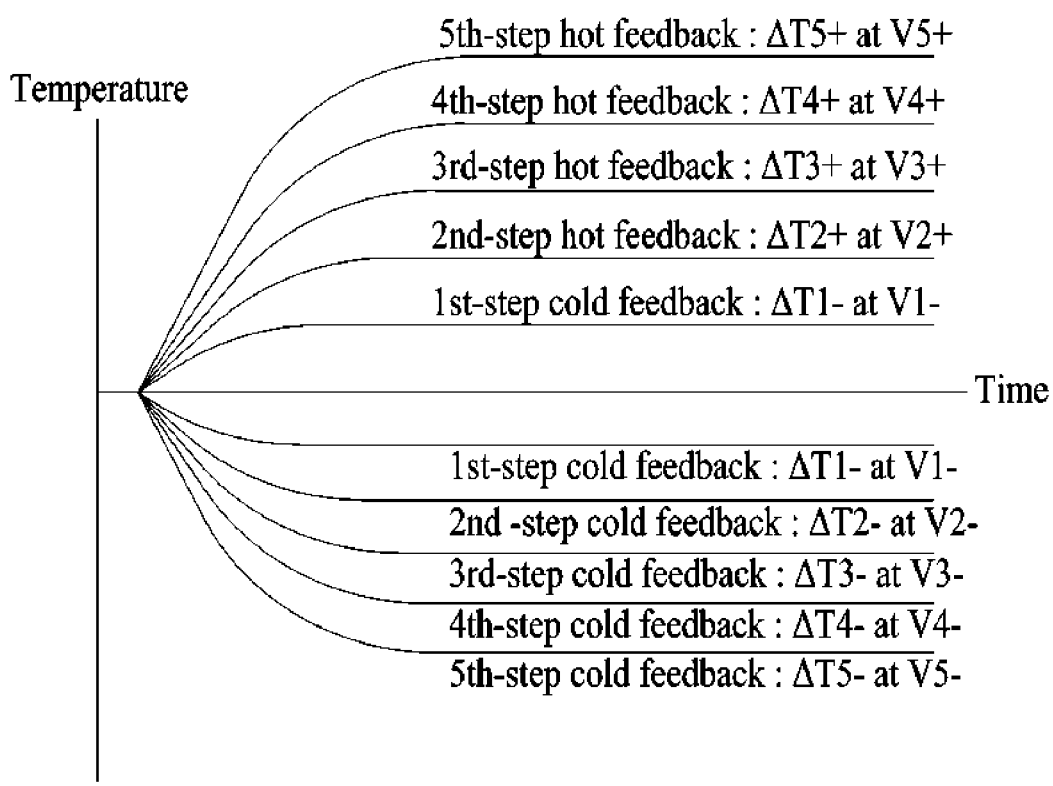
FIG. 14 is a graph showing the intensity of a hot/cold feedback using voltage adjustment according to an embodiment of the present invention.

FIG. 14 is a graph showing the intensity of a hot/cold feedback using voltage adjustment according to an embodiment of the present invention.

For example, as shown in FIG. 14, the feedback device 1600 may provide thermal feedbacks with a total of ten intensities (i.e., five intensities for the hot feedback and five intensities for the cold feedback) by the feedback controller 1648 applying voltage magnitudes with five intensities in a forward or reverse direction.

FIG. 14 shows that the hot feedback has the same number of intensities as the cold feedback. However, the number of intensities of the hot feedback and the number of intensities of the cold feedback do not necessarily have to be the same and may be different from each other.

Also, it is shown that the hot feedback and the cold feedback are implemented by changing the current direction while using the same voltage magnitude. However, the magnitude of the voltage applied for the hot feedback and the magnitude of the voltage applied for the cold feedback need not be the same.

In particular, when the exothermic operation and the endothermic operation are performed by applying the same voltage, the temperature variation of the hot feedback caused by the exothermic operation is greater than the temperature variation caused by the endothermic operation. Thus, by applying a voltage for the cold feedback, which is higher than the voltage applied for the hot feedback, the same temperature variation may appear at the same intensity.

The magnitude of the voltage applied to the heat output module 1640, which is controlled in order to control the intensity of the thermal feedback, has been described above, but the intensity of the thermal feedback may be controlled in other ways.

As an example, when the thermoelectric couple array 1643 of the heat output module 1640 has a plurality of individually controllable thermoelectric couple groups 1644, the feedback controller 1648 may control operation for each thermoelectric couple group 1644 to adjust the intensity of the thermal feedback.

Figure 15:
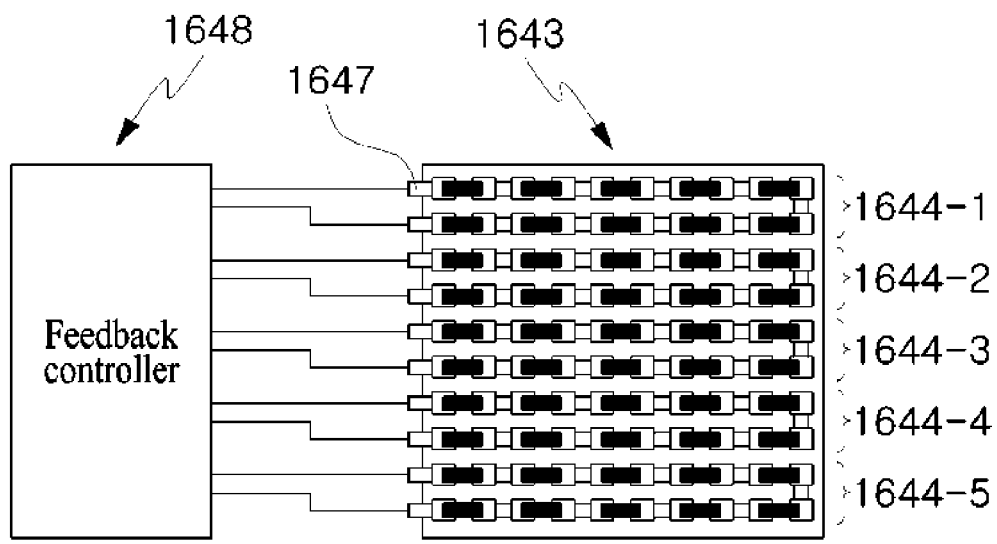
FIG. 15 is a graph showing adjustment of the intensity of a hot/cold feedback through operation control for each thermoelectric couple group 1644 according to an embodiment of the present invention.

FIG. 15 is a graph showing adjustment of the intensity of a hot/cold feedback through operation control for each thermoelectric couple group 1644 according to an embodiment of the present invention. Referring to FIG. 15, when the thermoelectric couple array 1643 is composed of five thermoelectric groups 1644-1, 1644-2, 1644-3, 1644-4, and 1644-5, the feedback controller 1648 may adjust the intensity of the thermal feedback by applying a voltage to some or all of the thermoelectric couple groups 1644. For example, the feedback controller 1648 may apply a voltage to all of the thermoelectric couple groups 1644 to provide a thermal feedback with the highest intensity to the user, may apply a voltage to only four of the thermoelectric couple groups 1644 to provide a thermal feedback with an upper middle intensity, may apply a voltage to only three of the thermoelectric couple groups 1644 to provide a thermal feedback with a middle intensity to the user, may apply a voltage to only two of the thermoelectric couple groups 1644 to provide a thermal feedback with a lower middle intensity to the user, or may apply a voltage to only one of the thermoelectric couple groups 1644 to provide a thermal feedback with the lowest intensity to the user.

When the intensity of the thermal feedback is adjusted depending on whether to apply a voltage to each of the thermoelectric couple groups 1644, the feedback controller 1648 may select a thermoelectric couple group 1644 to receive the voltage such that heat distribution is as uniform as possible within allowable limits. To this end, the feedback controller 1648 may determine whether to apply a voltage to the thermoelectric couple groups 1644 by minimizing the number of consecutive thermoelectric couple groups 1644 to which the voltage is applied or the number of consecutive thermoelectric couple groups 1644 to which the voltage is not applied. Since the table shown in FIG. 15 takes into consideration uniformity of the heat distribution, the above description will be more clearly understood with reference to the above table.

As another example, the feedback controller 1648 may adjust the intensity of the thermal feedback by controlling power application timing. In detail, the feedback controller

1648 may adjust the intensity of the thermal feedback by applying power to the thermoelectric couple arrays 1643 using an electric signal in the form of a duty signal with a duty cycle.

Figure 16:
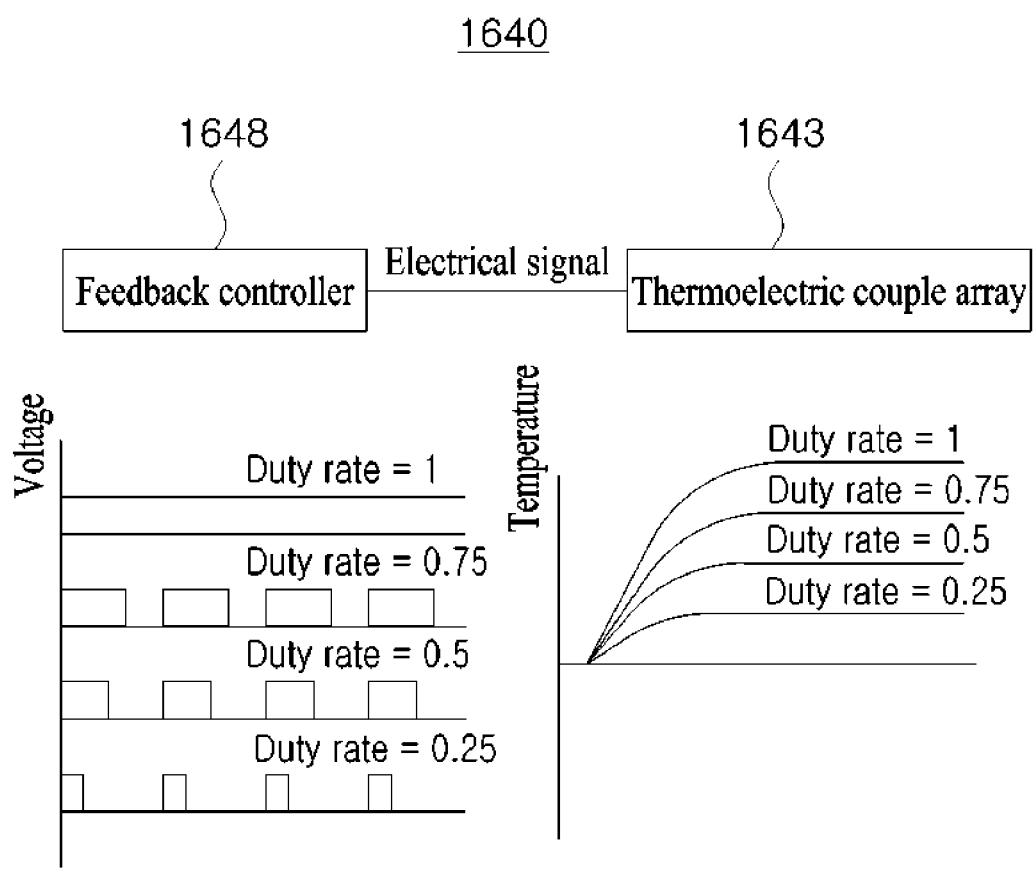
FIG. 16 is a graph showing adjustment of the intensity of a hot/cold feedback through power application timing control according to an embodiment of the present invention.

FIG. 16 is a graph showing adjustment of the intensity of a hot/cold feedback through power application timing control according to an embodiment of the present invention. Referring to FIG. 16, it can be seen that the intensity of the thermal feedback is controlled by adjusting the duty rate of the electric signal.

As described above, by adjusting the thermal feedback, it is possible to provide segmented thermal feedback such as a strong hot sensation, a weak hot sensation, a strong cold sensation, a weak cold sensation, and the like as well as to just provide a hot sensation and a cold sensation to the user. By using variously segmented thermal feedback, it is possible to provide a higher degree of immersion to the user under game environments or virtual/augmented reality environments, and it is also possible to accurately inspect a patient's sensation when the present invention is applied to medical devices.

Also, the intensity of the thermal feedback may be adjusted by combination of a voltage adjustment scheme, an adjustment scheme for each thermoelectric couple group 1644 (i.e., a region-based adjustment scheme), and an adjustment scheme using a duty cycle in addition to the above-described intensity adjustment method of thermal feedback. The combination is obvious to those skilled in the art, and thus a detailed description thereof will be omitted.

2.4.2. Thermal Grill Operation

The feedback device 1600 may provide a thermal grill feedback in addition to the hot feedback and the cold feedback. A thermal pain sensation denotes that when a hot spot and a cold spot of a human body are simultaneously stimulated, this stimulus is recognized as a pain sensation instead of being recognized as a hot sensation and a cold sensation. Accordingly, the feedback device 1600 may provide the head grill feedback to the user through a thermal grill operation into which the exothermic operation and the endothermic operation are combined.

The feedback device 1600 may perform various thermal grill operations to provide thermal grill feedback. This will be described below after the types of thermal grill feedback are described.

2.4.2.1. Types of Thermal Grill Feedback

The thermal grill feedback may include a neutral thermal grill feedback, a hot grill feedback, and a cold grill feedback.

Here, the neutral thermal grill feedback, the hot grill feedback, and the cold grill feedback cause the user to experience a neutral heat sensation, a hot pain sensation, and a cold pain sensation. The neutral heat pain sensation may refer to only a pain sensation without a hot sensation and a cold sensation, the hot pain sensation may refer to a pain sensation in addition to a hot sensation, and the cold pain sensation may refer to a pain sensation in addition to a cold sensation.

The neutral heat pain sensation is caused when the intensity of the hot sensation and the intensity of the cold sensation that the user feels correspond to predetermined ratio ranges. A ratio at which the user feels the neutral heat pain sensation (hereinafter referred to as a "neutral ratio") may be different for each body part that receives a thermal feedback, and the neutral ratio may be slightly different for each individual despite the same human body. In most cases, however, the neutral heat pain sensation tends to be felt while the intensity of the cold sensation is given greater than the intensity of the hot sensation.

Here, the intensity of the thermal feedback may be the amount of heat that the feedback device 1600 applies to a human body brought into contact with the contact surface 1641 or the amount of heat that the feedback device 1600 absorbs from the corresponding human body. Accordingly, when the thermal feedback is applied to a certain area for a certain period of time, the intensity of the thermal feedback may be represented as a difference between the temperature of the hot sensation or the cold sensation and the temperature of a target portion to which the thermal feedback is applied.

On the other hand, human body temperature is usually between 36.5° C. and 36.9° C., and skin temperature is known to be about 30° C. to 32° C. on average but varies for each individual or body part. Palm temperature is about 33° C., which is slightly higher than the average skin temperature. It will be appreciated that the above-mentioned temperature values may be somewhat different for each individual and may somewhat vary despite the same person.

According to an experiment example, it was confirmed that a neutral heat pain sensation was felt when a hot sensation of about 40° C. and a cold sensation of about 20° C. were applied to a palm of 33° C. Based on the palm temperature, a hot sensation of about +7° C. and a cold sensation of about −13° C. are applied, and thus the neutral ratio may correspond to 1.86 in terms of temperature.

As can be seen from the above, for most people, the neutral ratio is represented as a ratio of a temperature difference caused by the cold sensation to a temperature difference caused by the hot sensation with respect to a contact target, i.e., a ratio ranges from about 1.5 to 5 when the hot sensation and the cold sensation are each continuously applied to a human area of the same size. Also, the hot pain sensation may be felt when the hot sensation is stronger than the neutral ratio, and the cold pain sensation may be felt when the cold sensation is stronger than the neutral ratio.

2.4.2.2. Thermal Grill Operation According to Voltage Adjustment

The feedback device 1600 may perform a voltage adjustment-based thermal grill operation. The voltage adjustment-based thermal grill operation may be applied to the feedback device 1600 with the thermoelectric couple array 1643 being composed of the plurality of thermoelectric couple groups 1644.

In detail, the voltage adjustment-based thermal grill operation may be performed by the feedback controller 1648 applying a forward voltage to some of the thermoelectric couple groups 1644 to perform an exothermic operation and applying a reverse voltage to the others to perform an endothermic operation and by the heat output module 1640 providing both of a hot feedback and a cold feedback.

Figure 17:
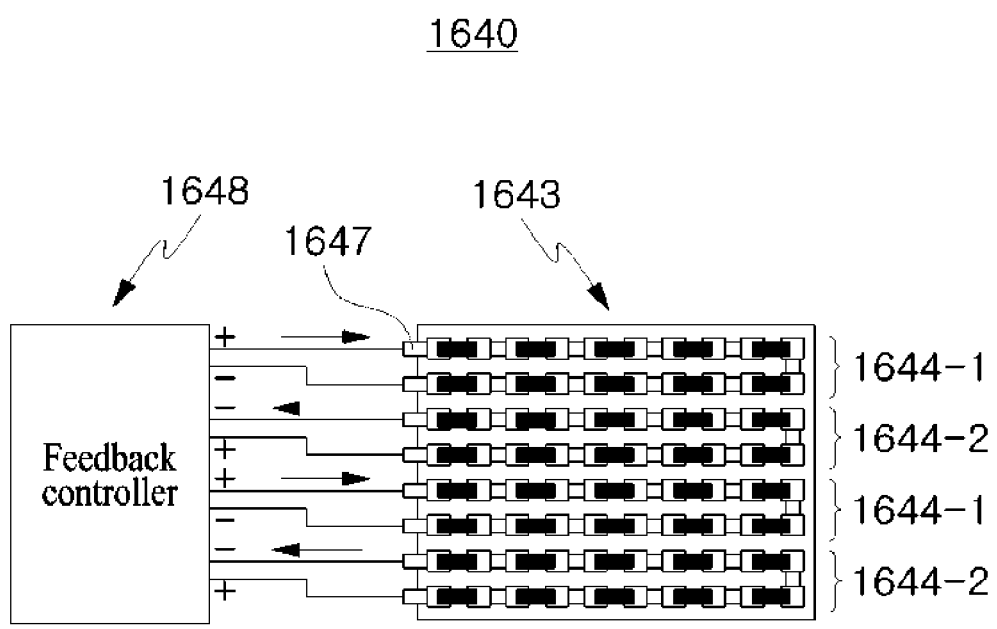
FIG. 17 is a diagram showing a voltage adjustment-based thermal grill operation according to an embodiment of the present invention.

FIG. 17 is a diagram showing a voltage adjustment-based thermal grill operation according to an embodiment of the present invention.

Referring to FIG. 17, a thermoelectric couple array 1643 includes a plurality of thermoelectric couple groups 1644 disposed to form a plurality of lines. Here, a feedback controller 1648 may apply power so that first thermoelectric couple groups 1644-1 (e.g., thermoelectric couple groups in odd lines) perform an exothermic operation and second thermoelectric couple groups 1644-2 (e.g., thermoelectric couple groups in even lines) perform an endothermic operation. By the thermoelectric couple groups 1644 alternately performing the exothermic operation and the endothermic operation according to line arrangement as described above, the user may simultaneously receive a hot sensation and a cold sensation and thus receive a thermal grill feedback.

Here, a distinction between the odd lines and the even lines is arbitrary, and thus the order of the odd lines and the even lines may be reversed.

Here, the feedback device 1600 may provide a neutral thermal grill feedback by performing control such that a saturation temperature caused by the exothermic operation of the first thermoelectric couple groups 1644-1 and a saturation temperature caused by the endothermic operation of the second thermoelectric couple groups 1644-2 follow the neutral ratio.

FIG. 18 is a table regarding a voltage for providing a neutral thermal grill feedback through voltage adjustment according to an embodiment of the present invention.

For example, referring to FIG. 18, a feedback controller 1648 may apply five forward voltages and five reverse voltages to a heat output module 1640, and thus the heat output module 1640 performs the exothermic operation at five levels and the endothermic operation at five levels. At the same level, a temperature variation caused by the exothermic operation is the same as that of the endothermic operation. The following description assumes that the feedback device 1600 has a constant temperature variation interval of each level. When the neutral ratio is set to 3, the feedback controller 1648 may apply a forward voltage with the first level, which is the smallest level, to the first thermoelectric couple groups 1644-1 and apply a reverse voltage with the third level to the second thermoelectric couple groups 1644-2, and thus the heat output module 1640 may provide a neutral heat pain sensation feedback. Similarly, when the neutral ratio is 2.5, the feedback controller 1648 may apply a forward voltage with the second level to the first thermoelectric couple groups 1644-1 and apply a reverse voltage with the fifth level to the second thermoelectric couple groups 1644-2 in order to provide a neutral thermal grill feedback. Alternatively, when the neutral ratio is 4, the feedback controller 1648 may apply a forward voltage with the first level to the first thermoelectric couple groups 1644-1 and apply a reverse voltage with the fourth level to the second thermoelectric couple groups 1644-2 to generate a neutral thermal grill feedback. Alternatively, when the neutral ratio is 2, the feedback controller 1648 may apply either a forward voltage with the first level and a reverse voltage with the second level or a forward voltage with the second level and a reverse voltage with the fourth level to provide a neutral heat pain sensation. In this case, the former neutral heat pain sensation (when the forward voltage with the first level and the reverse voltage with the second level are used) may be stronger than the latter neutral heat pain sensation (when the forward voltage with the second level and the reverse voltage with the fourth level are used). That is, even for the thermal grill feedback, the intensity of the thermal grill feedback may be adjusted. On the other hand, the above description regarding the method of providing the neutral heat pain sensation is illustrative, and thus the present invention is not limited thereto. For example, it is not necessary for the number of levels of the thermal feedback to be five, and the number of levels of the cold feedback may be different from that of the hot feedback. Also, it is not necessary that the temperature variation interval of each level should be constant, and for example, a voltage interval of each level may be constant.

Also, the feedback controller 1648 may provide a hot grill feedback by adjusting the forward voltage and the reverse voltage to be equal to or less than the neutral ratio and may provide a cold grill feedback by adjusting the forward voltage and the reverse voltage to be equal to or greater than the neutral ratio.

For example, referring to FIG. 18 again, when the neutral ratio is set to 3, the feedback controller 1648 may apply a forward voltage with the first level to the first thermoelectric couple groups 1644-1 and apply a reverse voltage with the first level or the second level to the second thermoelectric couple groups 1644-2. Then, the heat output module 1640 may generate a heat sensation and a pain sensation at a ratio lower than the neutral ratio and thus may provide a hot grill feedback to enable a user to simultaneously feel a hot sensation and a pain sensation. In this case, the forward voltage need not necessarily be the forward voltage used for the neutral thermal grill feedback. In other words, the feedback controller 1648 may allow the heat output module 1640 to provide a hot grill feedback using a forward voltage with the fourth level and a reverse voltage with the fourth level.

For the cold grill feedback, when the neutral ratio is set to 3, the feedback controller 1648 may apply either a forward voltage with the first level and a reverse voltage with the fourth level or a forward voltage with the first level and a reverse voltage with the fifth level to the heat output module 1640.

However, when the hot grill feedback or the cold grill feedback is intended to be provided and the forward voltage and the reverse voltage are applied at a ratio significantly different from the neutral ratio, the user may not feel a pain sensation. Thus, it may be preferable that the levels of the forward voltage/the reverse voltage be adjusted such that the ratio becomes close to the neutral ratio.

2.5. Heat Transfer Operation

The heat transfer operation will be described below. Here, the heat transfer operation is an operation of transferring heat in an area of the heat output module and may be performed using a heat output module 1640 composed of a plurality of individually controllable thermoelectric couple groups 1644.

Figure 19:
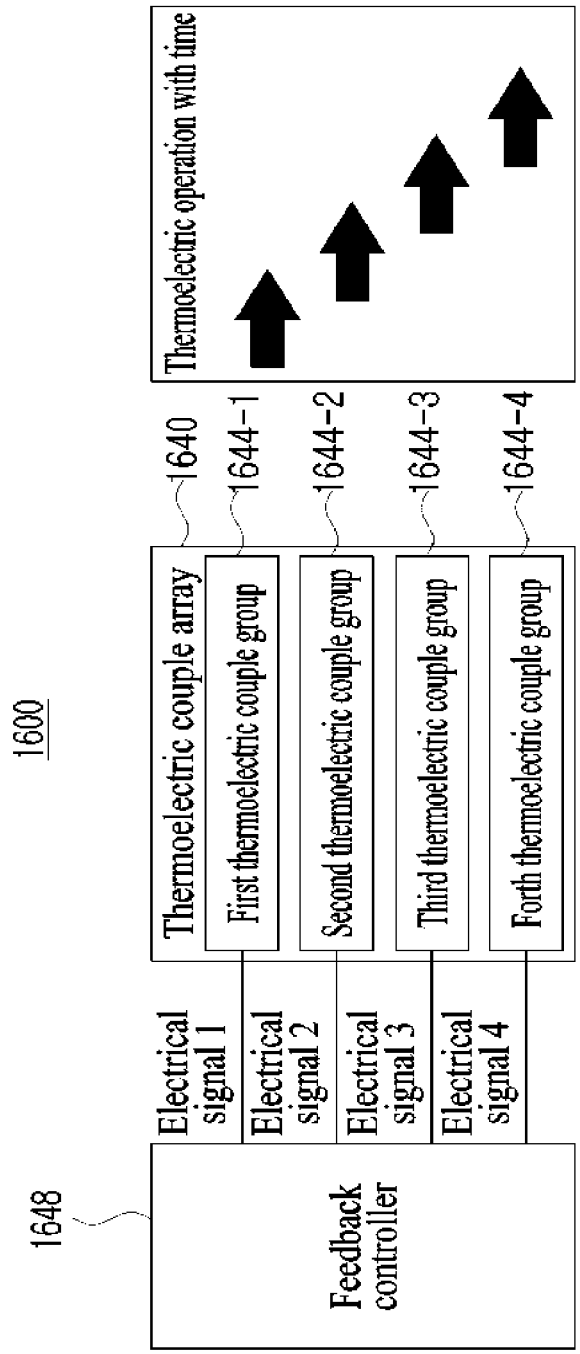
FIG. 19 is a schematic diagram showing an example electric signal for a heat transfer operation according to an embodiment of the present invention.
Figure 20:
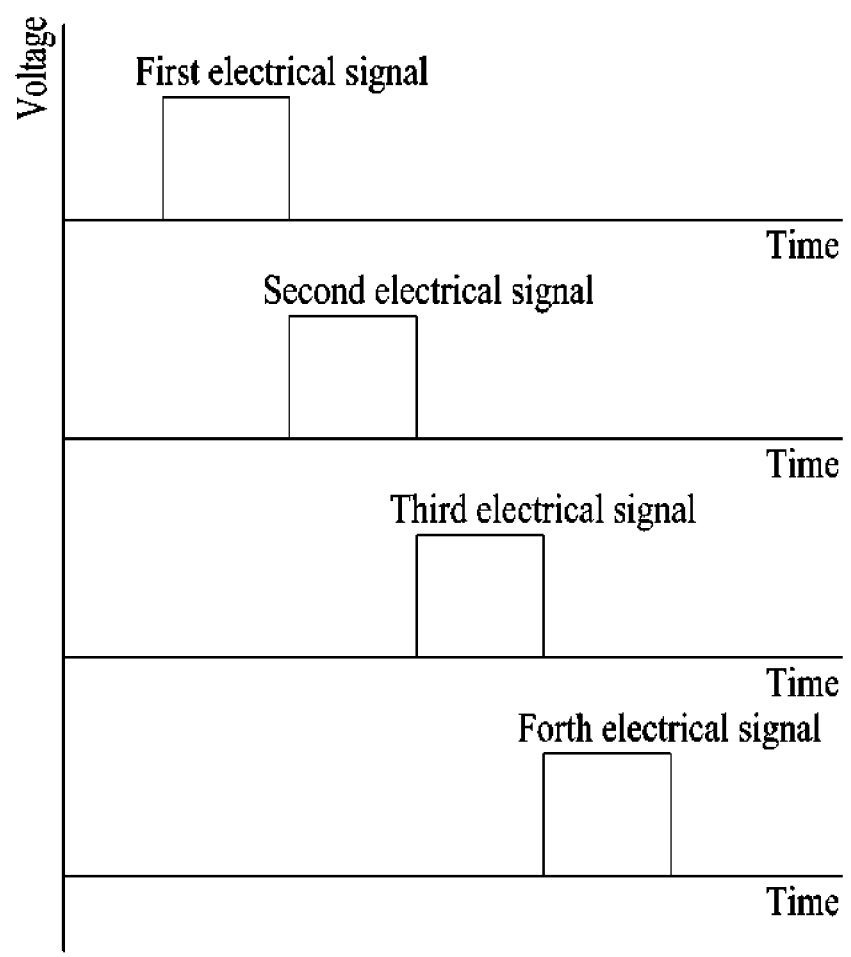
FIG. 20 is a diagram showing the heat transfer operation of FIG. 19 according to an embodiment of the present invention.

FIG. 19 is a schematic diagram showing an example electric signal for a heat transfer operation according to an embodiment of the present invention, and FIG. 20 is a diagram showing the heat transfer operation of FIG. 19.

Referring to FIGS. 19 and 20, the heat output module 1640 may include a first thermoelectric couple group 1644-1, a second thermoelectric couple group 1644-2, a third thermoelectric couple group 1644-3, and a fourth thermoelectric couple group 1644-4.

In this case, the feedback controller 1648 may sequentially apply power to the thermoelectric element groups. Accordingly, first, the first thermoelectric couple group may perform a thermoelectric operation (here, the thermoelectric operation includes the exothermic operation, the endothermic operation, and the thermal grill operation). Subsequently, the thermoelectric operation may be performed in the order of the second, third, and fourth thermoelectric couple groups 1644-2, 1644-3, and 1644-4.

Also, when powering on a specific thermoelectric couple group 1644, the feedback controller 1648 may power off a previous thermoelectric couple group 1644. Thus, the first thermoelectric couple group 1644-1 may stop the thermoelectric operation when the second thermoelectric couple group 1644-2 initiates the thermoelectric operation, the second thermoelectric couple group 1644-2 may stop the thermoelectric operation when the third thermoelectric couple group 1644-3 initiates the thermoelectric operation, and the third thermoelectric couple group 1644-3 may stop the thermoelectric operation when the fourth thermoelectric couple group 1644-4 initiates the thermoelectric operation.

Thus, a user may feel a transfer of heat from a region where the first thermoelectric couple group 1644-1 is disposed on a contact surface to a region where the fourth thermoelectric couple group 1644-4 is disposed on the contact surface.

The aforementioned example may be utilized as follows.

For example, when a plurality of thermoelectric element groups are horizontally arranged in the feedback device while being gripped by a user, the user may be provided with a feeling that a cool wind is passing by transferring cold heat from one side to another. Also, a user may be provided with a feeling that a heat source is passing by transferring hot heat.

Figure 21:
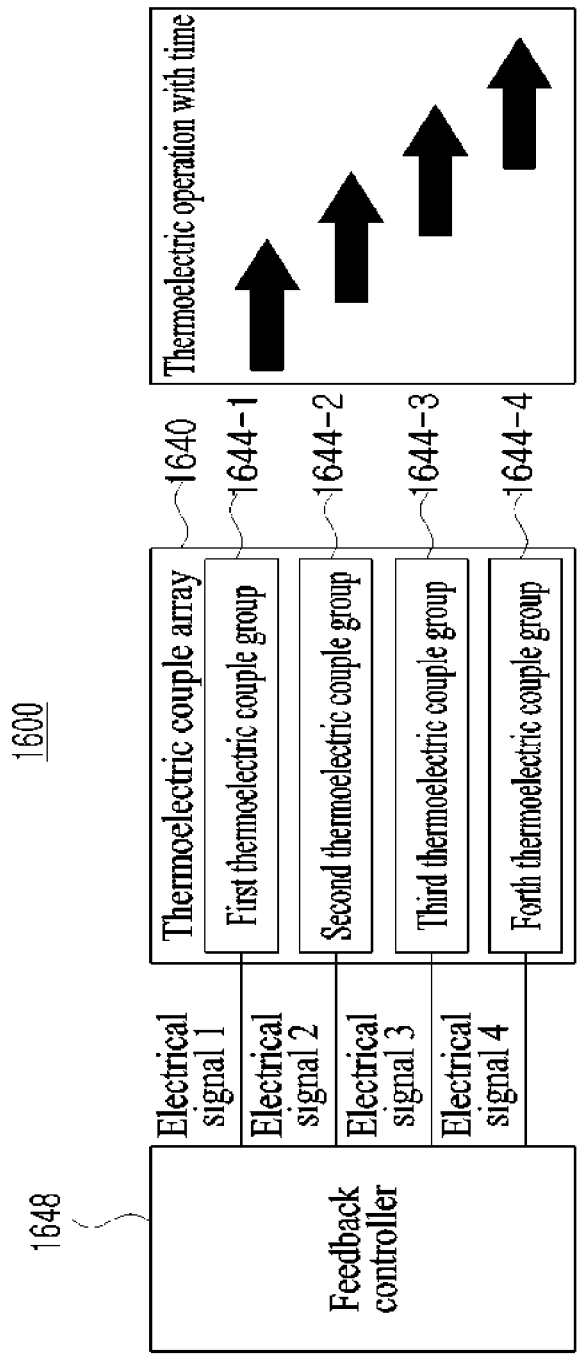
FIG. 21 is a schematic diagram showing another example electric signal for the heat transfer operation according to an embodiment of the present invention.
Figure 22:
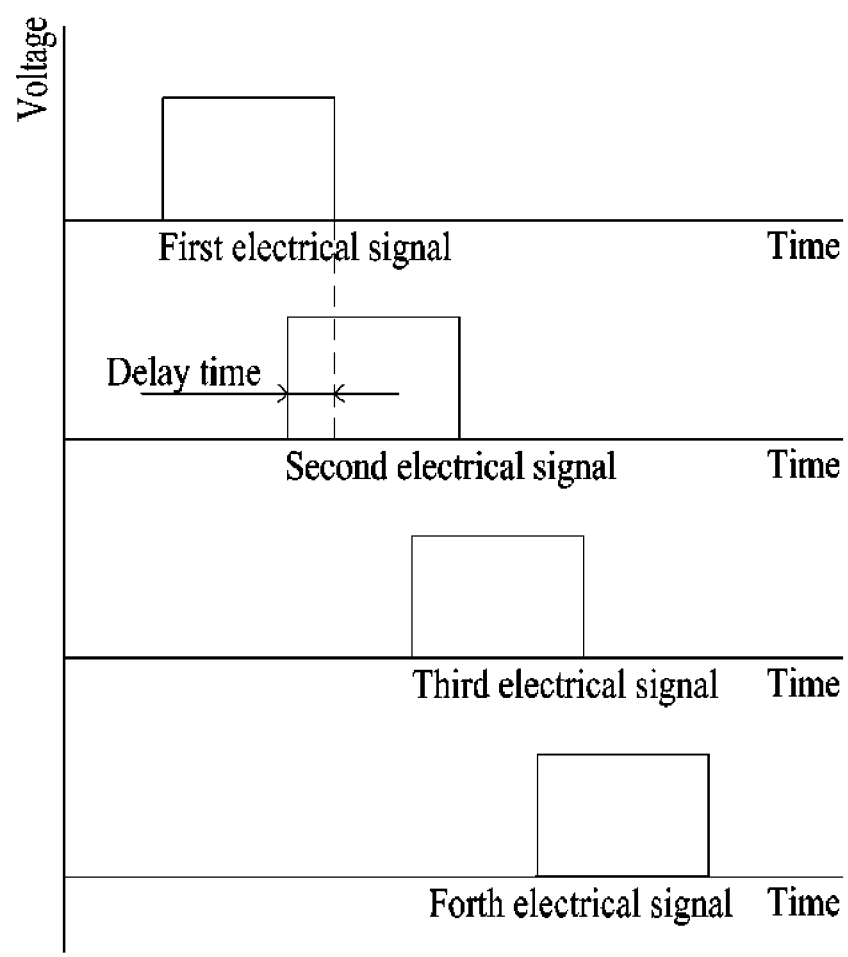
FIG. 22 is a diagram showing the heat transfer operation of FIG. 21 according to an embodiment of the present invention.

FIG. 21 is a schematic diagram showing another example electric signal for a heat transfer operation according to an embodiment of the present invention, and FIG. 22 is a diagram showing the heat transfer operation of FIG. 21.

Referring to FIGS. 21 and 22, the heat output module 1640 may include a first thermoelectric couple group 1644-1, a second thermoelectric couple group 1644-2, a third thermoelectric couple group 1644-3, and a fourth thermoelectric couple group 1644-4.

In this case, the feedback controller 1648 may sequentially apply power to the thermoelectric couple groups 1644. Accordingly, first, the first thermoelectric couple group 1644-1 may perform the thermoelectric operation. Subsequently, the thermoelectric operation may be performed in the order of the second, third, and fourth thermoelectric couple groups 1644-2, 1644-3, and 1644-4.

Also, at a predetermined time after powering on a specific thermoelectric couple group 1644, the feedback controller 1648 may power off a previous thermoelectric couple group. Thus, a user may sense a thermal sensation caused by the second thermoelectric couple group 1644-2 when the thermal sensing caused by the first thermoelectric couple group 1644-1 ends, may sense a thermal sensation caused by the third thermoelectric couple group 1644-3 when the thermal sensing caused by the second thermoelectric couple group 1644-1 ends, and may sense a thermal sensation caused by the fourth thermoelectric couple group 1644-4 when the thermal sensing caused by the third thermoelectric couple group 1644-3 ends.

This takes into consideration that a predetermined time is required until the contact surface reaches a temperature at which the user feel a hot sensation after power is applied to the thermoelectric couple group. That is, the predetermined time may correspond to a delay time required until the temperature of the contact surface reaches a temperature suitable for transferring a hot sensation after power is applied to the thermoelectric element.

Thus, a user may naturally feel a transfer of heat from a region where the first thermoelectric couple group 1644-1 is disposed on the contact surface to a region where the fourth thermoelectric couple group 1644-4 is disposed on the contact surface.

Figure 23:
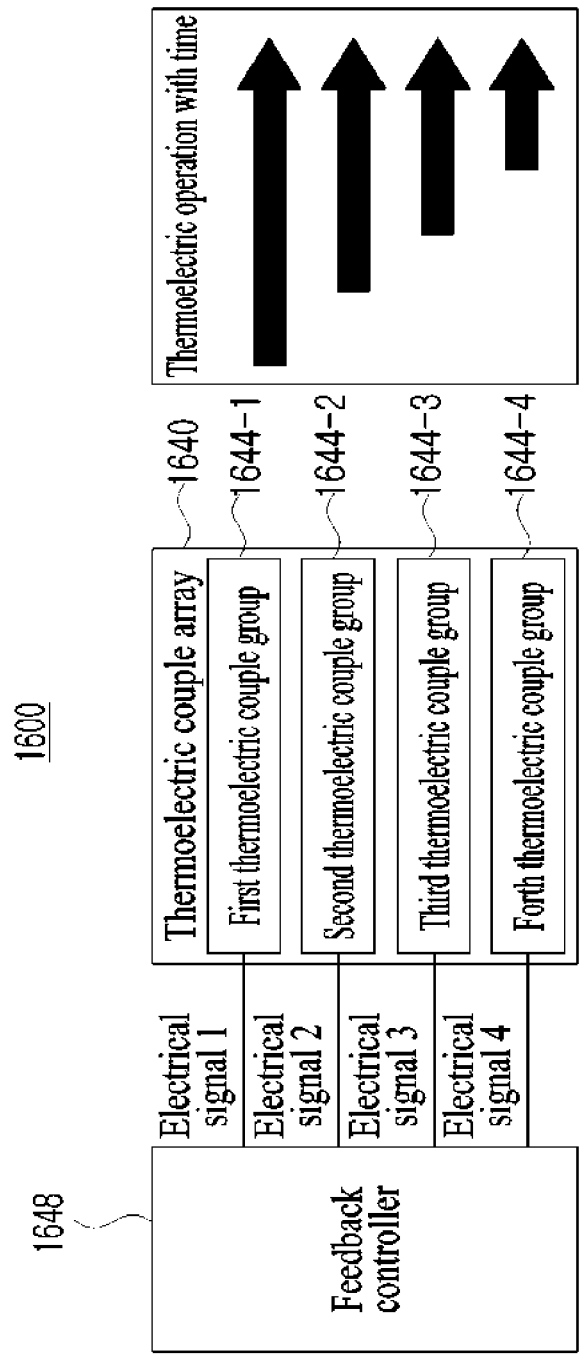
FIG. 23 is a schematic diagram showing yet another example electric signal for the heat transfer operation according to an embodiment of the present invention.
Figure 24:
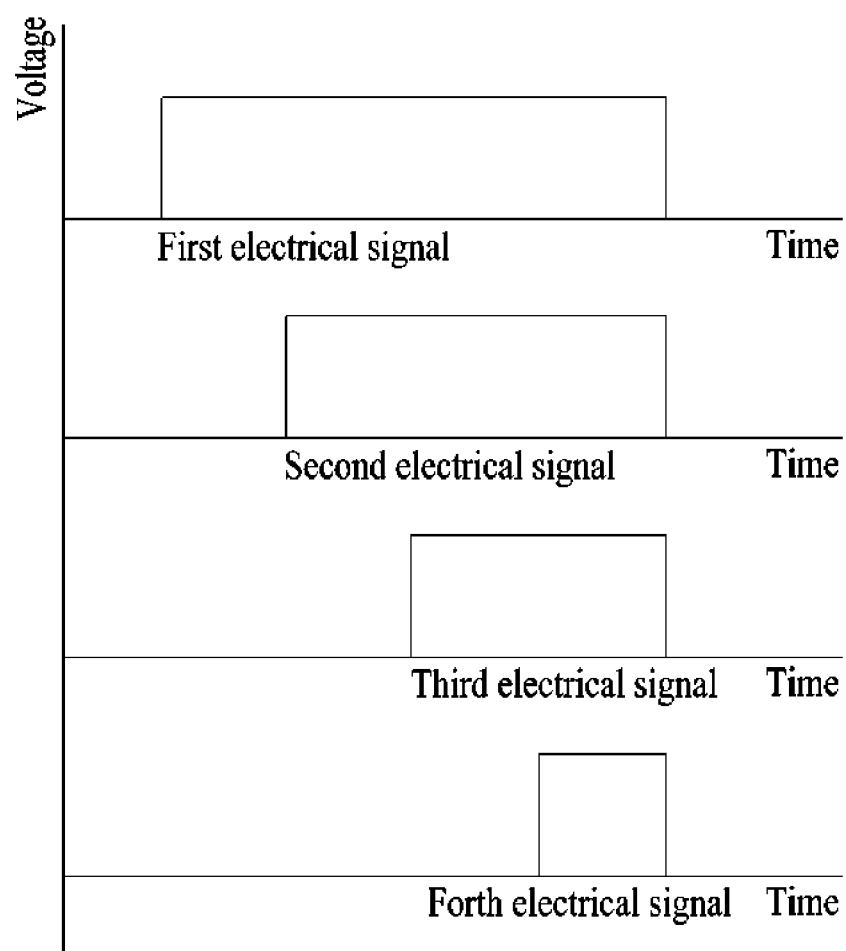
FIG. 24 is a diagram showing a heat transfer operation according to an embodiment of the present invention.

FIG. 23 is a schematic diagram showing still another example electric signal for a heat transfer operation according to an embodiment of the present invention, and FIG. 24 is a diagram showing the heat transfer operation according to an embodiment of the present invention.

Referring to FIGS. 23 and 24, the heat output module 1640 may include a first thermoelectric couple group 1644-1, a second thermoelectric couple group 1644-2, a third thermoelectric couple group 1644-3, and a fourth thermoelectric couple group 1644-4.

In this case, the feedback controller 1648 may sequentially apply power to the thermoelectric couple groups 1644. Accordingly, first, the first thermoelectric couple group 1644-1 may perform the thermoelectric operation. Subsequently, the thermoelectric operation may be performed in the order of the second, third, and fourth thermoelectric couple groups 1644-2, 1644-3, and 1644-4.

Also, the feedback controller 1648 may not power off a thermoelectric element which is already powered on. Thus, a user may feel a transfer of heat from a region where the first thermoelectric couple group 1644-1 is disposed on the contact surface to a region where the fourth thermoelectric couple group 1644-4 is disposed on the contact surface.

The aforementioned example may be utilized as follows.

For example, when a plurality of thermoelectric couple groups 1644 are vertically arranged in the feedback device while being gripped by a user, the user may be provided with a feeling that he or she is immersed in cold water starting from the bottom of the body by transferring cold heat from a lower side to an upper side.

Figure 25:
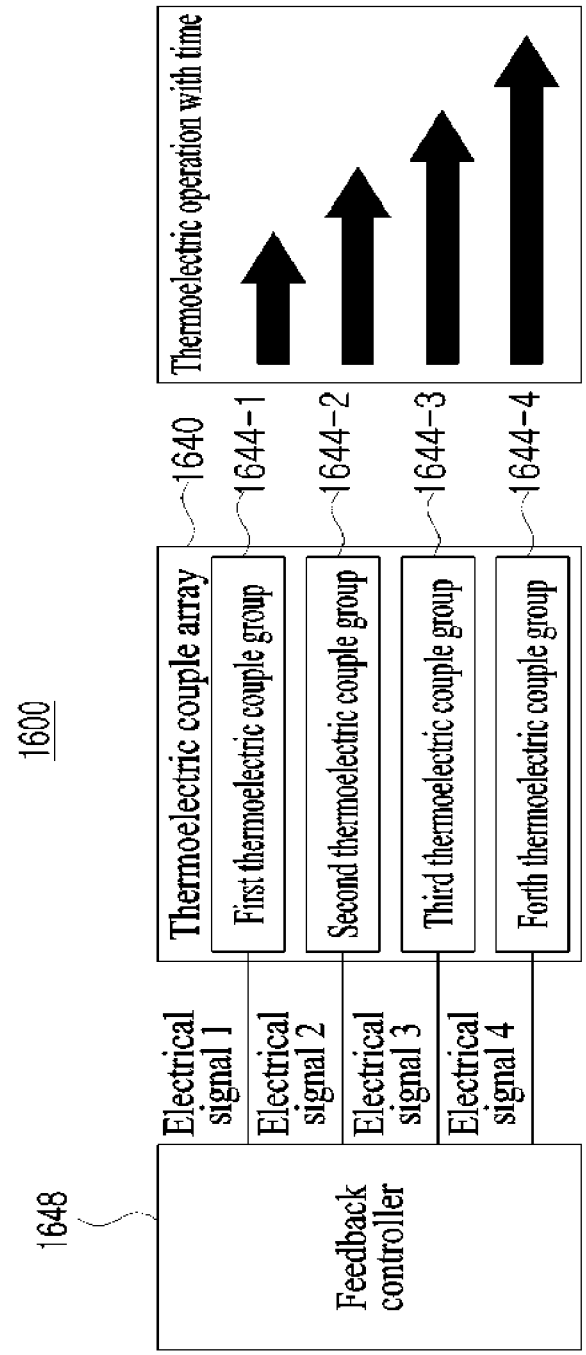
FIG. 25 is a schematic diagram showing yet another example electric signal for the heat transfer operation according to an embodiment of the present invention.
Figure 26:
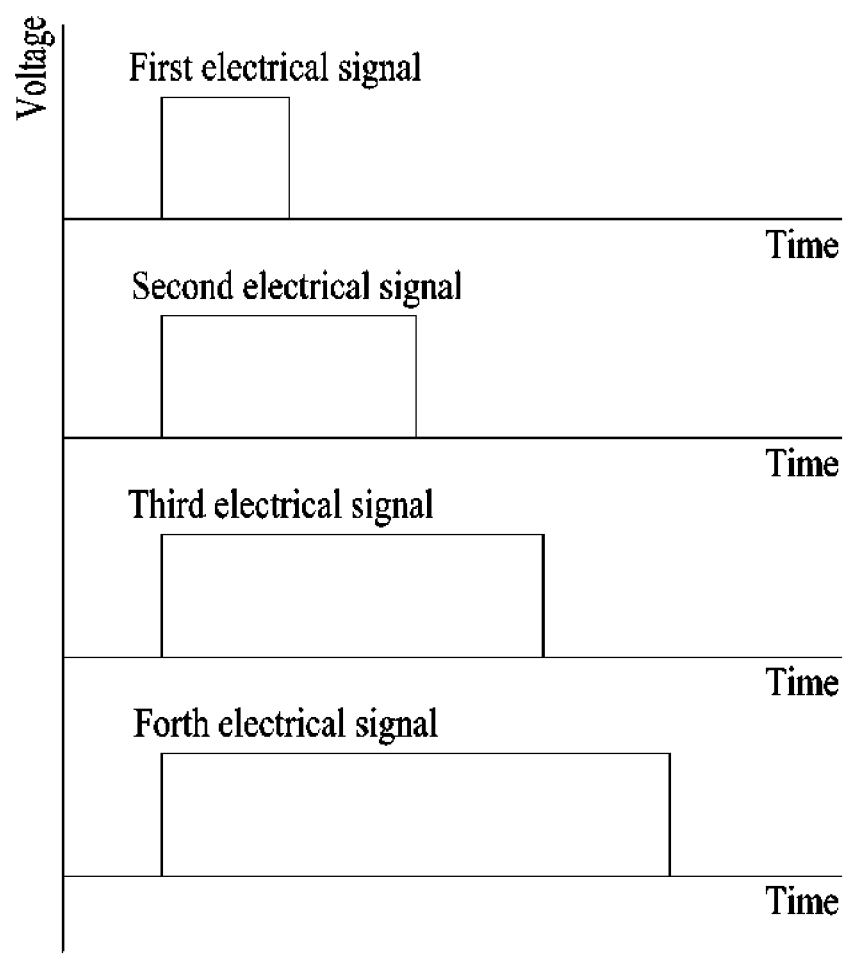
FIG. 26 is a diagram showing the heat transfer operation of FIG. 25 according to an embodiment of the present invention.

FIG. 25 is a schematic diagram showing still another example electric signal for the heat transfer operation according to an embodiment of the present invention, and FIG. 26 is a diagram showing the heat transfer operation of FIG. 25.

Referring to FIGS. 25 and 26, the heat output module 1640 may include a first thermoelectric couple group 1644-1, a second thermoelectric couple group 1644-2, a third thermoelectric couple group 1644-3, and a fourth thermoelectric couple group 1644-4.

In this case, all the thermoelectric couple groups are powered on to perform the thermoelectric operation.

In this case, the feedback controller 1648 may sequentially power off the thermoelectric couple groups 1644. Accordingly, first, the first thermoelectric couple group 1644-1 may stop the thermoelectric operation. Subsequently, the thermoelectric operation may be stopped in the order of the second, third, and fourth thermoelectric couple groups 1644-2, 1644-3, and 1644-4.

Thus, a user may feel a transfer of heat from a region where the first thermoelectric couple group 1644-1 is disposed on the contact surface to a region where the fourth thermoelectric couple group 1644-4 is disposed on the contact surface.

The aforementioned example may be utilized as follows.

For example, when a plurality of thermoelectric couple groups 1644 are vertically arranged in the feedback device while being gripped by a user, the user may be provided with a feeling that he or she is separated from cold water starting from the bottom of the body by transferring cold heat from a lower side to an upper side.

In the above-described example of the heat transfer operation, the four thermoelectric couple groups 1644 have been described as being arranged in a one-dimensional array. However, the number and arrangement of thermoelectric couple groups 1644 in the heat transfer operation according to an embodiment of the present invention are not limited to the above example.

3. Thermal Feedback Recognition Enhancement Method

A thermal feedback recognition enhancement method according to an embodiment of the present invention will be described below. Here, the thermal feedback recognition enhancement method may be understood as an operation for a user enhancing a thermal sensation degree according to a thermal feedback when the feedback device 1600 outputs the feedback.

As described above, a heat transfer operation may be performed in the feedback device 1600.

As shown in the example of FIG. 19, the feedback controller 1648 may sequentially power on thermoelectric element groups and may output a thermal feedback in the order of the first to fourth thermoelectric couple groups 1644-1 to 1644-4. Thus, a user may feel a transfer of heat from a region where the first thermoelectric couple group 1644-1 is disposed on the contact surface to a region where the fourth thermoelectric couple group 1644-4 is disposed on the contact surface. However, although a thermal feedback output from the first thermoelectric couple group 1644-1 has the same intensity as a thermal feedback output from the second thermoelectric couple group 1644-4, a user may feel that the intensity of the first thermoelectric couple group 1644-1 is different from the intensity of the fourth thermoelectric couple group 1644-4.

For example, a user may feel that a sensible temperature corresponding to the thermal feedback output from the first thermoelectric couple group 1644-1 is different from a sensible temperature corresponding to the thermal feedback output from the second thermoelectric couple group 1644-2. This is because a human body part that senses the thermal feedback output from the second thermoelectric couple group 1644-2 may be affected by the thermal feedback output from the first thermoelectric couple group 1644-1.

As a specific example, the content reproduction device 1200 outputs hot feedback data including a command to instruct to output a hot feedback at a specific time according to reproduction of a specific portion of content, and the feedback device 1600 may apply a voltage for outputting the hot feedback to the first thermoelectric couple group 1644-1 and the second thermoelectric couple group 1644-2 at the specific time point. However, even when the thermal feedback output by the first thermoelectric couple group 1644-1 and the thermal feedback output by the second thermoelectric couple group 1644-2 have a sensible temperature of T degrees, heat sensing organs distributed in the body part that senses the thermal feedback output from the second thermoelectric couple group 1644-2 are distributed by the thermal feedback output from the first thermoelectric couple group 1644-1, and thus the human part may sense the thermal feedback output from the second thermoelectric couple group 1644-1 at a temperature of higher than T degrees. Thus, a time point at which the user senses the thermal feedback output from the second thermoelectric couple group 1644-2 is also delayed. As a result, the user cannot sense a thermal experience when the specific portion of the content is reproduced.

However, in this case, by the feedback device 1600 performing the thermal feedback recognition enhancement method, the user may sense a thermal sensation at a time intended by the content reproduction device 1200 when the intensity or temperature of the thermal feedback output from the second thermoelectric couple group 1644-2 is distinguished in consideration of the thermal feedback output from the first thermoelectric couple group 1644-1, in the above example, when the second thermoelectric couple group 1644-2 outputs a thermal feedback having a temperature exceeding T degrees at the specific time point.

Accordingly, in order to solve such a problem, a thermal feedback recognition enhancement method for enhancing a user's cognition of a thermal feedback will be described below. Also, for convenience of description, the following description assumes that the thermal feedback recognition enhancement method is performed by the feedback device 1600. However, the present invention is not limited thereto, and the thermal feedback recognition enhancement method may be performed by the content reproduction device 1200 and may be performed by a third apparatus other than the feedback device 1600 and the content reproduction device 1200.

3.1. Overshoot of Thermal Feedback

As described above, when thermal feedbacks are output by a plurality of thermoelectric couple groups 1644 according to the heat transfer operation, a user's cognition of thermal feedback output by the subsequent thermoelectric couple group may be lowered due to the thermal feedback output from the previous thermoelectric couple group.

According to the present invention, in order to enhance the recognition of the thermal feedback output from the subsequent thermoelectric couple group of the user, an overshoot may be generated in the thermal feedback output from the subsequent thermoelectric couple group as the thermal feedback recognition enhancement method. Here, an overshoot may denote that when a thermal feedback of a specific intensity should be output from a thermoelectric couple group, the temperature of the thermoelectric couple group exceeds a saturation temperature corresponding to the specific intensity before the temperature of the thermoelectric couple group reaches the saturation temperature.

Figure 27:
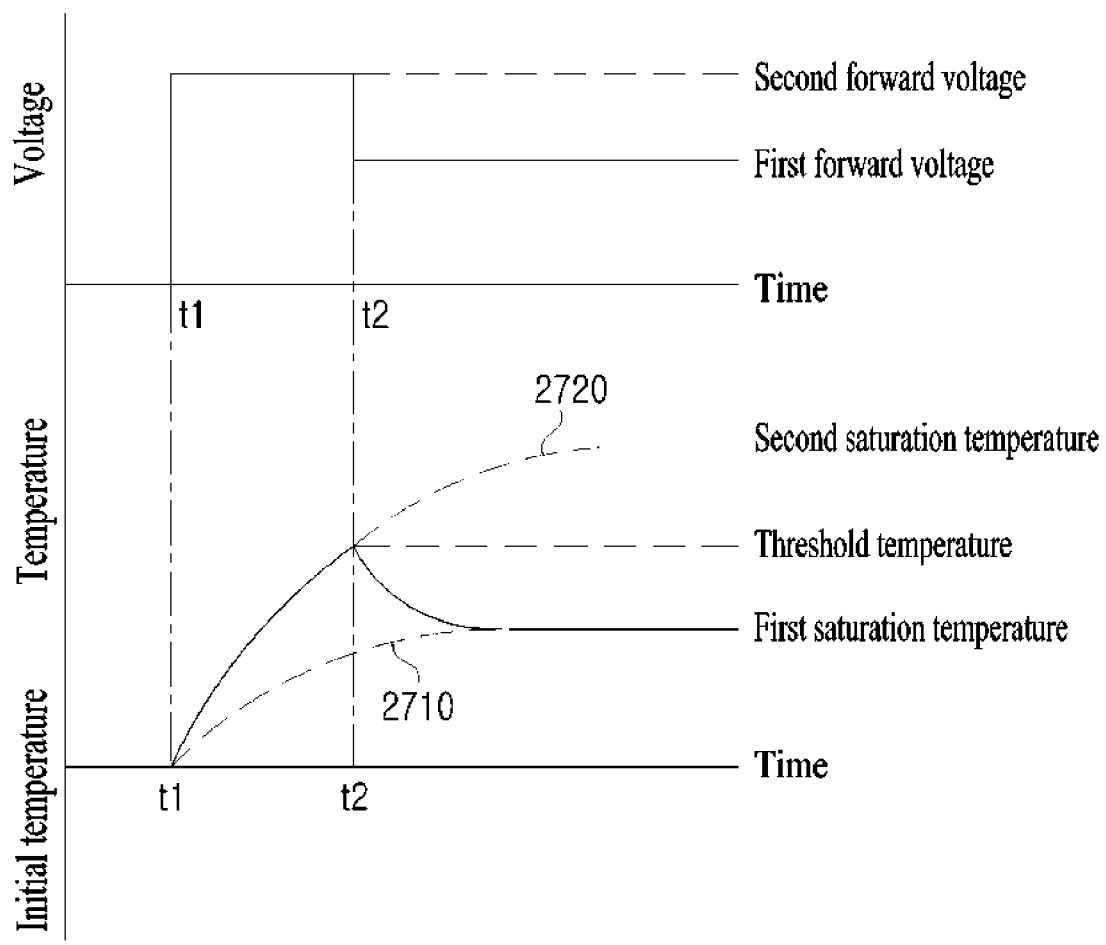
FIG. 27 is a diagram illustrating a change in applied voltage for generating an overshoot of a thermal feedback and a change in temperature with respect to the overshoot according to an embodiment of the present invention.

In detail, FIG. 27 is a diagram illustrating a change in applied voltage for generating an overshoot of a thermal feedback and a change in temperature with respect to the overshoot according to an embodiment of the present invention.

Referring to FIG. 27, the thermoelectric couple array 1643 or the contact surface 1641 has a predetermined heat capacity. Thus, when an exothermic operation or endothermic operation is initiated by applying operating power to a thermoelectric couple group in order to output a thermal feedback, the temperature of the contact surface 1641 gradually changes from an initial temperature and reaches the saturation temperature instead of reaching the saturation temperature as soon as power is applied. For example, when operating power (a first forward voltage in the example of FIG. 27) is applied to a thermoelectric couple group at a first time point in order to output a hot feedback with a first intensity, the temperature of the contact surface 1641 gradually increases from an initial temperature and reaches a first saturation temperature along a first reference temperature curve 2710. Also, when second forward voltage is applied to the thermoelectric couple group at the first time point in order to output a hot feedback with a second intensity, the temperature of the contact surface 1641 reaches a second saturation temperature along a second reference temperature curve 2720.

According to an embodiment of the present invention, in order to enhance recognition of a user's hot feedback, the feedback device 1600 may generate an overshoot for the hot feedback. For example, when the hot feedback with the first intensity is output, the feedback device 1600 may apply excessive power (a second forward voltage in the example of FIG. 27), which is higher than the operating power (i.e., the first forward voltage) for outputting the hot feedback with the first intensity, to the thermoelectric couple group from the first time to the second time point for overshoot generation. Here, the excessive power may refer to power applied to generate the overshoot (hereinafter the voltage and current of the excessive power are referred to as an "excessive voltage" and an "excessive current"). In this case, the excessive power may be in the same direction as the operating power. That is, the excessive power may be a forward voltage when the operating power is a forward voltage, and the excessive power may be a reverse voltage when the operating power is a reverse voltage.

When the excessive power is applied, the temperature of the contact surface 1641 may increase, not along the first reference temperature curve 2710, but along the second reference temperature curve 2720. In this case, the temperature of the contact surface 1641 may be higher than the first saturation temperature at the second time point. Also, the feedback device 1600 may apply operating power for the hot feedback with the first intensity at the second time point. Accordingly, the temperature of the contact surface 1641 may gradually decrease from the temperature of the contact surface 1641 at the second time point to reach the first saturation temperature. That is, the temperature of the contact surface 1641 at the second time point may be a threshold temperature.

In summary, when the hot feedback with the first intensity, which is a target intensity, is output and the excessive power, which is greater than the operating power, is applied to a thermoelectric couple group at the first time, the temperature of the contact surface 1641 at the second time point may be higher than the first saturation temperature corresponding to the first intensity. Also, when the operating power is applied to the thermoelectric couple group at the second time point, the temperature of the contact surface 1641 may be lowered from the threshold temperature, which is the temperature of the contact surface 1641 at the second time point, to the first saturation temperature. Accordingly, a user may temporarily feel the threshold temperature, which is higher than the first saturation temperature. Thus, the user may more clearly feel the hot feedback, and also the user may more earlier recognizes the hot feedback with the first intensity.

According to an embodiment of the present invention, the magnitude of the excessive voltage (a second forward voltage in the example of FIG. 27) applied for the overshoot may be predetermined. For example, as shown in the example of FIG. 27, the excessive voltage may be a voltage that is one step higher than the operating voltage (a first forward voltage in the example of FIG. 27) indicating a voltage with an intended intensity, that is, a voltage of the target intensity and may be a voltage that is multiple steps higher than the operating voltage. Also, the excessive voltage may be predetermined irrespective of the intensity of the thermal feedback. For example, the excessive voltage may be higher than the operating voltage by a predetermined value. Also, the ratio of the operating voltage to the excessive voltage may be predetermined.

In addition, as the excessive voltage is predetermined, a temperature (a second saturation temperature in the example of FIG. 27) corresponding to the excessive voltage may also be predetermined.

Likewise, the temperature corresponding to the excessive voltage may be a temperature that is determined to output a thermal feedback with a predetermined intensity and may be a temperature that is not related to the thermal feedback with the predetermined intensity. Also, the temperature corresponding to the excessive voltage may be higher than the saturation temperature corresponding to the operating voltage by a predetermined value, and the ratio of the temperature corresponding to the excessive voltage to the saturation temperature corresponding to the operating voltage may be predetermined.

Also, according to an embodiment of the present invention, a time point at which the application of the excessive voltage is stopped, that is, a time point at which the operating voltage is applied, may be predetermined. According to an embodiment of the present invention, the time point at which the application of the excessive voltage is stopped may be determined depending on the threshold temperature. That is, the time point at which the application of the excessive voltage is stopped affects the threshold temperature, and thus the time point at which the application of the excessive voltage is stopped may be predetermined in consideration of a relation between the threshold temperature and the time point at which the application of the excessive voltage is stopped. For example, the feedback device 1600 may stop applying the excessive voltage when the temperature of the contact surface 1641 reaches a predetermined threshold temperature. According to another embodiment of the present invention, the time point at which the application of the excessive voltage is stopped may be determined on the basis of the target intensity. For example, the time point at which the application of the excessive voltage is stopped may be t seconds when the target intensity is the first intensity and may be t+a seconds (or t−a seconds) when the target intensity is the second intensity.

Figure 28:
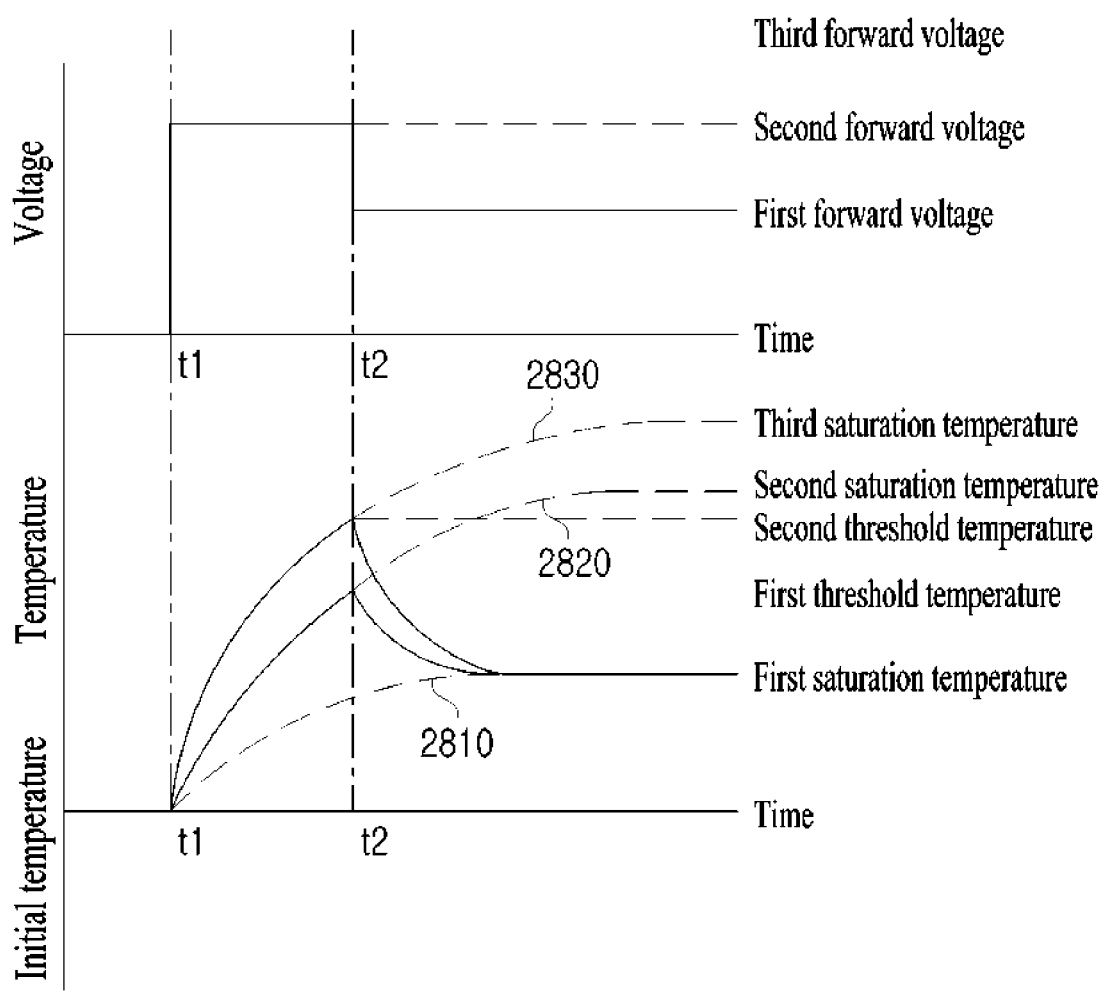
FIG. 28 is a diagram illustrating a change in applied voltage for generating an overshoot of a thermal feedback and a change in temperature with respect to the overshoot according to another embodiment of the present invention.

FIG. 28 is a diagram illustrating a change in applied voltage for generating an overshoot of a thermal feedback and a change in temperature with respect to the overshoot according to another embodiment of the present invention.

Referring to FIG. 28, when an operating voltage (a first forward voltage in the example of FIG. 28) is applied to the thermoelectric couple group 1644 at the first time point in order to output a hot feedback of a target intensity, the temperature of the contact surface 1641 may increase along a first reference curve 2810 to reach the first saturation temperature. In this case, when a first overshoot (a second forward voltage in the example of FIG. 28) is applied between the first time point and the second time point for overshoot generation, the temperature of the contact surface 1641 may increase between the first time point and the second time point along a second reference temperature curve 2820, and thus the temperature of the contact surface 1641 may reach a first threshold temperature which is higher than the first saturation temperature at the second time point. A user may recognize the hot feedback more clearly when the temperature of the contact surface 1641 reaches the first threshold temperature than when the operating voltage is applied from the first time point.

Also, according to an embodiment of the present invention, the feedback device 1600 may apply a second overshoot (a third forward voltage in the example of FIG. 28), which is higher than the first overshoot, between the first time point and the second time point. In this case, as the temperature of the contact surface 1641 increases between the first time point and the second time point along a third reference temperature curve 2830, the temperature of the contact surface 1641 at the second time point may reach a second threshold temperature which is higher than the first threshold temperature. The temperature of the contact surface 1641 at the second time point may further increase when the second overshoot is applied between the first time point and the second time point than when the first overshoot is applied between the first time point and the second time point. Thus, a user may clearly feel the hot feedback, and a time point at which the user recognizes the hot feedback may become earlier than when the first overshoot is applied.

Figure 29:
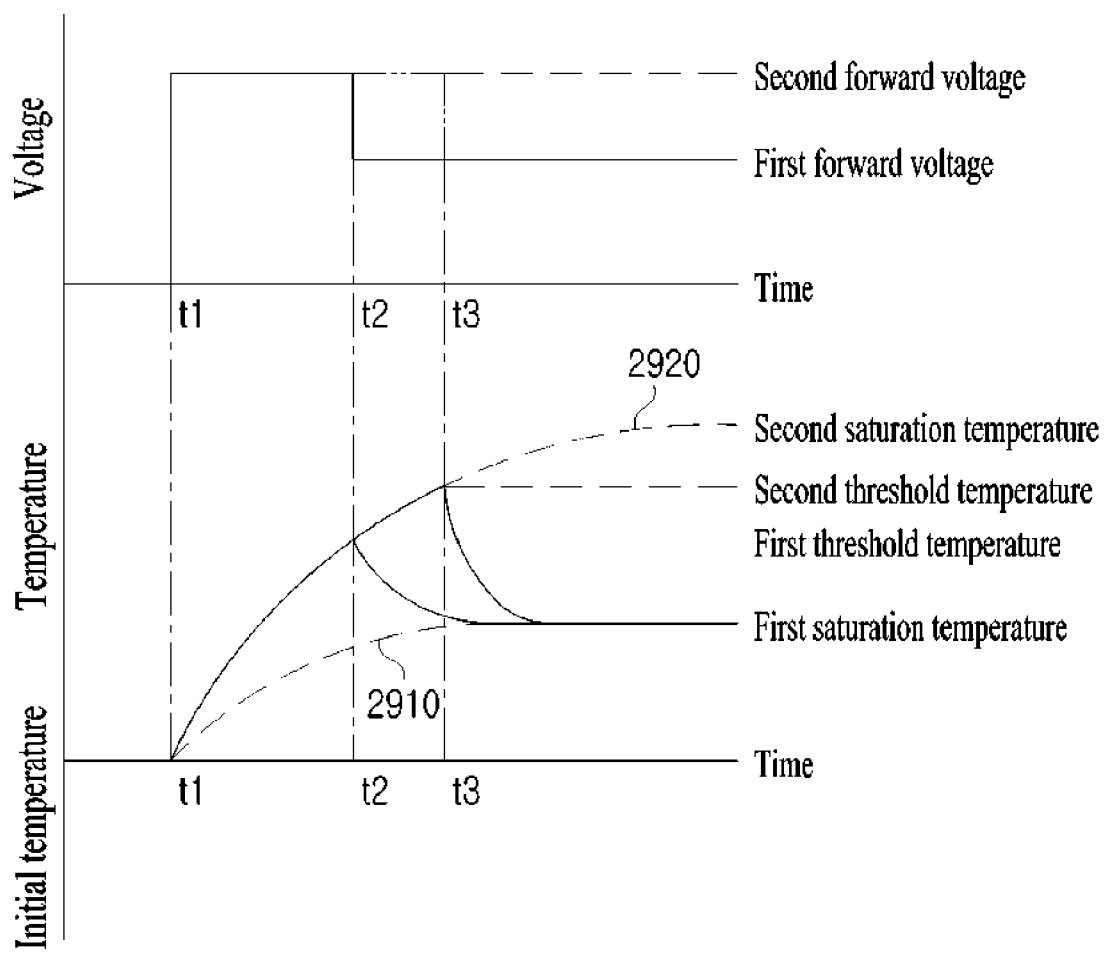
FIG. 29 is a diagram illustrating a change in applied voltage for generating an overshoot of a thermal feedback and a change in temperature with respect to the overshoot according to still another embodiment of the present invention.

FIG. 29 is a diagram illustrating a change in applied voltage for generating an overshoot of a thermal feedback and a change in temperature with respect to the overshoot according to still another embodiment of the present invention.

Referring to FIG. 29, when an operating voltage (a first forward voltage in the example of FIG. 29) is applied to the thermoelectric couple group 1644 at the first time point in order to output a hot feedback of a target intensity, the temperature of the contact surface 1641 may increase along a first reference curve 2910 to reach a first saturation temperature. In this case, when an overshoot (a second forward voltage in the example of FIG. 29) is applied between the first time point and the second time point for overshoot generation, the temperature of the contact surface 1641 may increase between the first time point and the second time point along a second reference temperature curve 2920, and thus the temperature of the contact surface 1641 may reach a first threshold temperature, which is higher than the first saturation temperature, at the second time point. A user may better recognize the hot feedback when the temperature of the contact surface 1641 reaches the first threshold temperature than when the operating voltage is applied from the first time point.

Also, according to an embodiment of the present invention, the feedback device 1600 may apply the excessive voltage from the first time point and up to a third time point which is after the second time point. In this case, as the temperature of the contact surface 1641 increases up to the third time point along the second reference temperature curve 2920, the temperature of the contact surface 1641 at the third time point may reach a second threshold temperature higher than the first threshold temperature, which is the temperature of the contact surface 1641 at the second time point. Thus, a user may feel the hot feedback more clearly than when the excessive voltage is applied up to the second time point.

Figure 30:
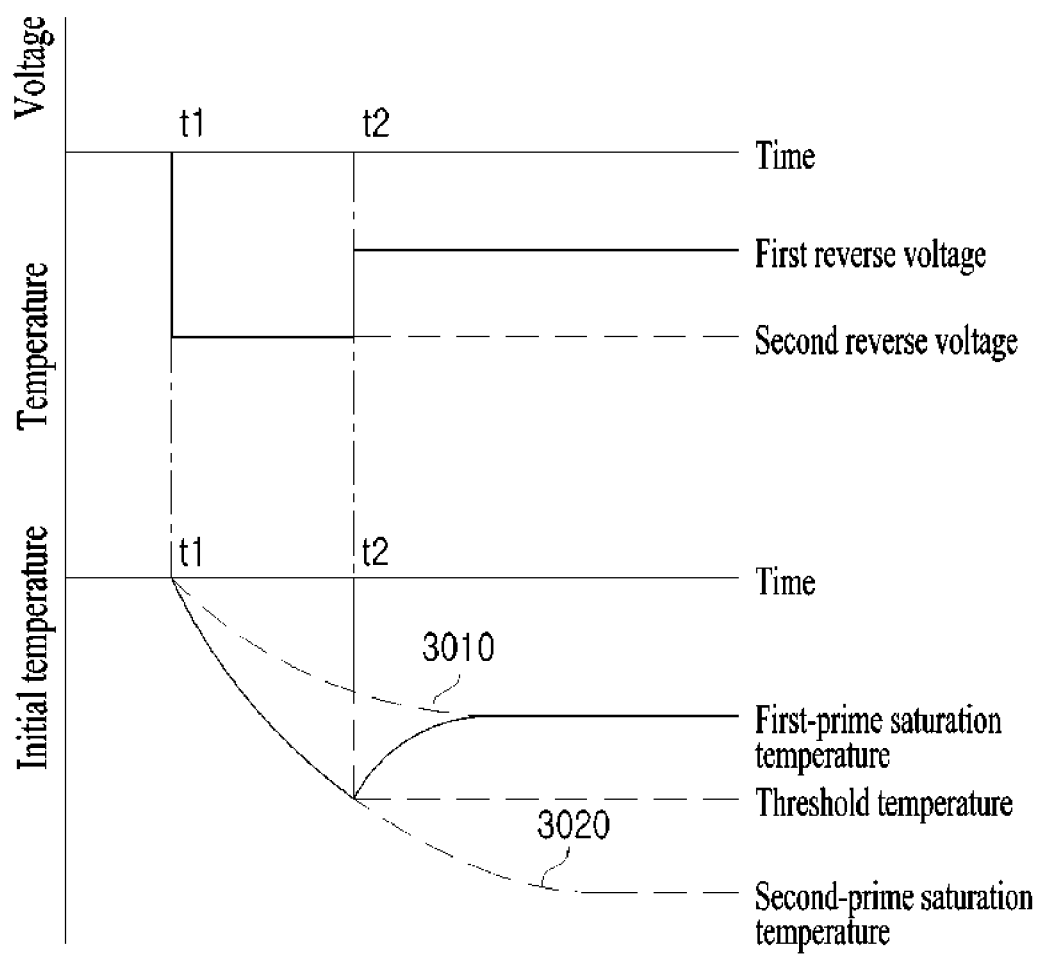
FIG. 30 is a diagram illustrating a change in applied voltage for generating an overshoot of a cold feedback and a change in temperature with respect to the overshoot according to an embodiment of the present invention.

FIG. 30 is a diagram illustrating a change in applied voltage for generating an overshoot of a cold feedback and a change in temperature with respect to the overshoot according to an embodiment of the present invention.

Referring to FIG. 30, even in the case where the cold feedback is output, as in the case where the hot feedback is output, when the endothermic operation is initiated, the temperature of the contact surface 1641 gradually changes from an initial temperature and reaches the saturation temperature instead of reaching the saturation temperature as soon as power is applied When an operating voltage (a first reverse voltage in the example of FIG. 30) is applied to a thermoelectric couple group at a first time point in order to output a cold feedback with a first intensity, the temperature of the contact surface 1641 gradually decreases from an initial temperature and reaches a first-prime saturation temperature along a first reference temperature curve 3010. Also, when an overshoot (a second reverse voltage in the example of FIG. 30) is applied to a thermoelectric couple group at the first time point in order to output a cold feedback with a second intensity, the temperature of the contact surface 1641 reaches a second-prime saturation temperature along a second reference temperature curve 3020.

According to an embodiment of the present invention, in order to enhance recognition of a user's cold feedback, the feedback device 1600 may generate an overshoot for the cold feedback. For example, when the cold feedback with the first intensity is output, the feedback device 1600 may apply an excessive voltage, which is higher than an operating voltage for the cold feedback with the first intensity, to the thermoelectric couple group from the first time point to the second time point for overshoot generation. When the excessive voltage is applied, the temperature of the contact surface 1641 may decrease, not along the first reference temperature curve 3010, but along the second reference temperature curve 3020. In this case, the temperature of the contact surface 1641 may be lower than the first-prime saturation temperature at the second time point. Also, the feedback device 1600 may apply the operating voltage for the cold feedback with the first intensity at the second time point. Accordingly, the temperature of the contact surface 1641 may gradually increase from the temperature of the contact surface 1641 at the second time point to reach the first-prime saturation temperature. That is, the temperature of the contact surface 1641 at the second time point may be a threshold temperature.

According to an embodiment of the present invention, the magnitude of the excessive voltage applied for the overshoot may be predetermined, and also the temperature corresponding to the voltage applied for the overshoot may be predetermined. Also, a time point at which the application of the voltage applied for the overshoot is stopped, that is, a time point at which the operating voltage is applied, may be predetermined.

Also, according to an embodiment of the present invention, a voltage higher than the excessive voltage may be applied at the second time point in order to generate the overshoot. The description with reference to FIGS. 27 to 29 may be applied to various implementations as it is, and thus a detailed description thereof will be omitted.

3.2. Implementation of Thermal Feedback Recognition Enhancement Method

Figure 31:
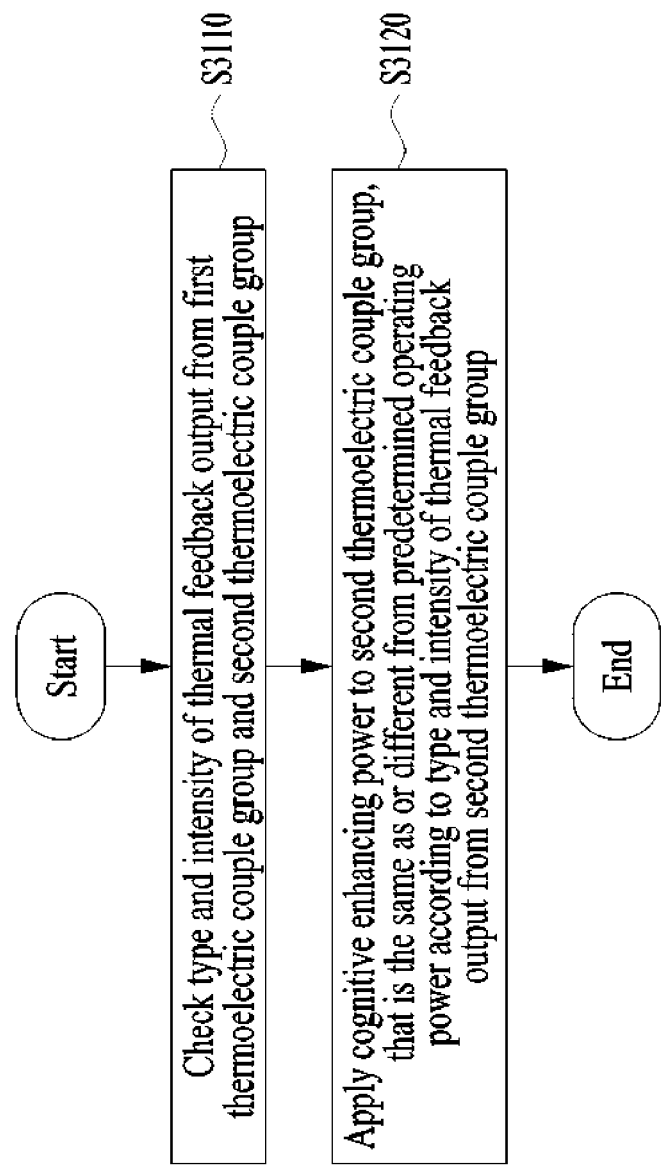
FIG. 31 is a flowchart showing a thermal feedback recognition enhancement method according to an embodiment of the present invention.

FIG. 31 is a flowchart showing a thermal feedback recognition enhancement method according to an embodiment of the present invention.

The recognition enhancement method according to FIG. 31 may include checking the types and intensities of thermal feedbacks output from a first thermoelectric couple group and a second thermoelectric couple group (S3110) and applying, to the second thermoelectric couple group, cognitive enhancing power that is the same as, or different from, operating power that is predetermined by the types and intensities of the thermal feedbacks (S3120).

In the recognition enhancement method according to an embodiment of the present invention, each of the first thermoelectric couple group and the second thermoelectric couple group may indicate a group of thermoelectric elements that are individually controlled, and the first thermoelectric couple group and the second thermoelectric couple group may be adjacent in distance. As an example, the first thermoelectric couple group and the second thermoelectric couple group may be included in the same thermoelectric couple group.

In detail, the feedback device 1600 may check the types and intensities of the thermal feedbacks output from the first thermoelectric couple group and the second thermoelectric couple group (S3110). In this case, the types and intensities of the thermal feedbacks output from the first thermoelectric couple group and the second thermoelectric couple group may be the same as or different from each other. Also, the types (forward voltage/reverse voltage) and magnitudes of voltages applied to the first thermoelectric couple group and the second thermoelectric couple group may be predetermined according to the types and intensities of the thermal feedbacks. Also, operating power applied to the first thermoelectric couple group and the second thermoelectric couple group to output the thermal feedbacks may be predetermined according to the types and intensities of the thermal feedbacks.

According to an embodiment of the present invention, the feedback device 1600 may acquire thermal feedback data from the content reproduction device 1200. The thermal feedback data may include information regarding the types and intensities of thermal feedbacks output from thermoelectric couple groups and the output start times and/or end times of the thermal feedbacks. The feedback device 1600 may check the types and intensities of the thermal feedbacks output from the thermoelectric couple groups on the basis of the thermal feedback data.

Also, the time point at which the thermal feedback is output from the first thermoelectric couple group may be different from the time point at which the thermal feedback is output from the second thermoelectric couple group. For example, according to the above heat transfer operation, the thermal feedback may be output from the second thermoelectric couple group after the thermal feedback is output from the first thermoelectric couple group. It will be appreciated that, as shown in FIGS. 19 to 26, the time points at which the thermal feedbacks are output from the first thermoelectric couple group and the second thermoelectric couple group may differ depending on the embodiment.

Also, the feedback device 1600 may apply, to the second thermoelectric couple group, cognitive enhancing power that is the same as, or different from, operating power that is predetermined by the type and intensity of the thermal feedback output from the second thermoelectric couple group.

Here, cognitive enhancing power may refer to power applied to a thermoelectric couple group in order to enhance a user's cognition of a thermal feedback. For example, the cognitive enhancing power may include the aforementioned excessive power. Also, the cognitive enhancing power may include a variety of power for enhancing a user's cognition although an overshoot is not generated like the aforementioned excessive power.

As described above, due to the thermal feedback output from the first thermoelectric couple group, the user may not recognize the thermal feedback output from the second thermoelectric couple group at an intended intensity at a time intended by the feedback device 1600. Thus, in order to enhance the user's cognition of the thermal feedback, the feedback device 1600 may adjust the thermal feedback output from the second thermoelectric couple group. To this end, the feedback device 1600 may apply, to the second thermoelectric couple group, a voltage different from a voltage predetermined by the type and intensity of the thermal feedback. However, the magnitude, application time, etc. of the voltage applied to the second thermoelectric couple group in order to enhance the recognition of the thermal feedback may differ depending on various situations, for example, the types and intensities of the thermal feedbacks output from the first thermoelectric couple group and the second thermoelectric couple group. For example, in order to enhance the recognition of the thermal feedback, the feedback device 1600 may apply, to the second thermoelectric couple group, a voltage that is the same as the voltage predetermined by the type and intensity of the thermal feedback.

Implementations of the thermal feedback recognition enhancement method in various situations will be described below. Also, for convenience of description, the following description focuses on a case in which hot feedbacks are to be output from the first and second thermoelectric couple groups. However, the present invention is not limited thereto, and it will be appreciated that the following description may be applied to cases in which cold feedbacks or thermal grill feedbacks are to be output by the first and second thermoelectric couple groups.

Figure 32:
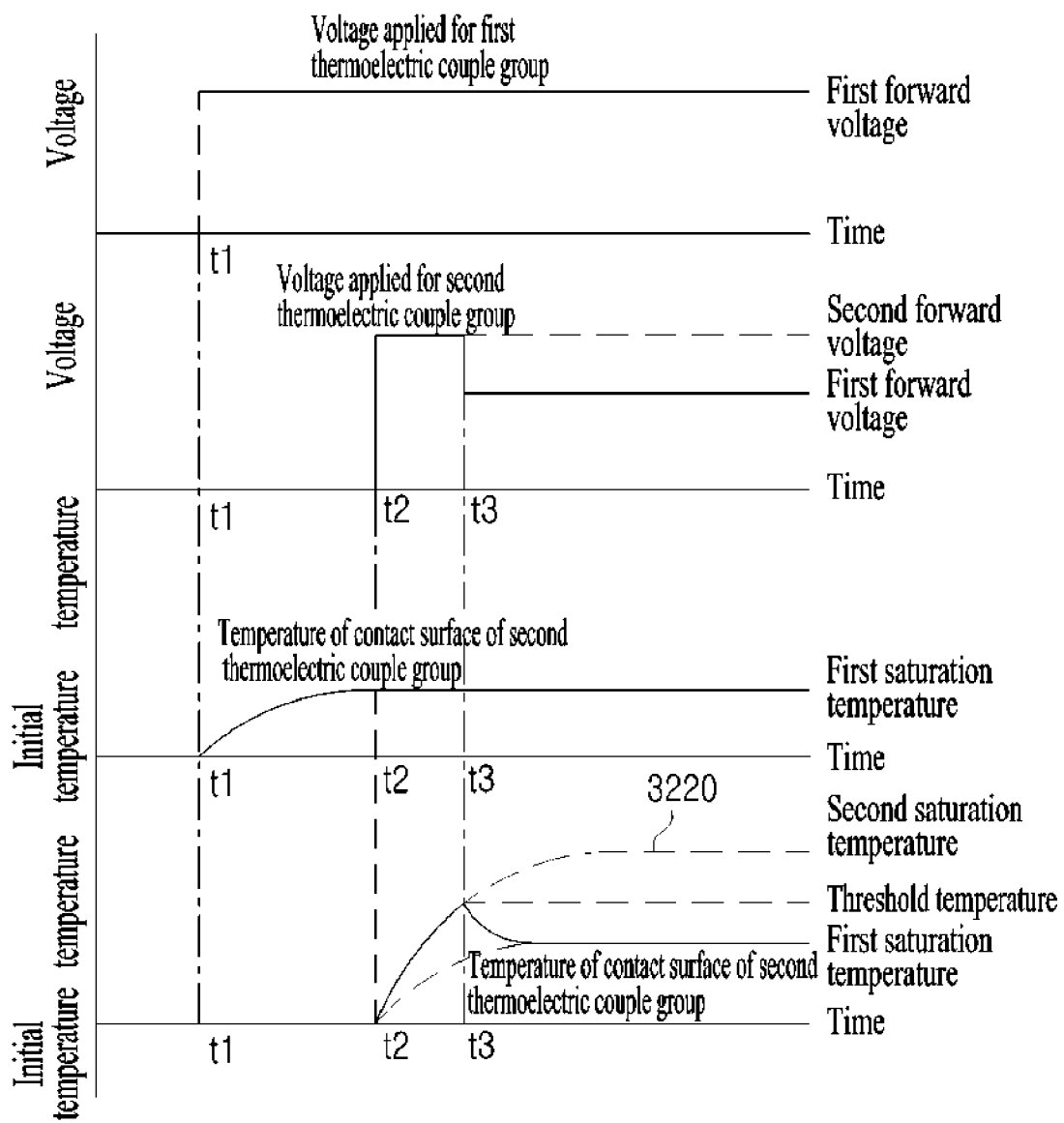
FIG. 32 is a diagram showing a change in temperature on a contact surface and a change in applied voltage according to a thermal feedback recognition enhancement method when thermal feedbacks with the same intensity are output from a first thermoelectric couple group and a second thermoelectric couple group according to an embodiment of the present invention.

FIG. 32 is a diagram showing a change in temperature on a contact surface and a change in applied voltage according to a thermal feedback recognition enhancement method when thermal feedbacks with the same intensity are output from a first thermoelectric couple group and a second thermoelectric couple group according to an embodiment of the present invention.

Referring to FIG. 32, the first thermoelectric couple group and the second thermoelectric couple group may simultaneously output a hot feedback with a first intensity. However, according to the heat transfer operation, the hot feedback may be output from the second thermoelectric couple group after the hot feedback is output from the first thermoelectric couple group.

In detail, at a first time point, a first operating voltage (a first forward voltage in the example of FIG. 32) for outputting the hot feedback with the first intensity may be applied to the first thermoelectric couple group. Thus, the temperature of the contact surface of the first thermoelectric couple group may rise up to a first saturation temperature. As an example, the first thermoelectric couple group may be a thermoelectric couple group in the thermoelectric couple array in which the heat transfer operation is performed firstly. From a second time point, which is a predetermined time after the first time point, to a third time point, an excessive voltage (a second forward voltage in the example of FIG. 32) higher than a second operating voltage (a first forward voltage in the example of FIG. 32) for outputting the hot feedback with the first intensity may be applied to the second thermoelectric couple group. For example, the excessive voltage may be a voltage for outputting a hot feedback with a second intensity. As the excessive voltage is applied from the second time point to the third time point, the temperature of the contact surface of the second thermoelectric couple group may rise along a second reference temperature curve 3220, and the temperature of the contact surface of the second thermoelectric couple group at the third time point, that is, a threshold temperature may be higher than a first saturation temperature. As the threshold temperature increases over the first saturation temperature, it is possible to enhance recognition of a thermal feedback output from the second thermoelectric couple group.

Figure 33:
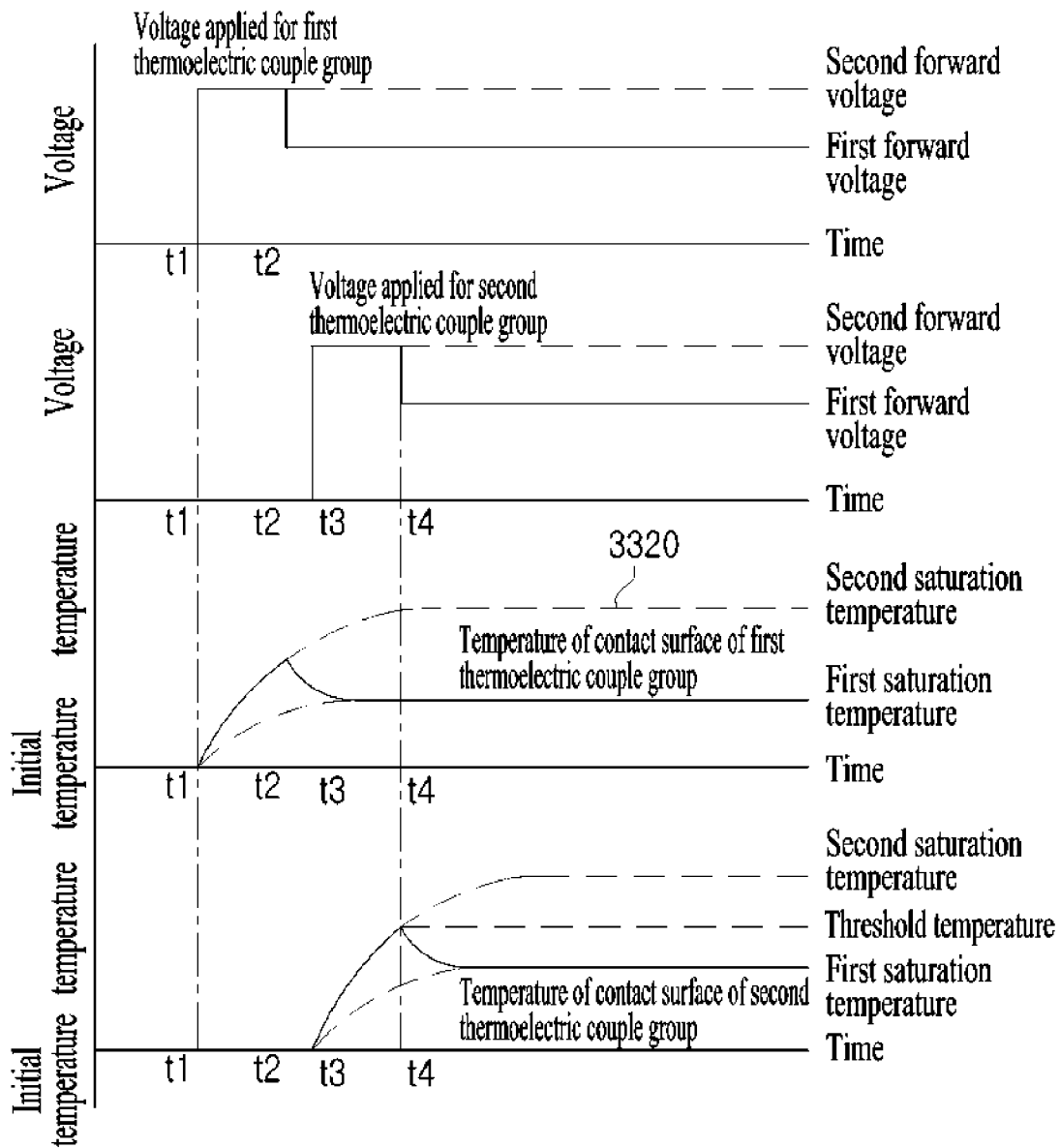
FIG. 33 is a diagram showing a change in temperature on a contact surface and a change in applied voltage according to a thermal feedback recognition enhancement method when thermal feedbacks with the same intensity are output from the first thermoelectric couple group and the second thermoelectric couple group according to another embodiment of the present invention.

FIG. 33 is a diagram showing a change in temperature on a contact surface and a change in applied voltage according to a thermal feedback recognition enhancement method when thermal feedbacks with the same intensity are output from the first thermoelectric couple group and the second thermoelectric couple group according to another embodiment of the present invention.

Referring to FIG. 33, the first thermoelectric couple group and the second thermoelectric couple group may simultaneously output a hot feedback with a first intensity. However, according to the heat transfer operation, the hot feedback may be output from the second thermoelectric couple group after the hot feedback is output from the first thermoelectric couple group.

Compared to FIG. 33, the feedback device 1600 may perform the thermal feedback recognition enhancement method even on the first thermoelectric couple group. For example, according to the heat transfer operation, another thermoelectric couple group adjacent to the first thermoelectric couple group may output a thermal feedback earlier than the first thermoelectric couple group, and the user's cognition of the thermal feedback output from the first thermoelectric couple group may be lowered due to the thermal feedback output from the other thermoelectric couple group. Thus, according to the present invention, the thermal feedback recognition enhancement method may be performed even on the first thermoelectric couple group. Also, even when the thermal feedback is not output from the other thermoelectric couple group, an overshoot may be generated for the thermal feedback of the first thermoelectric couple group in order to enhance the user's cognition of the thermal feedback output from the first thermoelectric couple group irrespective of whether a nearby thermoelectric couple group outputs a thermal feedback.

As the thermal feedback recognition enhancement method is performed on the first thermoelectric couple group, an excessive voltage (a second forward voltage in the example of FIG. 33) higher than the operating voltage (a first forward voltage in the example of FIG. 33) for outputting the hot feedback with the first intensity may be applied to the first thermoelectric couple group between the first time point and the second time point. Thus, by the temperature of the contact surface of the first thermoelectric couple group increasing along a second reference temperature curve 3320, the temperature of the contact surface of the first thermoelectric couple group at the second time point may be higher than the first saturation temperature. That is, an overshoot interval indicating a time interval in which the temperature of the contact surface of the first thermoelectric couple group is higher than the first saturation temperature may occur. Subsequently, the operating voltage is applied to the first thermoelectric couple group at the second time point so that the temperature of the contact surface of the first thermoelectric couple group may drop to the first saturation temperature.

Likewise, the thermal feedback recognition enhancement method may be performed even on the second thermoelectric couple group.

FIG. 34 is a diagram showing a change in temperature on a contact surface according to a thermal feedback recognition enhancement method when a thermal feedback with a higher intensity is output from the second thermoelectric couple group than from the first thermoelectric couple group according to an embodiment of the present invention.

Figure 34A:
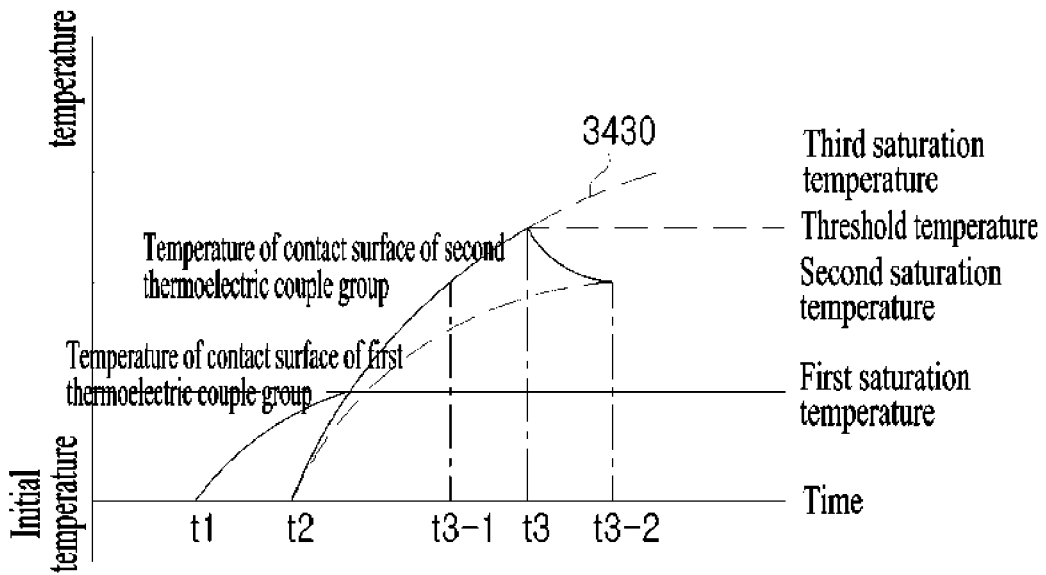
FIGS. 34A and 34B are diagrams showing a change in temperature on a contact surface according to a thermal feedback recognition enhancement method when a thermal feedback with a higher intensity is output from the second thermoelectric couple group than from the first thermoelectric couple group according to an embodiment of the present invention.
Figure 34B:
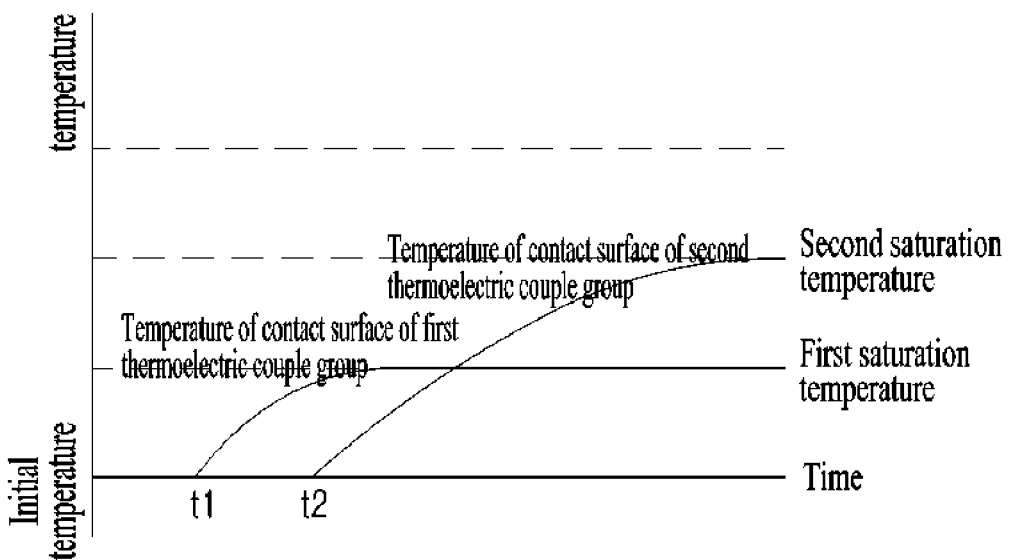

Referring to FIG. 34, in portions FIG. 34A and FIG. 34B, a thermal feedback with a higher intensity may be output from the second thermoelectric couple group than from the first thermoelectric couple group. As an example, a hot feedback with a first intensity may be output from the first thermoelectric couple group, and a hot feedback with a second intensity higher than the first intensity may be output from the second thermoelectric couple group. Also, according to the heat transfer operation, the hot feedback may be output from the second thermoelectric couple group after the output of the hot feedback from the first thermoelectric couple group is initiated.

Referring to FIG. 34A, the feedback device 1600 may generate an overshoot for the hot feedback with the second intensity output from the second thermoelectric couple group, as in the case where the hot feedback with the same intensity is output from the first thermoelectric couple group and the second thermoelectric couple group. For example, an excessive voltage (a third forward voltage in the example of FIG. 34) higher than an operating voltage (a second forward voltage in the example of FIG. 34) for the hot feedback with the second intensity may be applied to the second thermoelectric couple group from a second time point, which is after the first time point at which the hot feedback with the first intensity is output from the first thermoelectric couple group, to a third time point. Thus, the temperature of the contact surface of the second thermoelectric couple group may increase along a third reference temperature curve 3430 from the second time point to the third time point, and the temperature of the contact surface of the second thermoelectric couple group at the third time point may be higher than the second saturation temperature.

Subsequently, the operating voltage for the hot feedback with the second intensity is applied at the third time point so that the temperature of the contact surface of the second thermoelectric couple group may reach the second saturation temperature. Thus, an overshoot of the hot feedback output from the second thermoelectric couple group may be generated while the temperature of the contact surface of the second thermoelectric couple group is higher than the second saturation temperature (i.e., during a time interval between a third-prime time point and a third-double-prime time point). As the overshoot is generated, it is possible to enhance recognition of the thermal feedback output from the second thermoelectric couple group.

Referring to FIG. 34B, unlike FIG. 34A, the feedback device 1600 may not generate an overshoot for the hot feedback output from the second thermoelectric couple group. In detail, the hot feedback with the second intensity, which is higher than the hot feedback with the first intensity output from the first thermoelectric couple group, is output from the second thermoelectric couple group. In this case, the temperature of the contact surface of the second thermoelectric couple group is higher than the first saturation temperature, which is the temperature of the contact surface of the first thermoelectric couple group. Thus, although a user's senses are disturbed by the hot feedback of the first thermoelectric couple group, the user is not affected by the hot feedback of the first thermoelectric couple group and may recognize the hot feedback output from the second thermoelectric couple group. Accordingly, when the feedback device 1600 confirms that the intensity of the thermal feedback output from the second thermoelectric couple group is higher than the intensity of the thermal feedback output from the first thermoelectric couple group, the feedback device 1600 does not generate an overshoot for the thermal feedback of the second thermoelectric couple group and may output the thermal feedback with the confirmed intensity.

FIG. 35 is a diagram showing a change in temperature on a contact surface according to a thermal feedback recognition enhancement method when a thermal feedback with a lower intensity is output from the second thermoelectric couple group than from the first thermoelectric couple group according to an embodiment of the present invention.

Figure 35A:
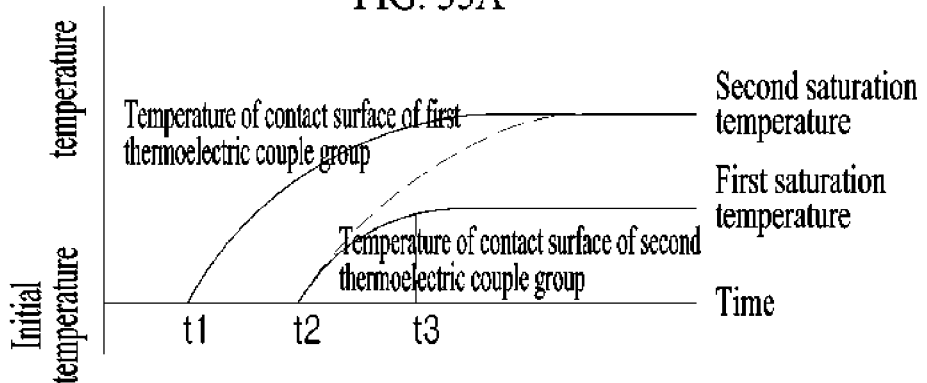
FIGS. 35A-35C are diagrams showing a change in temperature on a contact surface according to a thermal feedback recognition enhancement method when a thermal feedback with a lower intensity is output from the second thermoelectric couple group than from the first thermoelectric couple group according to an embodiment of the present invention.
Figure 35B:
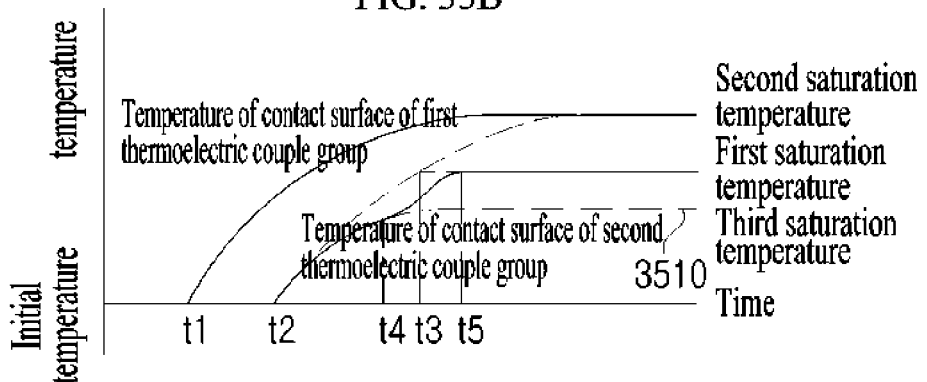
Figure 35C:
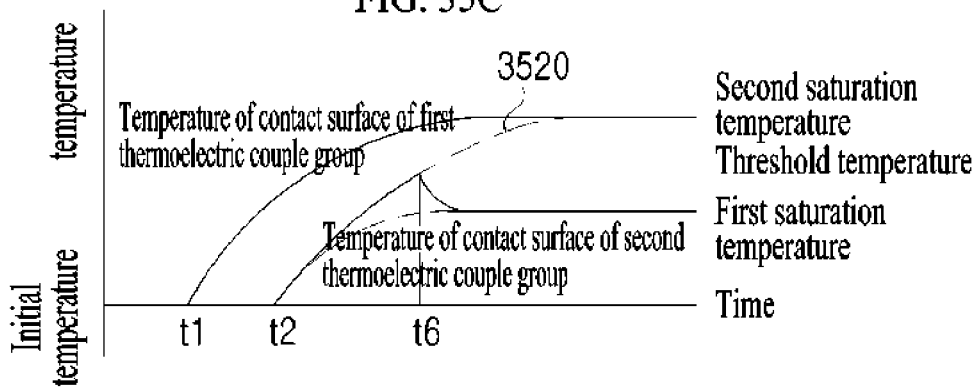

Referring to FIG. 35, in portions FIG. 35A, FIG. 35B, and FIG. 35C, a thermal feedback with a lower intensity may be output from the second thermoelectric couple group than from the first thermoelectric couple group. As an example, a hot feedback with a second intensity may be output from the first thermoelectric couple group, and a hot feedback with a first intensity lower than the second intensity may be output from the second thermoelectric couple group. Also, according to the heat transfer operation, the hot feedback may be output from the second thermoelectric couple group after the output of the hot feedback from the first thermoelectric couple group is initiated.

Referring to FIG. 35A, the feedback device 1600 may not generate an overshoot for the hot feedback output from the second thermoelectric couple group. In detail, the hot feedback with the first intensity, which is lower than the hot feedback with the second intensity output from the first thermoelectric couple group, is output from the second thermoelectric couple group. In this case, the temperature of the contact surface of the second thermoelectric couple group may be the first saturation temperature lower than the second saturation temperature, which is the temperature of the contact surface of the first thermoelectric couple group. That is, a temperature difference between the contact surface of the first thermoelectric couple group and the contact surface of the second thermoelectric couple group occurs, and the user may recognize the temperature difference. Accordingly, although the user's senses are disturbed by the hot feedback of the first thermoelectric couple group, the user is not affected by the hot feedback of the first thermoelectric couple group and may recognize the hot feedback output from the second thermoelectric couple group because of the temperature difference. Accordingly, when the feedback device 1600 confirms that the intensity of the thermal feedback output from the second thermoelectric couple group is lower than the intensity of the thermal feedback output from the first thermoelectric couple group, the feedback device 1600 does not generate an overshoot for the thermal feedback of the second thermoelectric couple group and may output the thermal feedback with the confirmed intensity.

Referring to FIG. 35B, the feedback device 1600 may temporarily increase the temperature difference between the contact surface of the first thermoelectric couple group and the contact surface of the second thermoelectric couple group. In addition, according to an embodiment, when the temperature difference between the contact surface of the first thermoelectric couple group and the contact surface of the second thermoelectric couple group increases, the user may better recognize the thermal feedback output from the second thermoelectric couple group. Accordingly, by using the thermal feedback recognition enhancement method, the feedback device 1600 may gradually increase the temperature of the contact surface of the second thermoelectric couple group to temporarily increase the temperature difference between the contact surface of the first thermoelectric couple group and the contact surface of the second thermoelectric couple group.

According to an embodiment of the present invention, after the feedback device 1600 initiates the output of the hot feedback with the second intensity from the first thermoelectric couple group at the first time point, the second thermoelectric couple group may output the hot feedback with the first intensity at the second time point. In this case, instead of applying an operating temperature (a first forward voltage in the example of FIG. 35B) for the hot feedback with the first intensity to the second thermoelectric couple group between the second time point and a fourth time point, the feedback device 1600 may apply a third forward voltage lower than the operating temperature. Thus, the temperature of the contact surface of the second thermoelectric couple group may gradually increase along a third reference temperature curve 3510. Subsequently, the feedback device 1600 applies the operating temperature to the second thermoelectric couple group at the fourth time point so that a temperature increase rate increases on the contact surface of the second thermoelectric couple group and thus the temperature of the contact surface of the second thermoelectric couple group reaches the first saturation at a fifth time point. As described above, as the third forward voltage lower than the operating temperature is applied to the second thermoelectric couple group between the second time point and the fourth time point instead of the operating temperature being applied to the second thermoelectric couple group from the second time point, the temperature difference between the contact surface of the first thermoelectric couple group and the contact surface of the second thermoelectric couple group increases between the second time point and the fourth time point. Thus, the user may better recognize the hot feedback output from the second thermoelectric couple group. Also, the contact surface of the second thermoelectric couple group reaches the first saturation temperature at the third time point when the operating temperature is applied to the second thermoelectric couple group at the second time point, and the contact surface of the second thermoelectric couple group reaches the first saturation temperature at the fifth time point, which is after the third time point, when the third forward voltage is applied to the second thermoelectric couple group between the second time point and the fourth time point.

Referring to FIG. 35C, the feedback device 1600 may generate an overshoot for the hot feedback with the first intensity output from the second thermoelectric couple group. According to an embodiment, even when the intensity of the thermal feedback output from the second thermoelectric couple group is lower than the intensity of the thermal feedback output from the first thermoelectric couple group, the temperature of the contact surface of the second thermoelectric couple group temporarily increases such that the user may better recognize the thermal feedback output from the second thermoelectric couple group. To this end, the feedback device 1600 may apply an excessive voltage (a second forward voltage in the example of FIG. 35C) higher than the operating voltage (a first forward voltage in the example of FIG. 35C) for the hot feedback with the second intensity to the second thermoelectric couple group between the second time point and a sixth time point. Thus, the temperature of the contact surface of the second thermoelectric couple group may increase along a second reference temperature curve 3520 from the second time point to the sixth time point, and the temperature of the contact surface of the second thermoelectric couple group at the sixth time point may be higher than the first saturation temperature. Subsequently, the operating response for the hot feedback with the first intensity is applied at the sixth time point so that the temperature of the contact surface of the second thermoelectric couple group may reach the first saturation temperature. In this case, an overshoot of the hot feedback output from the second thermoelectric couple group may be generated during a time interval in which the temperature of the contact surface of the second thermoelectric couple group increases over the first saturation temperature. As the overshoot is generated, it is possible to enhance recognition of the thermal feedback output from the second thermoelectric couple group.

FIG. 36 is a diagram showing a change in temperature on a contact surface according to a thermal feedback recognition enhancement method when a hot feedback is output from the first thermoelectric couple group and a cold feedback is output from the second thermoelectric couple group according to an embodiment of the present invention.

Figure 36A:
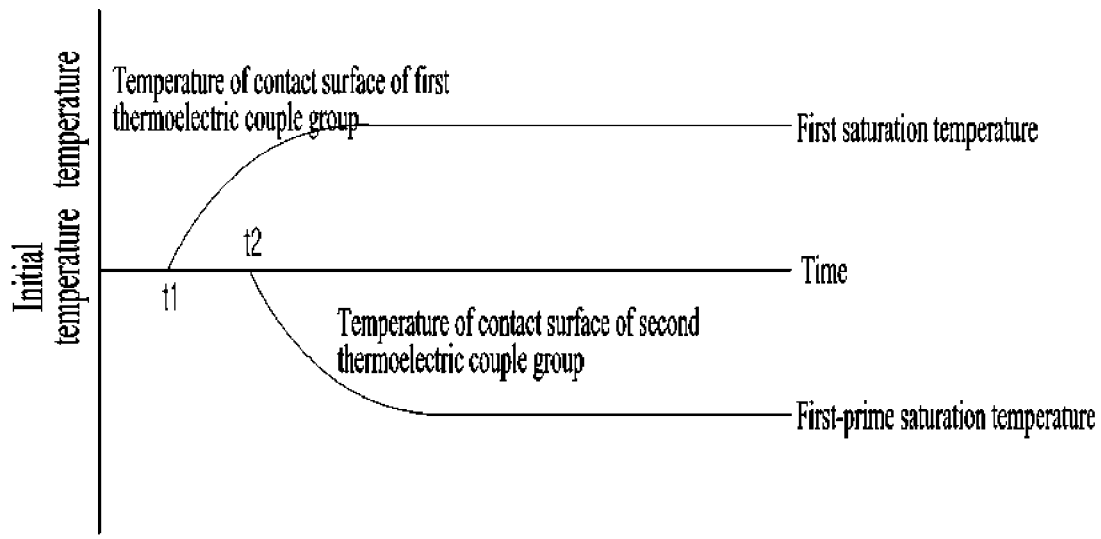
FIGS. 36A and 36B are diagrams showing a change in temperature on a contact surface according to a thermal feedback recognition enhancement method when a hot feedback is output from the first thermoelectric couple group and a cold feedback is output from the second thermoelectric couple group according to an embodiment of the present invention.
Figure 36B:
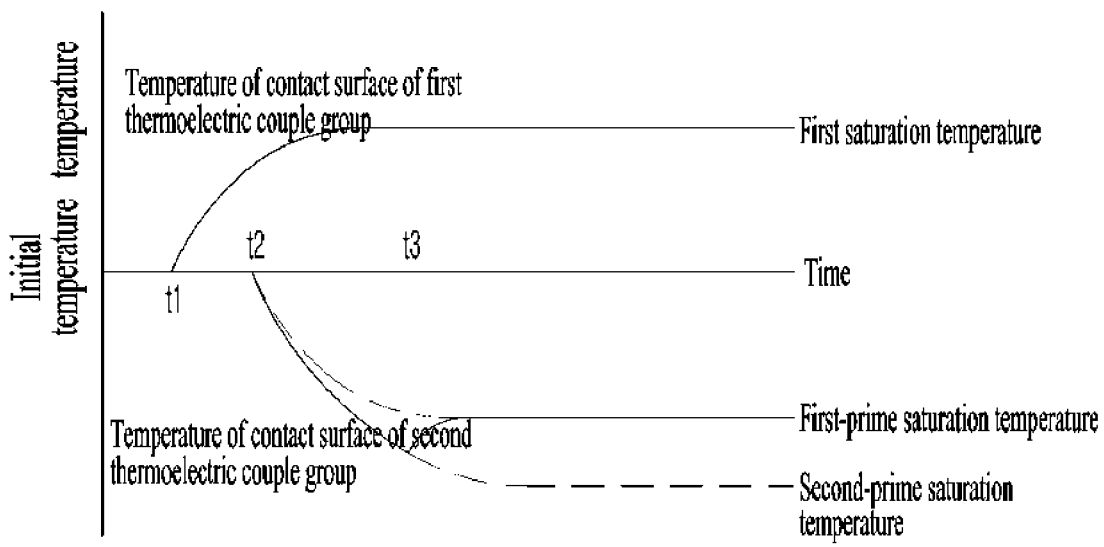

Referring to FIG. 36, in portions FIG. 36A and FIG. 36B, a hot feedback may be output from the first thermoelectric couple group, and a cold feedback may be output from the second thermoelectric couple group. In this case, the intensity of the hot feedback output from the first thermoelectric couple group may be the same as or different from the intensity of the cold feedback output from the second thermoelectric couple group. For convenience of description, the following description assumes that the intensity of the hot feedback output from the first thermoelectric couple group is the same as the intensity of the cold feedback output from the second thermoelectric couple group, but the present invention is not limited thereto. The description with reference to FIG. 36 may apply to even a case in which the intensity of the hot feedback output from the first thermoelectric couple group is different from the intensity of the cold feedback output from the second thermoelectric couple group. Also, according to the heat transfer operation, the cold feedback may be output from the second thermoelectric couple group after the output of the hot feedback from the first thermoelectric couple group is initiated.

Referring to FIG. 36A, the feedback device 1600 may not generate an overshoot for the cold feedback output from the second thermoelectric couple group. In detail, the cold feedback, which is opposite to the hot feedback output from the first thermoelectric couple group, is output from the second thermoelectric couple group. A hot spot of the user's body is stimulated by the hot feedback, and a cold spot of the user's body is stimulated by the cold feedback. Thus, since the sensory point of the user affected by the hot feedback output from the first thermoelectric couple group is different from the sensory point of the user affected by the cold feedback output from the second thermoelectric couple group, the user is not affected by the hot feedback of the first thermoelectric couple group and may recognize the cold feedback output from the second thermoelectric couple group. Accordingly, when the feedback device 1600 confirms that the type of the thermal feedback output from the second thermoelectric couple group is different from the type of the thermal feedback output from the first thermoelectric couple group, the feedback device 1600 does not generate an overshoot for the thermal feedback of the second thermoelectric couple group and may output the thermal feedback with the confirmed type.

Referring to FIG. 36B, the feedback device 1600 may generate an overshoot for the cold feedback output from the second thermoelectric couple group. According to an embodiment, even when the type of the thermal feedback output from the second thermoelectric couple group is different from the type of the thermal feedback output from the first thermoelectric couple group, the difference between the temperature of the contact surface of the first thermoelectric couple group and the temperature of the contact surface of the second thermoelectric couple group increases such that the user may better recognize the thermal feedback output from the second thermoelectric couple group. To this end, the feedback device 1600 may apply an excessive voltage (a second reverse voltage in the example of FIG. 36B) higher than the operating voltage (a first reverse voltage in the example of FIG. 36B) for the cold feedback with the first intensity to the second thermoelectric couple group between the second time point and the third time point during which the second thermoelectric couple group outputs the cold feedback. Accordingly, an overshoot of the cold feedback output from the second thermoelectric couple group may be generated during a time interval in which the temperature of the contact surface of the second thermoelectric couple group decreases below the first-prime saturation temperature. The temperature difference between the contact surface of the first thermoelectric couple group and the contact surface of the second thermoelectric couple group temporarily increases due to the generation of the overshoot, and thus it is possible to enhance recognition of the thermal feedback output from the second thermoelectric couple group.

FIG. 37 is a diagram showing a change in temperature on a contact surface according to a thermal feedback recognition enhancement method when a cold feedback is output from the first thermoelectric couple group and a hot feedback is output from the second thermoelectric couple group according to an embodiment of the present invention.

Figure 37A:
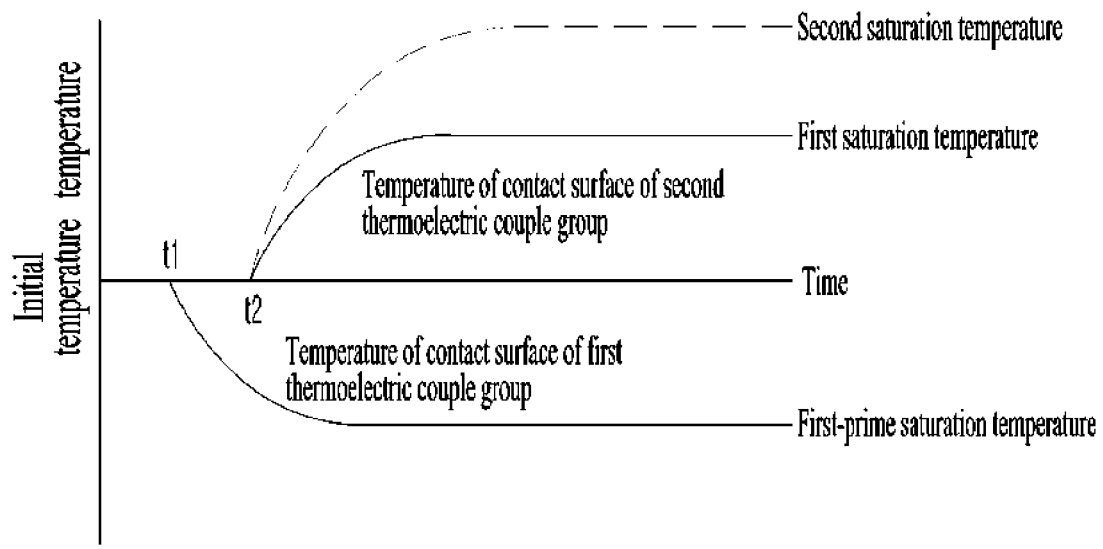
FIGS. 37A and 37B are diagrams showing a change in temperature on a contact surface according to a thermal feedback recognition enhancement method when a cold feedback is output from the first thermoelectric couple group and a hot feedback is output from the second thermoelectric couple group according to an embodiment of the present invention.
Figure 37B:
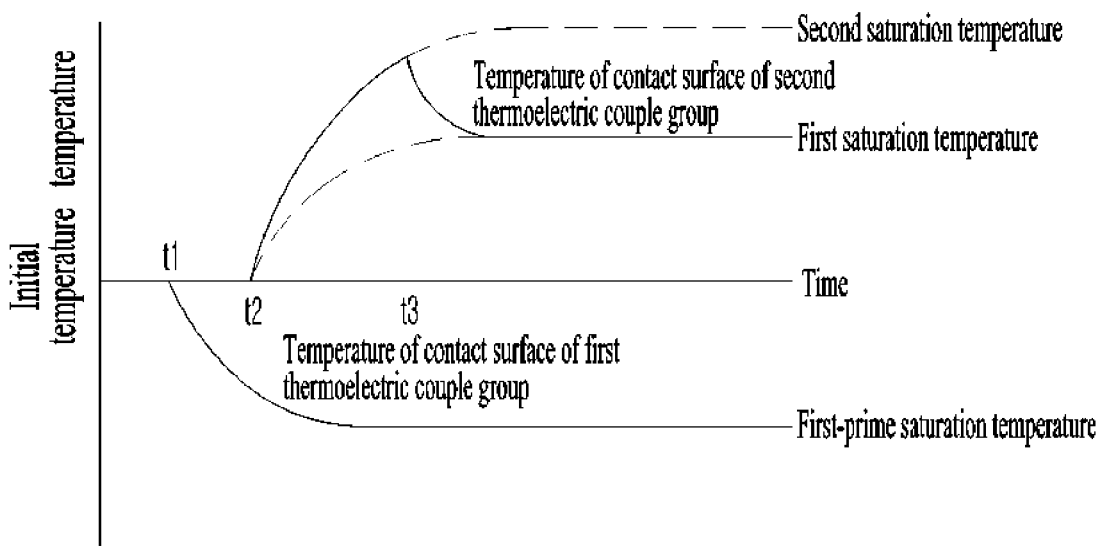

Referring to FIG. 37, in portions FIG. 37A and FIG. 37B, a cold feedback may be output from the first thermoelectric couple group, and a hot feedback may be output from the second thermoelectric couple group, as opposed to the embodiment of FIG. 36. In this case, the intensity of the cold feedback output from the first thermoelectric couple group may be the same as, or different from, the intensity of the hot feedback output from the second thermoelectric couple group. For convenience of description, the following description assumes that the intensity of the cold feedback output from the first thermoelectric couple group is the same as the intensity of the hot feedback output from the second thermoelectric couple group, but the present invention is not limited thereto. The description with reference to FIG. 37 may even apply to a case in which the intensity of the cold feedback output from the first thermoelectric couple group is different from the intensity of the hot feedback output from the second thermoelectric couple group. Also, according to the heat transfer operation, the hot feedback may be output from the second thermoelectric couple group after the output of the cold feedback from the first thermoelectric couple group is initiated.

Referring to FIG. 37A, the feedback device 1600 may not generate an overshoot for the hot feedback output from the second thermoelectric couple group. As described in FIG. 36A, as a user's sensory points affected by the hot feedback and the cold feedback are different from each other, the user is not affected by the cold feedback of the first thermoelectric couple group and may recognize the hot feedback output from the second thermoelectric couple group. Accordingly, when the feedback device 1600 confirms that the type of the thermal feedback output from the second thermoelectric couple group is different from the type of the thermal feedback output from the first thermoelectric couple group, the feedback device 1600 does not generate an overshoot for the thermal feedback of the second thermoelectric couple group and may output the thermal feedback with the confirmed type.

Referring to FIG. 37B, the feedback device 1600 may generate an overshoot for the hot feedback output from the second thermoelectric couple group. As shown in FIG. 36B, according to an embodiment, even when the type of the thermal feedback output from the second thermoelectric couple group is different from the type of the thermal feedback output from the first thermoelectric couple group, the difference between the temperature of the contact surface of the first thermoelectric couple group and the temperature of the contact surface of the second thermoelectric couple group increases such that the user may better recognize the thermal feedback output from the second thermoelectric couple group. To this end, the feedback device 1600 may apply an excessive voltage (a second forward voltage in the example of FIG. 37B) higher than the operating voltage (a first forward voltage in the example of FIG. 37B) for the hot feedback with the first intensity to the second thermoelectric couple group between the second time point and the third time point during which the second thermoelectric couple group outputs the hot feedback. Accordingly, an overshoot of the hot feedback output from the second thermoelectric couple group may be generated during a time interval in which the temperature of the contact surface of the second thermoelectric couple group increases over the first saturation temperature. The temperature difference between the contact surface of the first thermoelectric couple group and the contact surface of the second thermoelectric couple group temporarily increases due to the generation of the overshoot, and thus it is possible to enhance recognition of the thermal feedback output from the second thermoelectric couple group.

Figure 38:
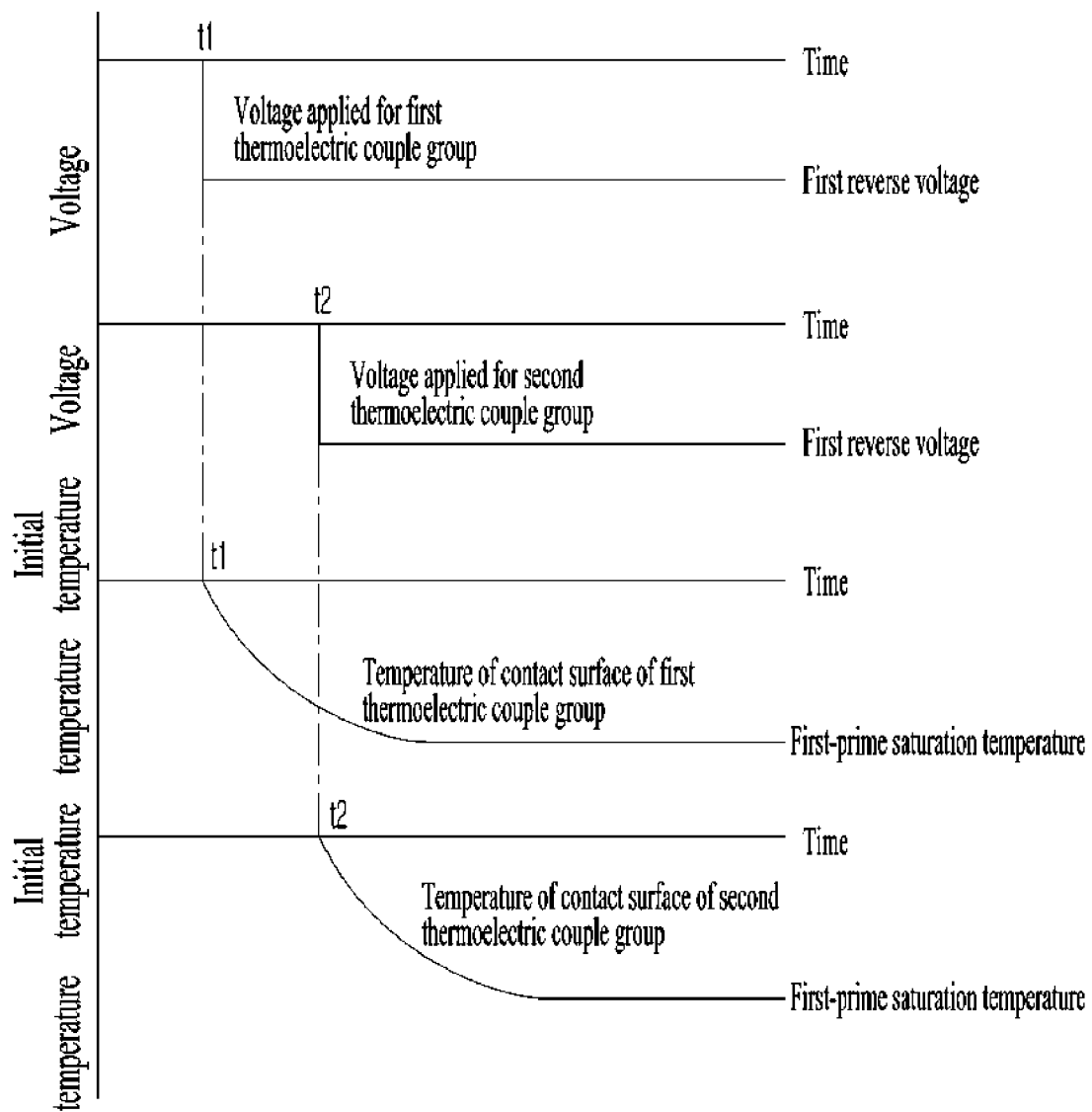
FIG. 38 is a diagram showing a change in temperature on a contact surface and a change in applied voltage according to a thermal feedback recognition enhancement method when a cold feedback is output from the first thermoelectric couple group and the second thermoelectric couple group according to an embodiment of the present invention.

FIG. 38 is a diagram showing a change in temperature on a contact surface and a change in applied voltage according to a thermal feedback recognition enhancement method when a cold feedback is output from the first thermoelectric couple group and the second thermoelectric couple group according to an embodiment of the present invention.

The first thermoelectric couple group and the second thermoelectric couple group may output cold feedbacks with the same intensity or with different intensities. However, according to the heat transfer operation, the cold feedback may be output from the second thermoelectric couple group after the output of the cold feedback from the first thermoelectric couple group is initiated.

According to an embodiment of the present invention, by using the thermal feedback recognition enhancement method, the feedback device 1600 may generate an overshoot of the hot feedback output from the second thermoelectric couple group when the hot feedback is output from the second thermoelectric couple group but may not generate an overshoot of the cold feedback output from the second thermoelectric couple group when the cold feedback is output from the second thermoelectric couple group.

In detail, depending on the body part, the number of cold spots is greater than the number of hot spots among the user's sensory spots. Since the number of cold spots is greater, that is, since the number of cold spots is greater than the number of hot spots at the same body part due to the cold feedback output from the first thermoelectric couple group, the user's senses are less disturbed when the cold feedback is output from the first thermoelectric couple group than when the hot feedback is output from the first thermoelectric couple group. Thus, when the thermal feedback output from the second thermoelectric couple group is the cold feedback, the user is not affected by the thermal feedback output from the first thermoelectric couple group and may recognize the cold feedback output from the second thermoelectric couple group although an overshoot for the cold feedback output from the second thermoelectric couple group is not generated. Accordingly, the feedback device 1600 may not generate an overshoot for the cold feedback output from the second thermoelectric couple group.

Referring to FIG. 38, as shown in FIG. 38, a first operating voltage (a first reverse voltage in the example of FIG. 38) for outputting the cold feedback may be applied to the first thermoelectric couple group at a first time point. Also, a second operating voltage (a first reverse voltage in the example of FIG. 38) may be applied to the second thermoelectric couple group at a second time point, which is after the first time point. Thus, an overshoot is not generated in the thermal feedback of the second thermoelectric couple group, and the temperature of the contact surface of the first thermoelectric couple group reaches the first-prime saturation temperature. However, since the number of cold spots are greater than the number of hot spots although the overshoot is not generated, the user is not affected by the cold feedback output from the first thermoelectric couple group and may recognize the cold feedback output from the second thermoelectric couple group.

In summary, with respect to the description with reference to FIG. 38, according to an embodiment of the present invention, the feedback device 1600 may perform the thermal feedback recognition enhancement method according to steps S3110 and S3120. In this case, as shown in FIG. 38, in step S3110, the feedback device 1600 may confirm that the type of the thermal feedback output from the second thermoelectric couple group is a cold feedback. In this case, in S3120, the feedback device 1600 may not generate an overshoot for the cold feedback output from the second thermoelectric couple group and may apply a predetermined voltage to the second thermoelectric couple group in order to output the cold feedback. That is, in S3120, whether the feedback device 1600 generates an overshoot for the thermal feedback output from the second thermoelectric couple group may be selectively determined according to the type of the thermal feedback output from the second thermoelectric couple group. In other words, in S3120, the feedback device 1600 may generate an overshoot for the hot feedback when the hot feedback is output from the second thermoelectric couple group and may not generate an overshoot for the cold feedback when the cold feedback is output from the second thermoelectric couple.

3.3. Time Point at which Excessive Power for Generating an Overshoot of a Thermal Feedback is Applied As described above, according to the heat transfer operation, a voltage for outputting the thermal feedback from the second thermoelectric couple group may be applied after the output of the thermal feedback from the first thermoelectric couple group is initiated. According to the present invention, an excessive voltage may be applied to the second thermoelectric couple group so that the thermal feedback output from the second thermoelectric couple group is better recognized by the user. In this case, the time point at which the excessive voltage is applied to the second thermoelectric couple group may be adjusted. A relation between the time point at which the excessive voltage is applied to the first thermoelectric couple group and the time point at which the excessive voltage is applied to the second thermoelectric couple group will be described below.

Figure 39:
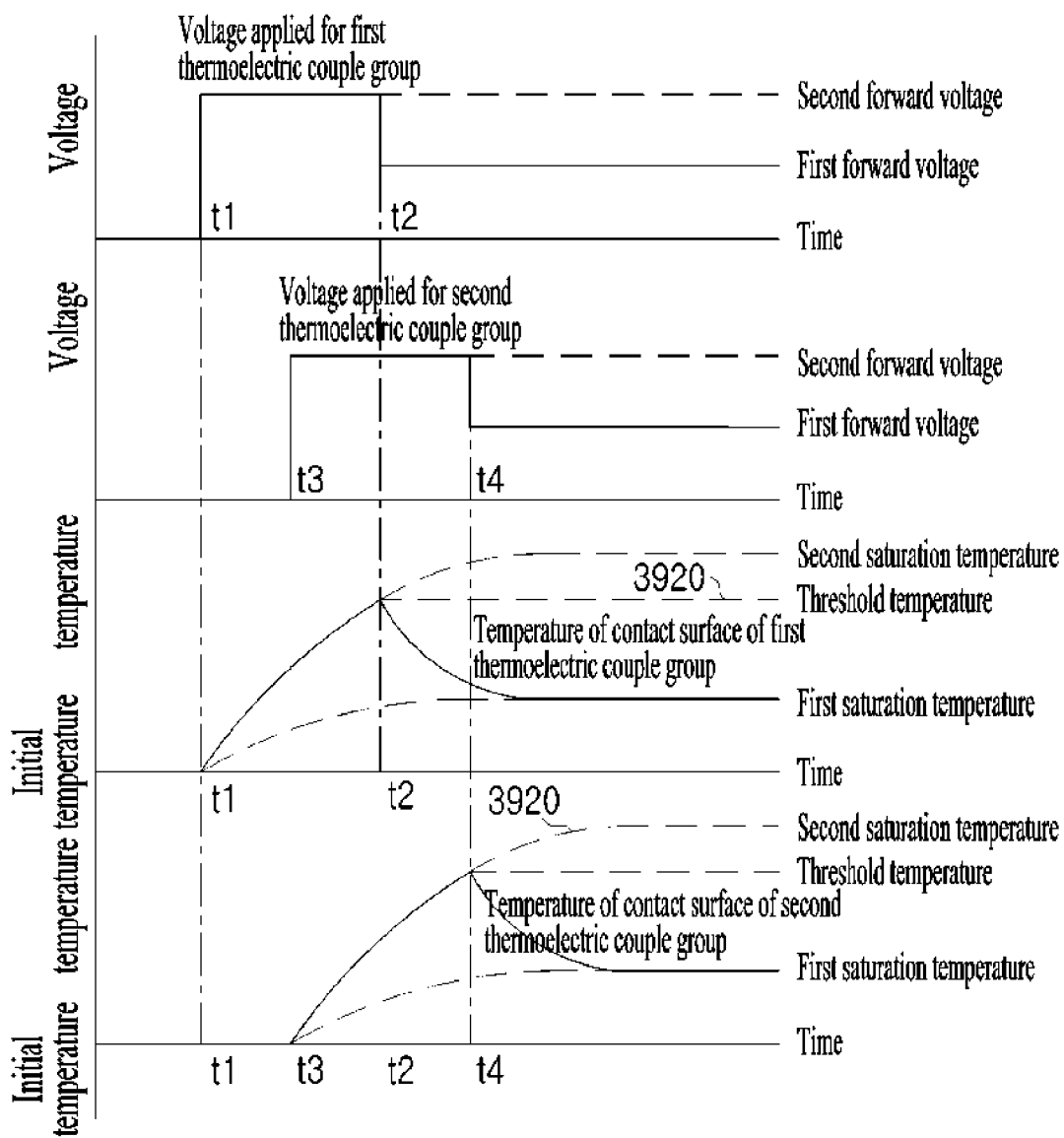
FIGS. 39 to 41 are diagrams showing a change in temperature on a contact surface according to a voltage application time point in the first thermoelectric couple group and the second thermoelectric couple group in the thermal feedback recognition enhancement method according to an embodiment of the present invention.
Figure 40:
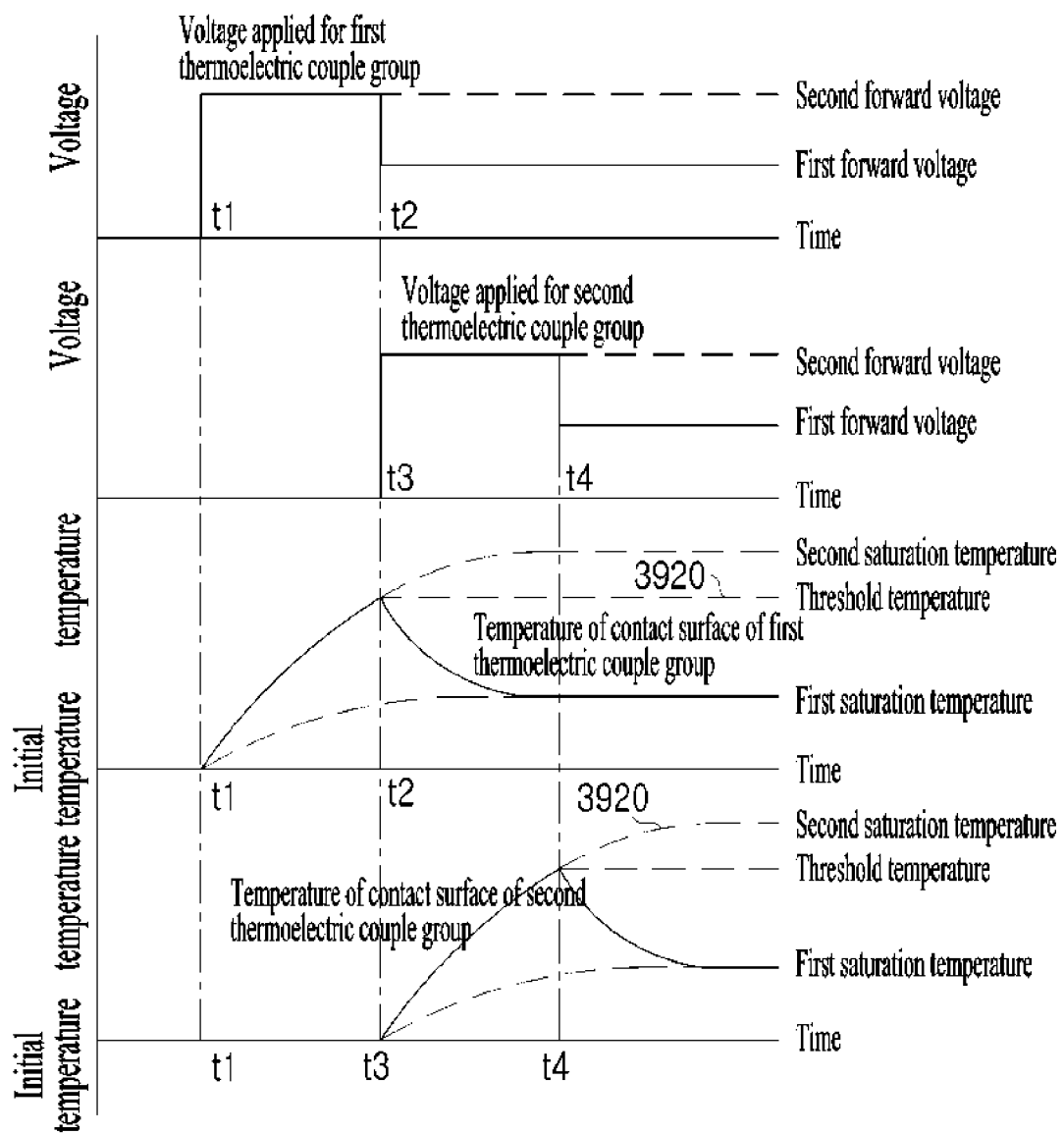
Figure 41:
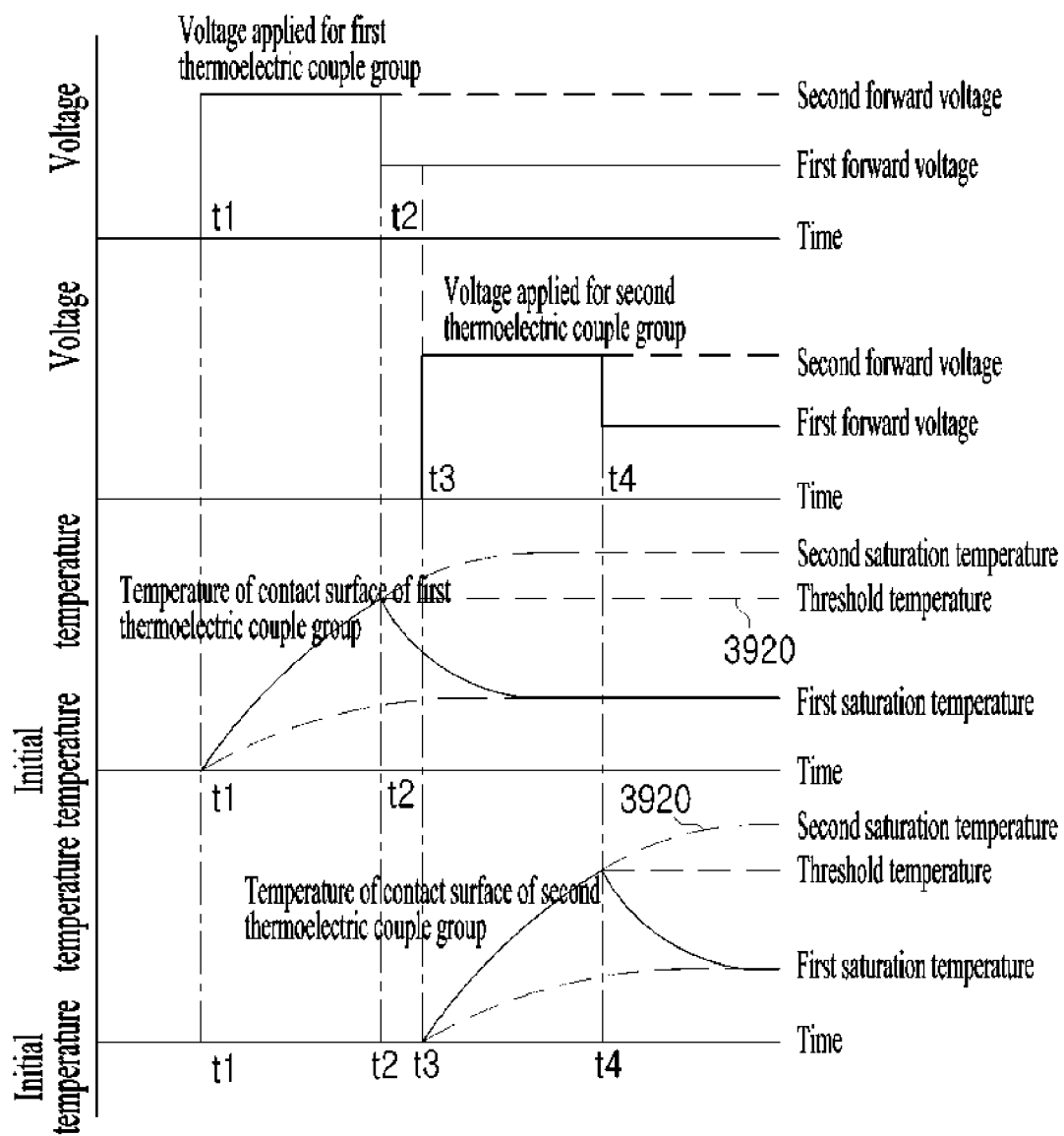

FIGS. 39 to 41 are diagrams showing a change in temperature on a contact surface according to a voltage application time point in the first thermoelectric couple group and the second thermoelectric couple group in the thermal feedback recognition enhancement method according to an embodiment of the present invention.

According to an embodiment of the present invention, the first thermoelectric couple group may output a hot feedback with a first intensity. Also, according to the heat transfer operation, the hot feedback may be output from the second thermoelectric couple group after the output of the hot feedback from the first thermoelectric couple group is initiated.

In detail, the feedback device 1600 may perform the thermal feedback recognition enhancement method on the first thermoelectric couple group. The feedback device 1600 may apply, to the first thermoelectric couple group, a first excessive voltage (a second forward voltage in the examples of FIGS. 39 to 41) higher than a first operating voltage (a first forward voltage in the examples of FIGS. 39 to 41) for outputting the hot feedback with the first intensity between the first time point and the second time point. Thus, the temperature of the contact surface of the first thermoelectric couple group increases along a second reference temperature curve 3920 such that an overshoot interval in which the temperature of the contact surface of the first thermoelectric couple group is higher than the first saturation temperature may occur. Subsequently, a first operating voltage, which is lower than the first excessive voltage, is applied to the first thermoelectric couple group at the second time point such that the temperature of the contact surface of the first thermoelectric couple group may be lowered to the first saturation temperature.

According to the present invention, a time point at which a second excessive voltage is applied to a second thermoelectric couple group (here, the second excessive voltage group refers to an excessive voltage applied to the second thermoelectric couple group) may be adjusted with respect to a second time point, which is a time point at which the first operating voltage, instead of the first excessive voltage, is applied as the voltage applied to the first thermoelectric couple group.

First, referring to FIG. 39, according to an embodiment of the present invention, the second excessive voltage may be applied to the second thermoelectric couple group at a time point prior to the second time point at which the first operating voltage is applied to the first thermoelectric couple group, that is, while the first excessive voltage is applied to the first thermoelectric couple group. In this case, a second forward voltage, which is the second excessive voltage, is applied to the second thermoelectric couple group at a third time point, which is before the second time point, and the second excessive voltage may be applied up to a fourth time point, which is after the second time point. Thus, the temperature of the contact surface of the second thermoelectric couple group may increase along the second reference temperature curve 3920 from the second time point to the fourth time point, and thus an overshoot interval in which the temperature of the contact surface of the second thermoelectric couple group is higher than the first saturation temperature may occur. In summary, since the second time point, which is a time point at which a first driving voltage is applied to the first thermoelectric couple group, is between the third time point and the fourth point, a time during which the first excessive voltage is applied to the first thermoelectric couple group may overlap a time during which the second excessive voltage is applied to the second thermoelectric couple group. That is, while the second excessive voltage is applied to the second thermoelectric couple group, the temperature of the contact surface of the first thermoelectric couple group may increase up to the threshold temperature and then decrease.

Subsequently, a first driving voltage, which is lower than the first excessive voltage, is applied to the second thermoelectric couple group at the fourth time point such that the temperature of the contact surface of the second thermoelectric couple group may be lowered to the first saturation temperature.

Referring to FIG. 40, according to an embodiment of the present invention, the second excessive voltage may be applied to the second thermoelectric couple group at a second time point, which is a time point at which the first operating voltage is applied to the first thermoelectric couple group, that is, as soon as the application of the first excessive voltage to the first thermoelectric couple group ends. In this case, a second forward voltage, which is the second excessive voltage, is applied to the second thermoelectric couple group at a third time point, which is the same as the second time point, and the second excessive voltage may be applied up to a fourth time point, which is after the second time point. Thus, the temperature of the contact surface of the second thermoelectric couple group may increase along the second reference temperature curve 3920 from the second time point to the fourth time point, and thus an overshoot interval in which the temperature of the contact surface of the second thermoelectric couple group is higher than the first saturation temperature may occur. In summary, since the second time point, which is a time point at which the application of the first excessive voltage to the first thermoelectric couple group ends, is the same as the third time point, which is a time point at which the second excessive voltage is applied to the second thermoelectric couple group, the time during which the first excessive voltage is applied to the first thermoelectric couple group may not overlap the time during which the second excessive voltage is applied to the second thermoelectric couple group, and the time during which the first driving voltage is applied to the first thermoelectric couple group may overlap the time during which the second excessive voltage is applied to the second thermoelectric couple group. That is, when the second excessive voltage is applied to the second thermoelectric couple group, the temperature of the contact surface of the first thermoelectric couple group may decrease from the threshold temperature. In other words, when the second excessive voltage is applied to the second thermoelectric couple group, the temperature of the contact surface of the first thermoelectric couple group may change in direction.

Referring to FIG. 41, according to an embodiment of the present invention, the second excessive voltage may be applied to the second thermoelectric couple group after a second time point, which is a time point at which the first driving voltage is applied to the first thermoelectric couple group, elapses, that is, at a predetermined time after the application of the first excessive voltage to the first thermoelectric couple group ends. In this case, a second forward voltage, which is the second excessive voltage, is applied to the second thermoelectric couple group at a third time point, which is after the second time point, and the second excessive voltage may be applied up to a fourth time point, which is after the second time point. Thus, the temperature of the contact surface of the second thermoelectric couple group may increase along the second reference temperature curve 3920 from the second time point to the fourth time point, and thus an overshoot interval in which the temperature of the contact surface of the second thermoelectric couple group is higher than the first saturation temperature may occur. In summary, since the second excessive voltage is applied to the second thermoelectric couple group at a third time point, which is after the second time point, which is a time point at which the application of the first excessive voltage to the first thermoelectric couple group ends, the time during which the first excessive voltage is applied to the first thermoelectric couple group may not overlap the time during which the second excessive voltage is applied to the second thermoelectric couple group, and the time during which the first driving voltage is applied to the first thermoelectric couple group may overlap the time during which the second excessive voltage is applied to the second thermoelectric couple group. That is, when the second excessive voltage is applied to the second thermoelectric couple group, the temperature of the contact surface of the first thermoelectric couple group may decrease from the threshold voltage or reach the first saturation temperature.

According to experimental observations, a phenomenon was observed in which a user better recognizes the thermal feedback output from the second thermoelectric couple group when the third time point follows the second time point, as shown in FIG. 41, than when the third time point at which the second excessive voltage is applied to the second thermoelectric couple group precedes the second time point at which the application of the first excessive voltage to the first thermoelectric couple group ends, as shown in FIG. 39, or than when the third time point is the same as the second time point, as shown in FIG. 40. This may be because when the third time point follows the second time point, a time interval between the time point at which a threshold temperature is output on the contact surface of the first thermoelectric couple group and the time point at which a threshold temperature is output on the contact surface of the second thermoelectric couple group is largest, compared to other cases. However, this may differ depending on the situation in which the thermal feedbacks are output, such as the types and intensities of the thermal feedbacks output from the first thermoelectric couple group and the second thermoelectric couple group.

4. Response Time Reduction Method for Thermal Feedback

A response time reduction method for a thermal feedback according to an embodiment of the present invention will be described below. Here, the response time may refer to a period from a time point at which a voltage for outputting a thermal feedback with a specific intensity is applied to a thermoelectric couple group, that is, a time point at which a thermoelectric operation is initiated to a time point at which the temperature of the contact surface of the thermoelectric couple group reaches a saturation temperature (i.e., a target temperature) corresponding to the thermal feedback with the specific intensity. Also, the response time reduction method for the thermal feedback may be understood as an operation of reducing the response time.

In detail, as show in the example of FIG. 11, when a forward voltage is applied to the thermoelectric couple group, the temperature of the contact surface may rise from an initial temperature up to the saturation temperature. In this case, the temperature of the contact surface may rise from the initial temperature up to the saturation temperature not momentarily or after a predetermined time, that is, the response time. In other words, this may mean that the temperature of the contact surface reaches a specific temperature corresponding to the thermal feedback only at a certain time after the thermoelectric operation is initiated and it takes a certain time for the user to sense a thermal feedback with an intended intensity.

However, in this case, when the response time is reduced, the temperature of the contact surface reaches the specific temperature corresponding to the thermal feedback for a time shorter than the certain time after the thermoelectric operation is initiated by the feedback device 1600 performing the response time reduction method for the thermal feedback. That is, as the response time is reduced, the user may quickly sense the thermal feedback with the intended intensity.

Accordingly, the response time reduction method for the thermal feedback will be described below. Also, for convenience of description, the following description assumes that the response time reduction method is performed by the feedback device 1600. However, the present invention is not limited thereto, and the response time reduction method may be performed by the content reproduction device 1200 and may be performed by a third apparatus other than the feedback device 1600 and the content reproduction device 1200.

Figure 42:
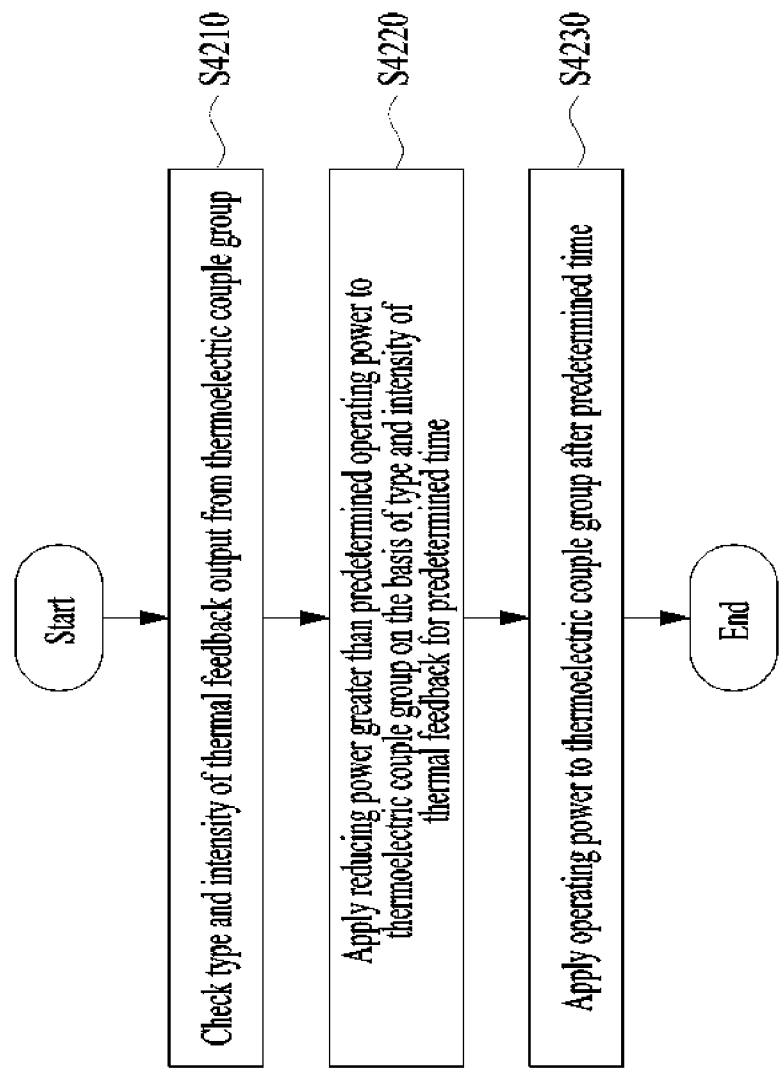
FIG. 42 is a flowchart showing a method of reducing a response time of a thermal feedback according to an embodiment of the present invention.

FIG. 42 is a flowchart showing a method of reducing a response time of a thermal feedback according to an embodiment of the present invention.

In FIG. 42, the response time reduction method may include checking the type and intensity of a thermal feedback output from a thermoelectric couple group (S4210), applying, to the thermoelectric couple group, reduction power greater than operating power predetermined by the type and intensity of the thermal feedback during a predetermined time (S4220), and applying the operating power to the thermoelectric couple group after the predetermined time elapses (S4230).

In detail, the feedback device 1600 may check the type and intensity of the thermal feedback output from the thermoelectric couple group (S4210). As an example, the type of the thermal feedback may be any one of a hot feedback, a cold feedback, and a thermal grill feedback. Also, the type (forward voltage/reverse voltage) and magnitude of a voltage applied to the thermoelectric couple group may be predetermined according to the type and intensity of the thermal feedback.

That is, the operating power applied to the thermoelectric couple group in order to output the thermal feedback (hereinafter, the voltage and current of the operating power are referred to as an "operating voltage" and an "operating current") may be predetermined according to the type and intensity of the thermal feedback.

According to an embodiment of the present invention, the feedback device 1600 may acquire thermal feedback data from the content reproduction device 1200. The thermal feedback data may include information regarding the types and intensities of thermal feedbacks output from thermoelectric couple groups and the output start times and/or end times of the thermal feedbacks. The feedback device 1600 may check the type and intensity of the thermal feedback output from the thermoelectric couple group on the basis of the thermal feedback data.

Also, the feedback device 1600 may apply, to the thermoelectric couple group, reduction power greater than the operating power predetermined on the basis of the type and intensity of the thermal feedback during the predetermined time. Here, the reduction power may refer to power applied to reduce the response time (hereinafter, the voltage and current of the reduction power are referred to as a "reduction voltage" and a "reduction current"). In this case, the reduction power may be in the same direction as the operating power. That is, the reduction power may be a forward voltage when the operating power is a forward voltage, and the reduction power may be a reverse voltage when the operating power is a reverse voltage.

As described above, when a thermal feedback with a specific intensity is output to a thermoelectric couple group, the temperature of the contact surface of the thermoelectric couple group may reach a saturation temperature corresponding to the thermal feedback with the specific intensity from an initial temperature after the response time. However, a time during which the user senses the thermal feedback may be delayed due to the response time. Accordingly, in order to reduce the response time, the feedback device 1600 may apply a reduction voltage greater than the operating voltage corresponding to the thermal feedback with the specific intensity during a predetermined time. Thus, it is possible to reduce the response time.

Also, the feedback device 1600 may apply the operating voltage to the thermoelectric couple group after the predetermined time elapses (S4230). However, the magnitude of the reduction voltage applied to the thermoelectric couple group to reduce the response time, the application time (i.e., the predetermined time) of the reduction voltage, and the like may differ depending on various situations, for example, the type and intensity of the thermal feedback output from the thermoelectric couple group.

Implementations of the response time reduction method for the thermal feedback in the various situations will be described below. Also, for convenience of description, the following description focuses on a case in which a hot feedback is to be output from the thermoelectric couple group. However, the present invention is not limited thereto, and it will be appreciated that the following description may be even applied to cases in which a cold feedback or a thermal grill feedback is to be output from the thermoelectric couple group.

4.1. Implementation of Response Time Reduction Method for Thermal Feedback

Figure 43:
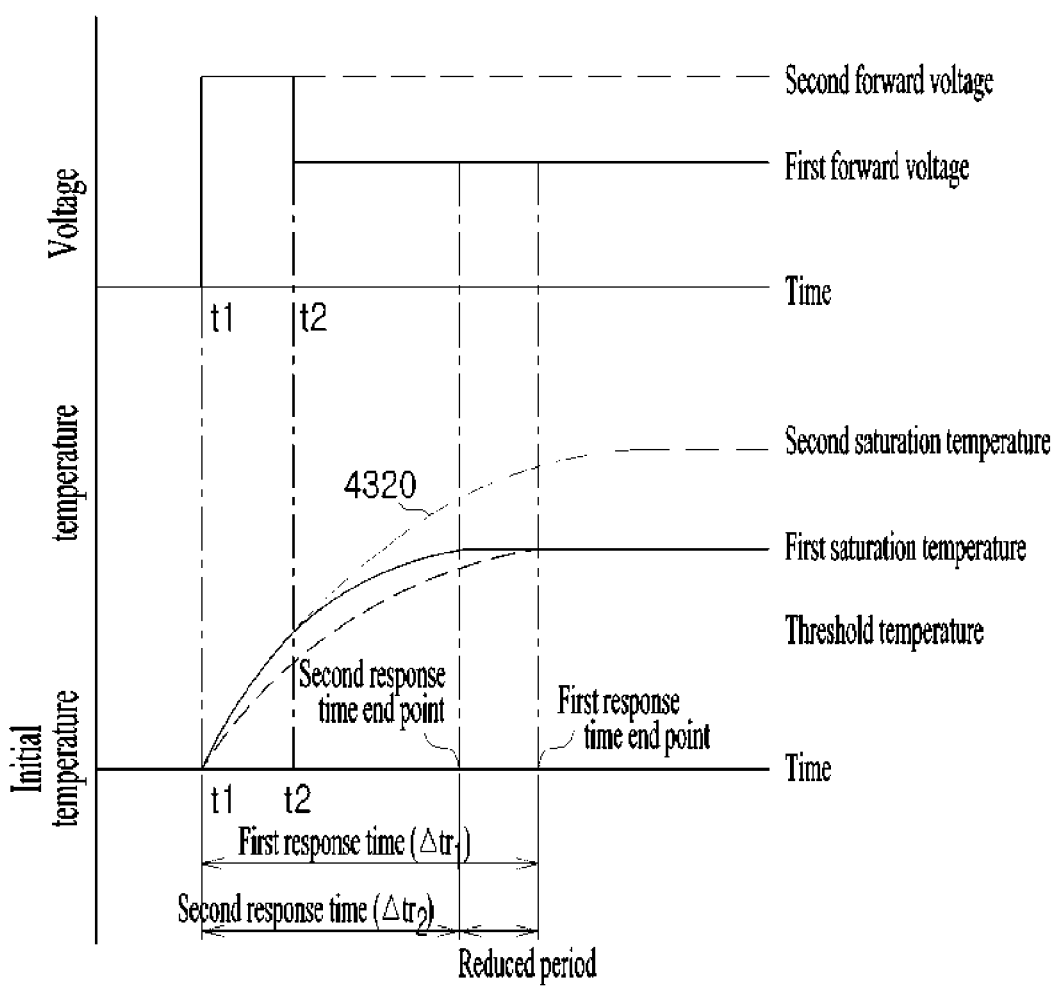
FIG. 43 is a diagram showing a change in temperature on a contact surface and a change in applied voltage according to the method of reducing a response time of a thermal feedback when a hot feedback is output from a thermoelectric couple group according to an embodiment of the present invention.

FIG. 43 is a diagram showing a change in temperature on a contact surface and a change in applied voltage according to the method of reducing a response time of a thermal feedback when a hot feedback is output from a thermoelectric couple group according to an embodiment of the present invention.

Referring to FIG. 43, the thermoelectric couple group may output a hot feedback with a first intensity. To this end, the feedback device 1600 may apply, to the thermoelectric couple group, an operating voltage (a first forward voltage in the example of FIG. 43) for outputting the hot feedback with the first intensity. As the operating voltage is applied to the thermoelectric couple group, the temperature of the contact surface of the thermoelectric couple group may reach the first saturation temperature at a first response time end point. Thus, the period from the first time point to the first response time end point may be a response time of the thermal feedback applied to the thermoelectric couple group (hereinafter referred to as a first response time).

According to an embodiment of the present invention, the feedback device 1600 may perform the thermal feedback response time reduction method in order to reduce a response rate. In detail, the feedback device 1600 may apply a reduction voltage (a second forward voltage in the example of FIG. 43) higher than the operating voltage between the first time point and a second time point, which corresponds to a predetermined time interval. As the reduction voltage is applied to the thermoelectric couple group, the temperature of the contact surface of the thermoelectric couple group may rise along a second reference temperature curve 4320. That is, between the first time point and the second time point, a temperature rise rate of the contact surface when the reduction voltage is applied to the thermoelectric couple group may be faster than a temperature rise rate of the contact surface when the operating voltage is applied to the thermoelectric couple group. At the second time point, the feedback device 1600 may stop the application of the reduction voltage and apply the operating voltage to the thermoelectric couple group. Accordingly, a temperature rise rate of the contact surface of the thermoelectric couple group after the second time point may become slower than a temperature rise rate of the contact surface of the thermoelectric couple group from the first time point to the second time point such that the temperature of the contact surface may reach the first saturation temperature at a second response time end point. In this case, the second response time end point may precede the first response time end point. This is because the second forward voltage higher than the first forward voltage is applied to the thermoelectric couple group from the first time point to the second time point. Accordingly, the period from the first time point to the second response time end point may be a response time (hereinafter referred to as the second response time), and the second response time may be more reduced than the first response time. Thus, the user may sense the hot feedback as quickly as a reduction time, which is a difference between the first response time and the second response time. Also, when the temperature of the contact surface of the thermoelectric couple group reaches the target temperature not gradually but quickly, the user's cognition of the thermal feedback may be enhanced in terms of the user's senses. Thus, by the response time being reduced due to the application of the second forward voltage, the user may more clearly recognize the thermal feedback.

According to an embodiment of the present invention, the magnitude of the reduction voltage (a second forward voltage in the example of FIG. 43) applied to reduce the response time may be predetermined. For example, as shown in the example of FIG. 43, the reduction voltage may be a voltage that is one step higher than the operating voltage (a first forward voltage in the example of FIG. 43) indicating a voltage with an intended intensity, that is, a voltage of the target intensity, and may be a voltage that is multiple-steps higher than the operating voltage. Also, the reduction voltage may be predetermined irrespective of the intensity of the thermal feedback. For example, the reduction voltage may be higher than the operating voltage by a predetermined value. Also, the ratio of the operating voltage to the reduction voltage may be predetermined.

In addition, since the reduction voltage is predetermined, a temperature (a second saturation temperature in the example of FIG. 43) corresponding to the reduction voltage may also be predetermined.

Likewise, the temperature corresponding to the reduction voltage may be a temperature that is determined to output a thermal feedback with a predetermined intensity and may be a temperature that is not related to the thermal feedback with the predetermined intensity. Also, the temperature corresponding to the reduction voltage may be higher than the saturation temperature corresponding to the operating voltage by a predetermined value, and the ratio of the temperature corresponding to the reduction voltage to the saturation temperature corresponding to the operating voltage may be predetermined.

Also, according to an embodiment of the present invention, the feedback device 1600 may determine the magnitude of the reduction voltage so that the temperature of the contact surface does not exceed a saturation temperature corresponding to the operating voltage. This is because when the temperature of the contact surface exceeds the saturation temperature corresponding to the operating voltage, the user may misunderstand that a thermal feedback with other intensity is output. According to an embodiment, the feedback device 1600 may determine the magnitude of the reduction voltage so that the temperature of the contact surface does not reach the saturation temperature corresponding to the operating voltage while the reduction voltage is applied. When the temperature of the contact surface does not reach the saturation temperature corresponding to the operating voltage while the reduction voltage is applied, the temperature of the contact surface does not exceed the saturation temperature after the application of the reduction voltage ends and then the operating voltage is applied.

Also, according to an embodiment of the present invention, a time point at which the application of the reduction voltage is stopped, that is, a time point at which the operating voltage is applied, may be predetermined. According to an embodiment of the present invention, the time point at which the application of the reduction voltage is stopped may be determined depending on a threshold temperature indicating the temperature of the contact surface at the second time point. That is, the time point at which the application of the reduction voltage is stopped affects the threshold temperature, and thus the time point at which the application of the reduction voltage is stopped may be predetermined in consideration of a relation between the threshold temperature and the time point at which the application of the reduction voltage is stopped. For example, the feedback device 1600 may stop applying the reduction voltage when the temperature of the contact surface 1641 reaches a predetermined threshold temperature.

Also, as another example, the feedback device 1600 may determine the time point at which application of the reduction voltage is stopped, that is, a reduction voltage application time so that the temperature of the contact surface does not reach the saturation temperature corresponding to the operating voltage while the reduction voltage is applied. As described above, when the temperature of the contact surface does not reach the saturation temperature corresponding to the operating voltage while the reduction voltage is applied, the temperature of the contact surface does not exceed the saturation temperature after the application of the reduction voltage ends and then the operating voltage is applied.

However, according to an embodiment, the reduction voltage and the time point at which the application of the reduction voltage is stopped may be determined so that the threshold temperature is lower than the saturation temperature corresponding to the operating voltage.

Also, according to another embodiment of the present invention, the time point at which the application of the reduction voltage is stopped may be determined on the basis of the target intensity. For example, the time point at which the application of the reduction voltage is stopped may be t seconds when the target intensity is the first intensity and may be t+a seconds (or t−a seconds) when the target intensity is the second intensity.

Also, according to an embodiment of the present invention, whether to apply the voltage to the thermoelectric couple group for response time reduction may be determined depending on the intensity of the thermal feedback, that is, the magnitude of the operating voltage. For example, when the intensity of the thermal feedback is lower than a predetermined intensity, the temperature of the contact surface may quickly reach the saturation temperature although the reduction voltage is not applied. In this case, the effect of reducing the response time according to the application of the reduction voltage is small. Thus, when the intensity of the thermal feedback is lower than the predetermined intensity, the feedback device 1600 may not apply the reduction voltage. Likewise, when the intensity of the thermal feedback is higher than the predetermined intensity, the feedback device 1600 may apply the reduction voltage to the thermoelectric couple group in order to reduce the response time because the effect of reducing the response time according to the application of the reduction voltage is large.

Figure 44:
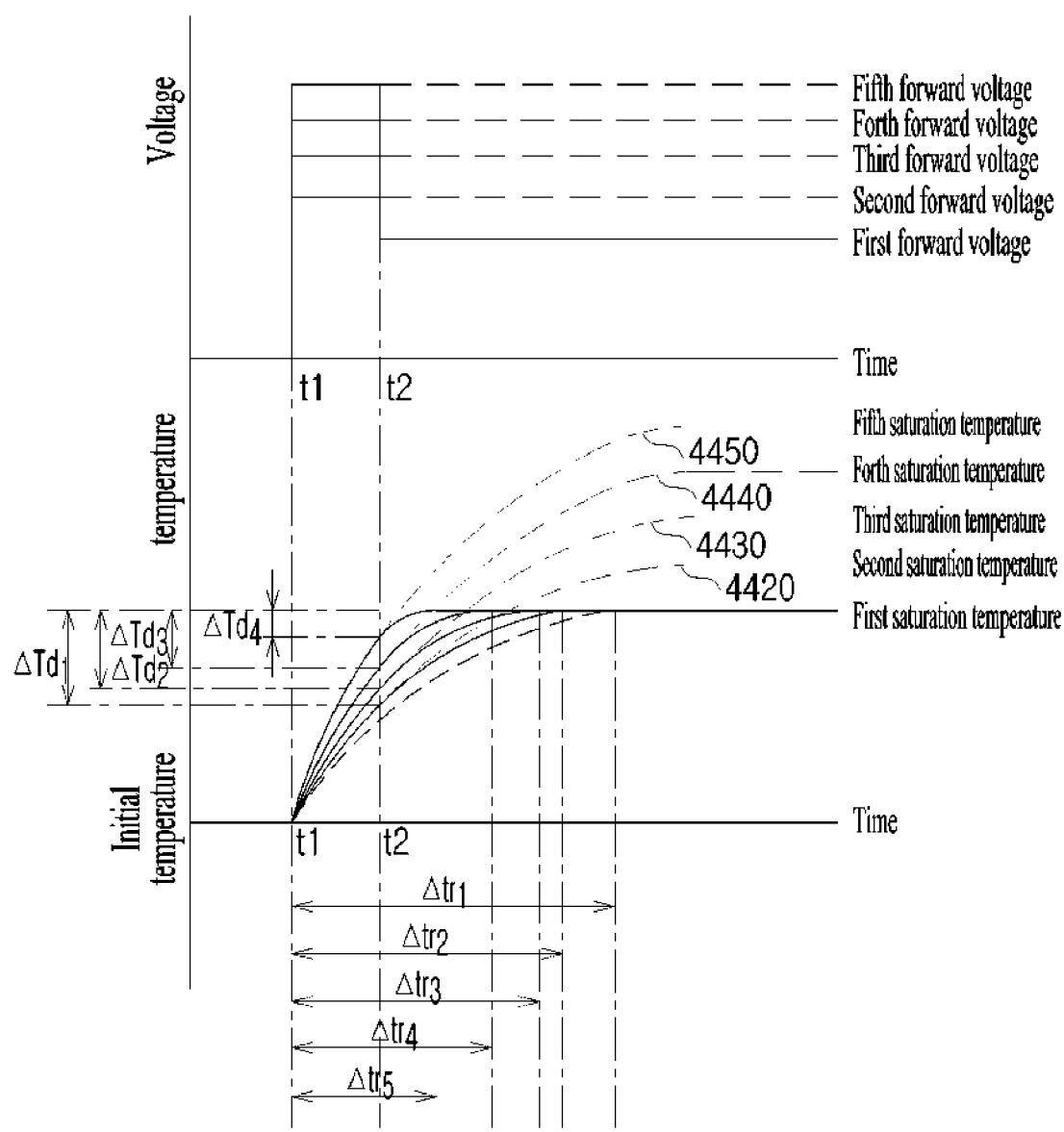
FIG. 44 is a diagram showing a change in temperature on a contact surface and a change in applied voltage according to the method of reducing a response time of a thermal feedback when a hot feedback is output from a thermoelectric couple group according to another embodiment of the present invention.

FIG. 44 is a diagram showing a change in temperature on a contact surface and a change in applied voltage according to the method of reducing a response time of a thermal feedback when a hot feedback is output from a thermoelectric couple group according to another embodiment of the present invention.

Referring to FIG. 44, the feedback device 1600 may apply, to a thermoelectric couple group, an operating voltage (a first forward voltage in the example of FIG. 44) for outputting a hot feedback with a first intensity, and the temperature of the contact surface of the thermoelectric couple group may reach a first saturation temperature at a first response time end point. Thus, the period from the first time point to the first response time end point may be a response time of the thermal feedback applied to the thermoelectric couple group (hereinafter referred to as a first response time Δtr1).

Also, according to an embodiment of the present invention, the feedback device 1600 may apply a first reduction voltage (a second forward voltage in the example of FIG. 44) higher than a first operating voltage between a first time point and a second time point, and the temperature of the contact surface of the thermoelectric couple group may rise along a second reference temperature curve 4420 to reach the first saturation temperature at a second response time end point preceding the first response time end point. The period from the first time point to the second response time end point may be a response time of the thermal feedback applied to the thermoelectric couple group (hereinafter referred to as a second response time Δtr2), and the second response time may be reduced by a first reduction time in comparison with the first response time Δtr1.

Also, according to another embodiment of the present invention, the feedback device 1600 may apply a second reduction voltage (a third forward voltage in the example of FIG. 44) higher than the first reduction voltage between the first time point and the second time point, and the temperature of the contact surface of the thermoelectric couple group may rise along a third reference temperature curve 4430 to reach the first saturation temperature at a third response time end point preceding the second response time end point. The period from the first time point to the third response time end point may be a response time of the thermal feedback applied to the thermoelectric couple group (hereinafter referred to as a third response time Δtr3), and the third response time may be reduced by a second reduction time in comparison with the first response time. Also, the third response time may be more reduced than the second response time.

Likewise, even when a fourth forward voltage or a fifth forward voltage, which is higher than the first forward voltage, is applied between the first time point and the second time point, the response time may be reduced.

According to an embodiment of the present invention, the difference between the first saturation temperature and the temperature at the time point at which the application of the reduction voltage ends may be within a predetermined range. As an example, the difference between the first saturation temperature and the temperature at the second time point, which is a time point at which the application of the reduction voltage ends, may differ depending on the magnitude of the reduction voltage. For example, a first temperature difference $\Delta Td1$ may occur when the second forward voltage is applied as the reduction voltage between the first time point and the second time point, and a fourth temperature difference $\Delta Td4$ may occur when the fifth forward voltage is applied as the reduction voltage. In this case, the first temperature difference may be greater than the fourth temperature difference. This is because as the magnitude of the reduction voltage increases, the temperature rise rate increases and thus the difference between the first saturation temperature and the temperature at the second time point decreases.

According to a specific embodiment of the present invention, the temperature at the second time point may be predetermined as a specific ratio with respect to the first saturation temperature. For example, the temperature at the second time point when the reduction voltage is a fifth forward voltage may be 95% of the first saturation temperature, the temperature at the second time point when the reduction voltage is a fourth forward voltage may be 90% of the first saturation temperature, the temperature at the second time point when the reduction voltage is a third forward voltage may be 85% of the first saturation temperature, and the temperature at the second time point when the reduction voltage is a second forward voltage may be 80% of the first saturation temperature. In an experiment example, when an ambient temperature was room temperature and the temperature at the second time point when the reduction voltage was applied was 70% or more of the first saturation temperature, the user's cognition of the thermal feedback was enhanced. This may be because the response time is reduced as the temperature at the second time point approaches the first saturation temperature. That is, as the temperature at the second time point approaches the first saturation temperature, a temperature variation experienced by the user increases. Thus, the user's cognition of the thermal feedback may be enhanced. According to the above experiment example, in order to enhance the user's cognition, the magnitude of the reduction voltage may be set to a voltage at which the temperature at the second time point becomes 70% or more and less than 100% of the first saturation temperature.

Also, according to another specific embodiment of the present invention, a ratio of a first application time during which the reduction voltage is applied to a second application time during which a voltage (a first forward voltage in the example of FIG. 44) other than the reduction voltage is applied until the temperature of the contact surface reaches the first saturation temperature may be predetermined. For example, the ratio of the first application time to the second application time may be set to 1:X (here, X is less than or equal to 1). It will be appreciated that, according to another embodiment, the ratio of the first application time to the second application time may be set to 1:Y (here, Y is greater than 1). In an experiment example, when an ambient temperature was room temperature and the ratio of the first application time to the second application time was set to 1:Z (here, Z was greater than or equal to 0.05 and less than or equal to 0.95), the user's cognition of the thermal feedback was enhanced. Thus, according to an embodiment, in order to enhance the user's cognition, the ratio of the first application time to the second application time may be set to 1:Z (here, Z is greater than or equal to 0.1 and less than or equal to 0.9).

Also, according to an embodiment of the present invention, the ratio of the reduction voltage (the second to fifth forward voltages) to the first forward voltage may be predetermined. For example, the second forward voltage may be less than two times the first forward voltage.

Also, according to an embodiment of the present invention, the temperature at the second time point corresponding to each of a plurality of reduction voltages may be prestored. In this case, the feedback device 1600 may set the magnitude of the reduction voltage so that the temperature at the second time point reaches a specific temperature with reference to the prestored information.

In summary, as the magnitude of the voltage applied between the first time point and the second time point, that is, the reduction voltage for reducing the response time, increases, the response time of the thermal feedback may be reduced. Thus, the user may sense the thermal feedback at an earlier time.

However, when the magnitude of the reduction voltage increases over a predetermined critical voltage, the temperature of the contact surface of the thermoelectric couple group may be higher than a first saturation temperature. According to an embodiment of the present invention, the feedback device 1600 may adjust the magnitude of the reduction voltage so that the temperature of the contact surface of the thermoelectric couple group does not exceed the first saturation temperature.

Figure 45:
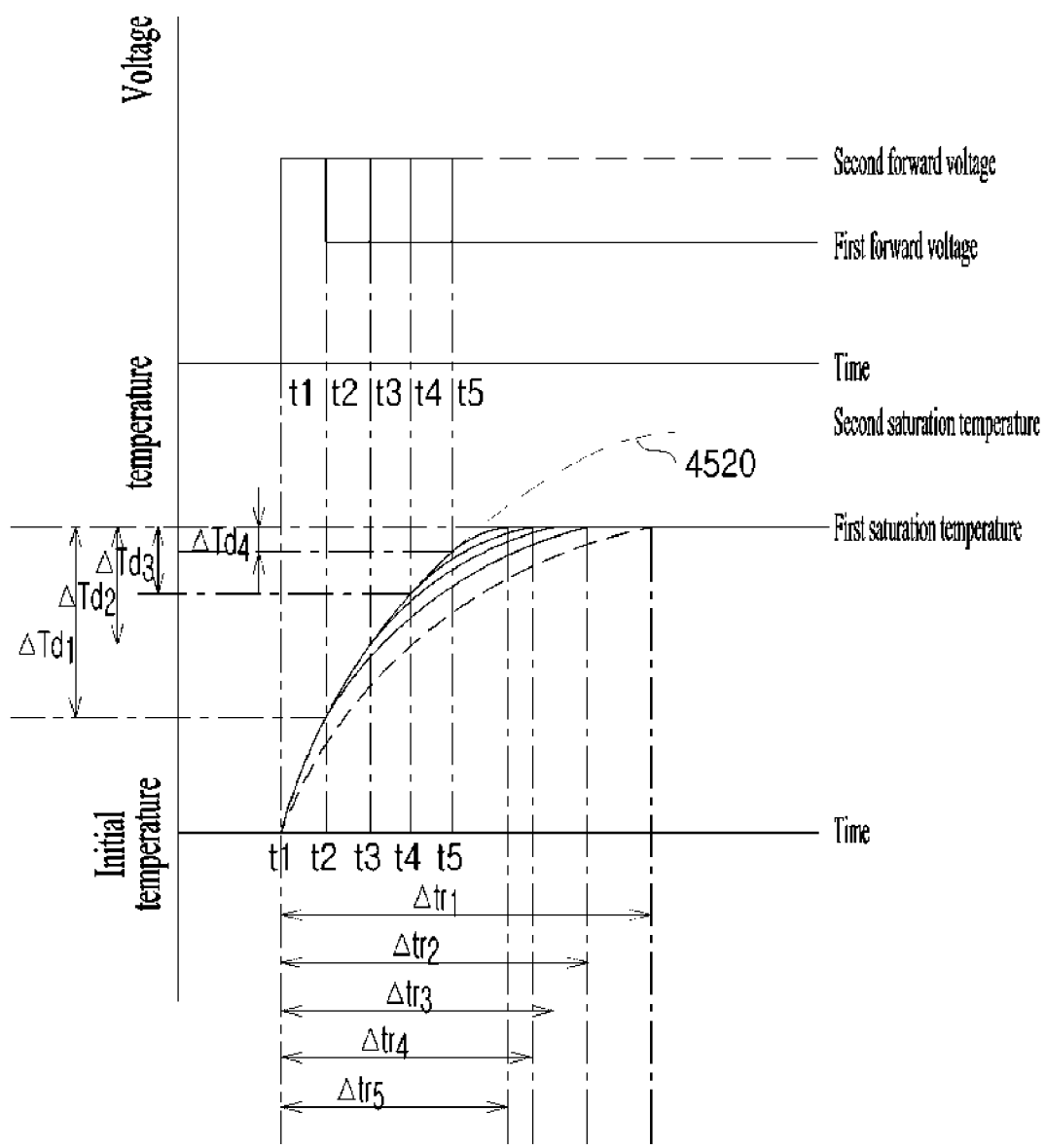
FIG. 45 is a diagram showing a change in temperature on a contact surface and a change in applied voltage according to the method of reducing a response time of a thermal feedback when a hot feedback is output from a thermoelectric couple group according to still another embodiment of the present invention.

FIG. 45 is a diagram showing a change in temperature on a contact surface and a change in applied voltage according to the method of reducing a response time of a thermal feedback when a hot feedback is output from a thermoelectric couple group according to still another embodiment of the present invention.

Referring to FIG. 45, the feedback device 1600 may apply, to a thermoelectric couple group, an operating voltage (a first forward voltage in the example of FIG. 45) for outputting a hot feedback with a first intensity, and the temperature of the contact surface of the thermoelectric couple group may reach a first saturation temperature at a first response time end point. Thus, the period from the first time point to the first response time end point may be a response time of the thermal feedback applied to the thermoelectric couple group (hereinafter referred to as a first response time).

Also, according to an embodiment of the present invention, the feedback device 1600 may apply a reduction voltage (a second forward voltage in the example of FIG. 45) higher than the operating voltage between the first time point and a second time point, and the temperature of the contact surface of the thermoelectric couple group may rise along a second reference temperature curve 4520 to reach the first saturation temperature at a second response time end point preceding the first response time end point. The period from the first time point to the second response time end point may be a response time of the thermal feedback applied to the thermoelectric couple group (hereinafter referred to as a second response time $\Delta tr2$), and the second response time may be reduced by a first reduction time in comparison with the first response time $\Delta tr1$.

Also, according to an embodiment of the present invention, the feedback device 1600 may apply the reduction voltage from the first time point and may apply the reduction voltage up to a third time point which is after the second time point. In this case, the temperature of the contact surface may rise up to the third time point along the second reference temperature curve 4520 to reach the first saturation temperature at a third response time end point preceding the second response time end point. The period from the first time point to the third response time end point may be a response time of the thermal feedback applied to the thermoelectric couple group (hereinafter referred to as a third response time $\Delta tr3$), and the third response time may be reduced by a second reduction time in comparison with the first response time. Also, the third response time $\Delta tr3$ may be more reduced than the second response time.

Likewise, even when the reduction voltage is applied even to the fourth time point or the fifth time point, which is after the third time point, the response time may be reduced.

According to an embodiment of the present invention, the difference between the first saturation temperature and the temperature at the time point at which the application of the reduction voltage ends may be within a predetermined range. As an example, the difference between the first saturation temperature and the temperature at the time point at which the application of the reduction voltage ends may differ depending on the time during which the reduction voltage is applied. For example, when the reduction voltage is applied from a first time point to a second time point, a first temperature difference $\Delta Td1$ may occur between the first saturation temperature and the temperature at the second time point, and when the reduction voltage is applied from a first time point to a fifth time point, a fourth temperature difference $\Delta Td4$ may occur between the first saturation temperature and the temperature at the fifth time point. In this case, the first temperature difference may be greater than the fourth temperature difference. This is because a temperature rise rate when the reduction voltage is applied is faster than a temperature rise rate when a non-reduction voltage, that is, the first forward voltage, is applied.

According to a specific embodiment of the present invention, the temperature at the time point at which the application of the reduction voltage ends may be predetermined as a specific ratio with respect to the first saturation temperature. For example, the temperature at a fifth time point when the reduction voltage is applied up to the fifth time point may be 95% of the first saturation temperature, the temperature at a fourth time point when the reduction voltage is applied up to the fourth time point may be 90% of the first saturation temperature, the temperature at a third time point when the reduction voltage is applied up to the third forward voltage may be 85% of the first saturation temperature, and the temperature at a second time point when the reduction voltage is applied up to the second forward voltage may be 80% of the first saturation temperature. In an experiment example, when an ambient temperature was room temperature and the temperature at the time point at which application of the reduction voltage ended was 70% or more of the first saturation temperature, the user's cognition of the thermal feedback was enhanced.

This may be because the response time is reduced as the temperature at the time point at which the application of the reduction voltage ends approaches the first saturation temperature. That is, as the temperature at the time point at which the application of the reduction voltage ends approaches the first saturation temperature, a temperature variation experienced by the user increases. Thus, the user's cognition of the thermal feedback may be enhanced. According to the above experiment example, in order to enhance the user's cognition, the time during which the reduction voltage is applied may be set to the time it takes for the temperature to reach 70% or more and less than 100% of the first saturation temperature.

Also, according to another specific embodiment of the present invention, a ratio of a first application time, during which the reduction voltage is applied to a second application time during which a voltage (a first forward voltage in the example of FIG. 45) other than the reduction voltage is applied until the temperature of the contact surface reaches the first saturation temperature, may be predetermined. For example, the ratio of the first application time to the second application time may be set to 1:X (here, X is less than or equal to 1). It will be appreciated that, according to another embodiment, the ratio of the first application time to the second application time may be set to 1:Y (here, Y is greater than 1). In an experiment example, when an ambient temperature was room temperature and the ratio of the first application time to the second application time was set to 1:Z (here, Z was greater than or equal to 0.05 and less than or equal to 0.9), the user's cognition of the thermal feedback was enhanced. Thus, according to an embodiment, in order to enhance the user's cognition, the ratio of the first application time to the second application time may be set to 1:Z (here, Z is greater than or equal to 0.05 and less than or equal to 0.95).

Also, according to an embodiment of the present invention, the temperature according to the time during which each of a plurality of reduction voltages is applied may be prestored. In this case, the feedback device 1600 may set the application time of the reduction voltage on the basis of the prestored information so that the reduction voltage is applied until the temperature of the contact surface reaches a specific temperature.

Also, according to another embodiment of the present invention, the feedback device 1600 may include a temperature sensor capable of sensing the temperature of the contact surface. In this case, after the reduction voltage is applied, the feedback device 1600 may measure the temperature of the contact surface using the temperature sensor. When the temperature of the contact surface reaches a specific temperature (e.g., 70% of the first saturation temperature), the feedback device 1600 may stop the application of the reduction voltage.

In summary, as the time during which the reduction voltage is applied increases, the response time of the thermal feedback may be reduced. Thus, the user may sense the thermal feedback at an earlier time.

However, when the time during which the reduction voltage is applied exceeds a predetermined critical time, the temperature of the contact surface of the thermoelectric couple group may increase over the first saturation temperature. According to an embodiment of the present invention, the feedback device 1600 may adjust the time during which the reduction voltage is applied so that the temperature of the contact surface of the thermoelectric couple group does not exceed the first saturation temperature.

Figure 46:
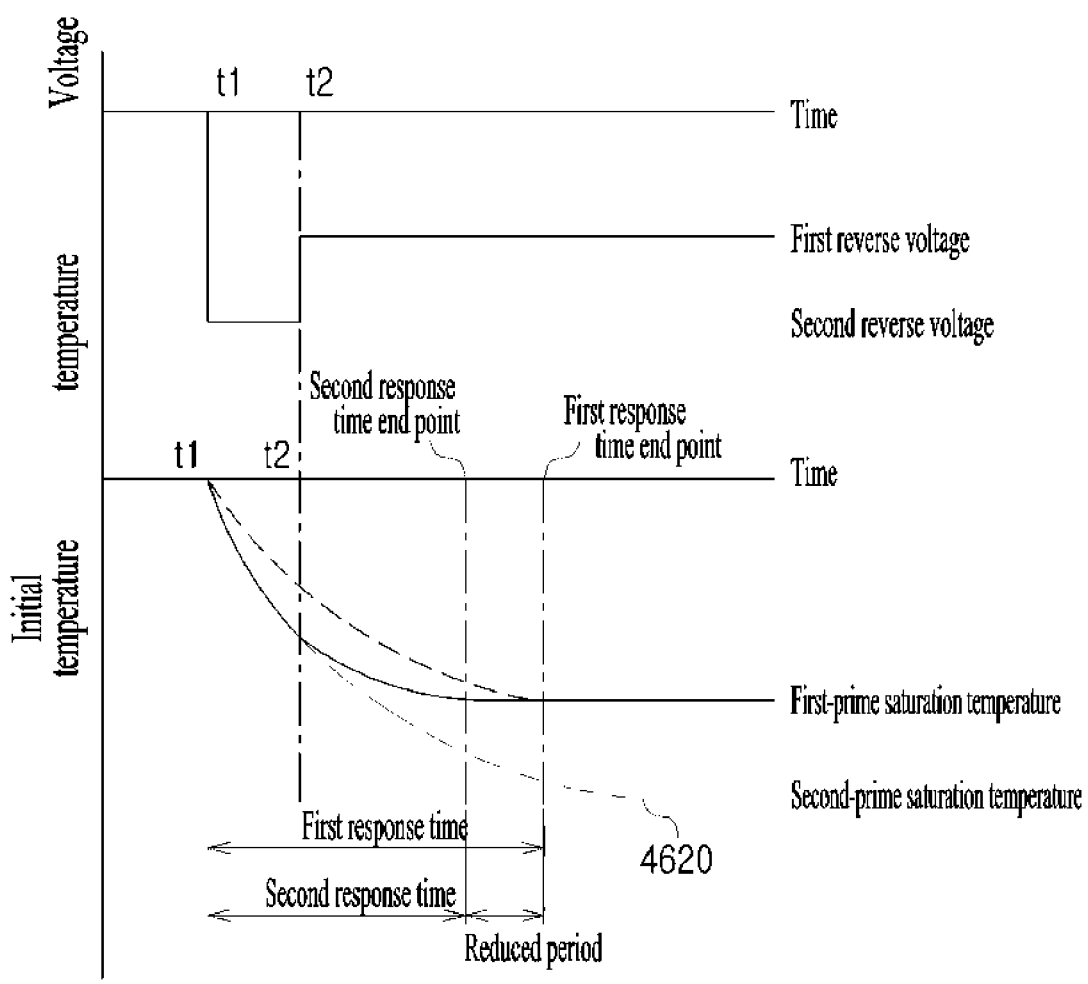
FIG. 46 is a diagram showing a change in temperature on a contact surface and a change in applied voltage according to the method of reducing a response time of a thermal feedback when a cold feedback is output from a thermoelectric couple group according to an embodiment of the present invention.

FIG. 46 is a diagram showing a change in temperature on a contact surface and a change in applied voltage according to the method of reducing a response time of a thermal feedback when a cold feedback is output from a thermoelectric couple group according to an embodiment of the present invention.

Referring to FIG. 46, a cold feedback with a first intensity may be output from the thermoelectric couple group. To this end, the feedback device 1600 may apply, to a thermoelectric couple group, an operating voltage (a first reverse voltage in the example of FIG. 46) for outputting a cold feedback with a first intensity, and the temperature of the contact surface of the thermoelectric couple group may reach a first-prime saturation temperature at a first response time end point. In this case, the period from the first time point to the first response time end point may be a response time of the thermal feedback applied to the thermoelectric couple group (hereinafter referred to as a first response time).

As is the case in which a hot feedback is output from a thermoelectric couple group, the feedback device 1600 may apply a reduction voltage (a second reverse voltage in the example of FIG. 46) higher than the operating voltage between the first time point and a second time point, which corresponds to a predetermined time interval, by using the thermal feedback response time reduction method. As the reduction voltage is applied to the thermoelectric couple group, the temperature of the contact surface of the thermoelectric couple group may drop along a second reference temperature curve 4620 at a rate faster than a temperature drop rate of the contact surface when the first reverse voltage is applied to the thermoelectric couple group. At the second time point, the feedback device 1600 may stop the application of the reduction voltage and apply the operating voltage to the thermoelectric couple group. Accordingly, a temperature drop rate of the contact surface of the thermoelectric couple group after the second time point may become slower than a temperature drop rate of the contact surface of the thermoelectric couple group from the first time point to the second time point such that the temperature of the contact surface may reach the first-prime saturation temperature at a second response time end point.

As is the case in which a hot feedback is output from a thermoelectric couple group, the second response time end point may precede the first response time end point. Accordingly, the period from the first time point to the second response time end point may be a response time (hereinafter referred to as a second response time), and the second response time may be more reduced than the first response time. Thus, the user may sense the cold feedback as quickly as a reduction time, which is a difference between the first response time and the second response time.

According to an embodiment of the present invention, the magnitude of the reduction voltage applied for the response time reduction may be predetermined, and also the temperature corresponding to the reduction voltage may be predetermined. Also, a time point at which the application of the reduction voltage is stopped, that is, a time point at which the operating voltage, which is a voltage with an intended intensity, is applied may be predetermined.

Also, according to an embodiment of the present invention, a voltage higher than the reduction voltage may be applied at the first time point in order to reduce the response time. The description with reference to FIGS. 43 to 45 may be applied to various implementations as it is, and thus a detailed description thereof will be omitted.

Figure 47:
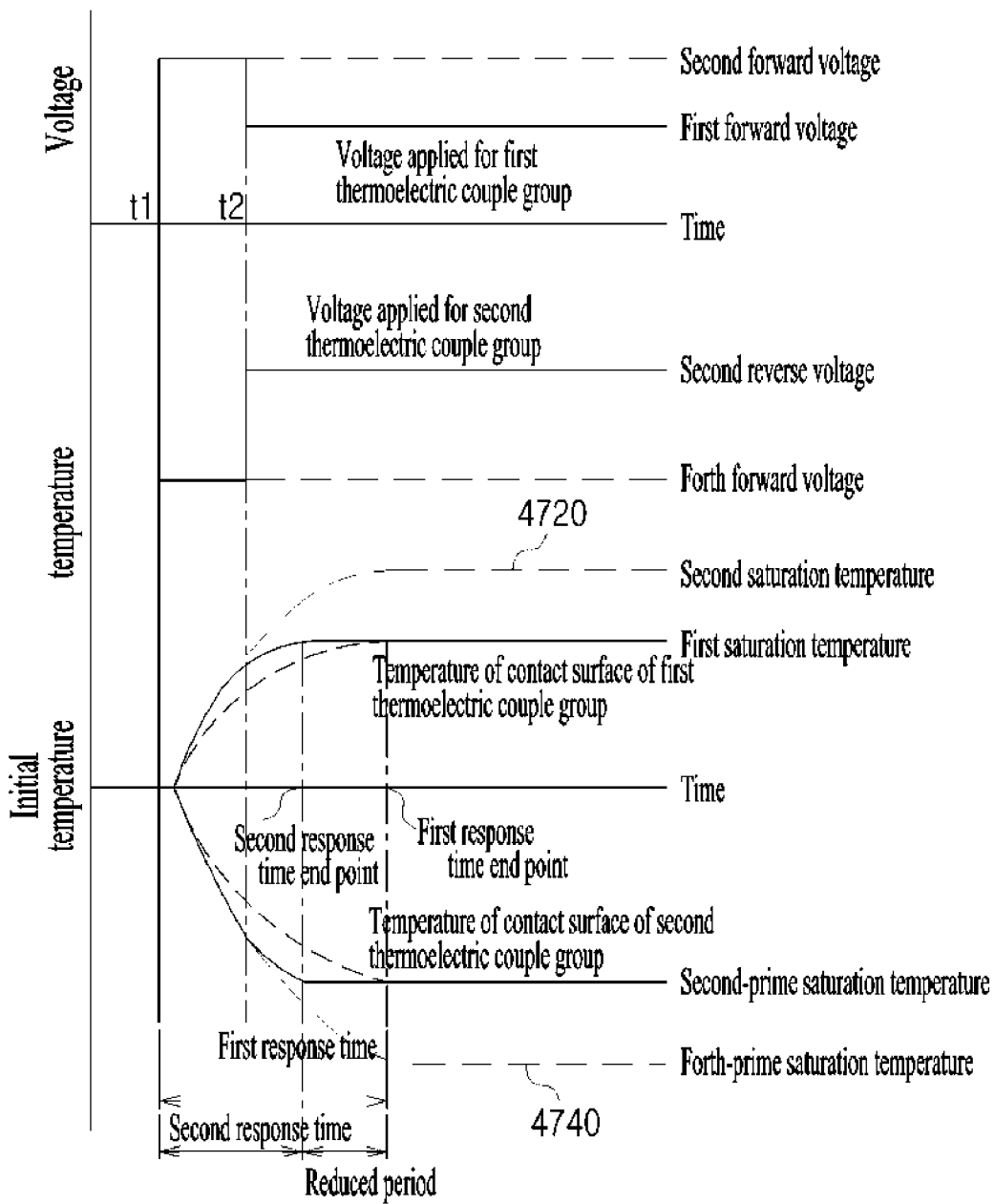
FIG. 47 is a diagram showing a change in temperature on a contact surface and a change in applied voltage according to a method of reducing a response time of a thermal feedback when a thermal grill feedback is output from a thermoelectric couple group according to an embodiment of the present invention.

FIG. 47 is a diagram showing a change in temperature on a contact surface and a change in applied voltage according to a response time reduction method for a thermal feedback when a thermal grill feedback is output from a thermoelectric couple group according to an embodiment of the present invention.

Referring to FIG. 47, a thermal grill feedback with a first intensity may be output from a first thermoelectric couple group and a second thermoelectric couple group. When the neutral ratio is set to 2, the feedback device 1600 may apply, to the first thermoelectric couple group, a first operating voltage (a first forward voltage in the example of FIG. 47) for outputting a hot feedback with a first intensity and may apply, to the second thermoelectric couple group, a second operating voltage (a fourth reverse voltage in the example of FIG. 47) for outputting a cold feedback with a second intensity. Thus, the temperature of the contact surface of the first thermoelectric couple group may reach the first saturation temperature at the first response time end point, and the temperature of the contact surface of the second thermoelectric couple group may reach the second-prime saturation temperature at the first response time end point. In this case, the period from the first time point to the first response time end point may be a response time of the thermal grill feedback output from the first thermoelectric couple group and the second thermoelectric couple group (hereinafter referred to as a first response time).

Also, between the first time point and the second time point, which corresponds to a predetermined time interval, the feedback device 1600 may apply a first reduction voltage (a second forward voltage in the example of FIG. 48) higher than the first operating voltage to the first thermoelectric couple and may apply a second reduction voltage (a fourth reverse voltage) higher than the second operating voltage to the second thermoelectric couple group by using the thermal feedback response time reduction method.

As the first reduction voltage is applied to the first thermoelectric couple group, the temperature of the contact surface of the first thermoelectric couple group may rise along a second reference temperature curve 4720 at a rate faster than a temperature rise rate of the contact surface when the first operating voltage is applied to the first thermoelectric couple group. Also, as the second reduction voltage is applied to the second thermoelectric couple group, the temperature of the contact surface of the second thermoelectric couple group may drop along a fourth reference temperature curve 4740 at a rate faster than a temperature drop rate of the contact surface when the second operating voltage is applied to the second thermoelectric couple group. Thus, the temperature of the contact surface of the first thermoelectric couple group may reach the first saturation temperature at the second response time end point preceding the first response time end point, and the temperature of the contact surface of the second thermoelectric couple group may reach the second-prime saturation temperature at the second response time end time. That is, the period from the first time point to the second response time end point may be a response time (hereinafter referred to as the second response time), and the second response time may be more reduced than the first response time. The user may sense the thermal grill feedback as quickly as a reduction time, which is a different between the first response time and the second response time.

However, for convenience of description, it is assumed that a time point at which the temperature of the contact surface of the first thermoelectric couple group reaches the first saturation temperature and a time point at which the temperature of the contact surface of the second thermoelectric couple group reaches the second-prime saturation temperature coincide with each other, that is, the time points are the same first response time end point (or second response time end point), but the present invention is not limited thereto. The time point at which the temperature of the contact surface of the first thermoelectric couple group reaches the first saturation temperature and the time point at which the temperature of the contact surface of the second thermoelectric couple group reaches the second-prime saturation temperature may not coincide with each other. Even in this case, when the response time reduction method for the thermal feedback is performed, the time it takes for the temperature of the contact surface of the first thermoelectric couple group to reach the first saturation temperature and the time it takes for the temperature of the contact surface of the second thermoelectric couple group to reach the second-prime saturation temperature are reduced. Thus, a response time for the thermal grill feedback is reduced so that the user may experience the thermal grill feedback at an earlier time.

4.2. Thermal Experience Providing Method Considering Reduced Response Time

According to an embodiment of the present invention, it may be important to output an appropriate thermal feedback as multimedia content is reproduced, in order to provide the user with an enhanced thermal experience. For example, when a video is reproduced, it may be important to provide a hot feedback for an explosion scene and provide a cold feedback for a cold scene by linking a thermal feedback to a reproduced screen.

In detail, in order to associate a thermal feedback with an image or voice when video content is reproduced, it may be important to synchronize the thermal feedback with a specific scene or voice to be linked to the thermal feedback. For example, in order for a hot feedback to be felt when an explosion scene is reproduced, it is desirable that a time point at which the explosion scene is output coincides with a time point at which the hot feedback is sensed; otherwise, the user's experience may be hindered.

However, when the feedback device 1600 applies power for outputting the thermal feedback at a time point at which a specific scene is output, a time difference may occur between the time point at which the specific scene is output and the time point at which the thermal feedback is sensed. This is because even if power is applied to a thermoelectric couple group, it takes some time before the temperature of a contact surface 1641 reaches a temperature at which a user can sense a thermal feedback. That is, the power application time point may not coincide with the time point at which the user senses the thermal feedback. Thus, when the power application time point coincides with the time point at which a specific scene is output, the image and the thermal feedback are out of synchronization. Hereinafter, the time it takes for the user to sense a thermal feedback after initiation of a thermoelectric operation for the thermal feedback is referred to as a "delay time."

Hereinafter, also, a specific scene being linked to a thermal feedback to enhance a user experience is referred to as a thermal event scene. Generally, but not necessarily, for the thermal event scene, events involving heat in the real world, such as explosions or gunshot hits, are included in the image. Accordingly, any scene capable of being linked to the thermal feedback may be included in order to enhance a user's immersion. Similarly, a specific voice in which a user experience is enhanced by being linked to the thermal feedback is referred to as a thermal event voice.

According to an embodiment of the present invention, by using the thermal feedback response time reduction method, the time difference between the time point at which the specific scene is output and the time point at which the thermal feedback is sensed may be decreased. In detail, FIG. 48 is a diagram showing a thermal feedback output operation according to an embodiment of the present invention.

Figure 48:
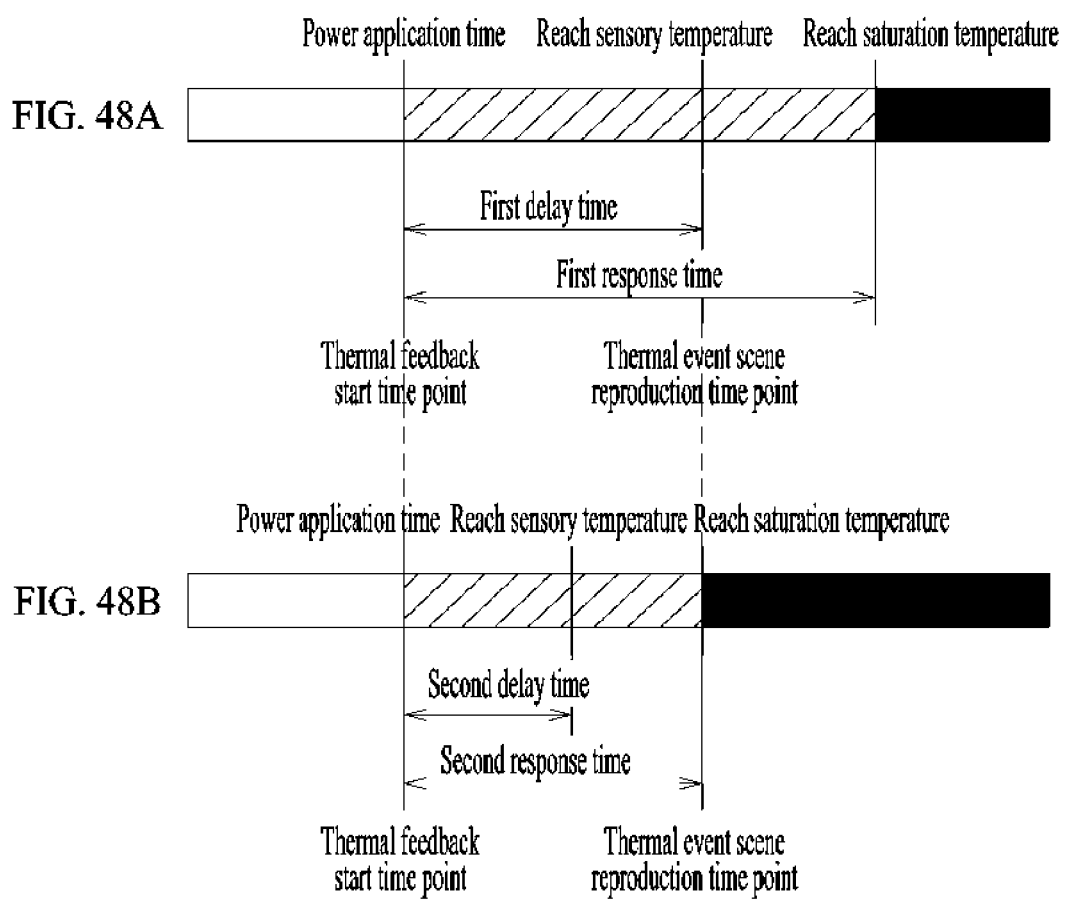
FIGS. 48A and 48B are diagrams showing a thermal feedback output operation according to an embodiment of the present invention.

Referring to FIG. 48, FIG. 48A relates to a thermal feedback output operation when the thermal feedback response time reduction method is not performed. In FIG. 48A, when power is applied to a thermoelectric couple group at a thermal feedback initiation time point, the temperature of the contact surface of the thermoelectric couple group may reach a sensible temperature from an initial temperature during a first delay time. A thermal event scheme may be reproduced in the content reproduction device 1200 when the sensible temperature is reached. Subsequently, the temperature of the contact surface may reach a saturation temperature, and a period from the thermal feedback initiation time point to a saturation temperature arrival time point may be a response time.

FIG. 48B relates to a thermal feedback output operation when the thermal feedback response time reduction method is performed. In FIG. 48B, like FIG. 48A, power may be applied to a thermoelectric couple group at a thermal feedback initiation time point. In this case, the temperature of the contact surface of the thermoelectric couple group may reach a saturation temperature after a second response time elapses from the thermal feedback initiation time point. In this case, by performing the thermal feedback response time reduction method, the second response time may be shorter than the first response time in FIG. 48A. Also, as the second response time decreases, the temperature of the surface area may reach the sensible temperature at an earlier time point, and also the second delay time, which indicates a period from the thermal feedback initiation time point to the sensible temperature arrival time point, may be reduced.

In FIG. 48A and FIG. 48B, when the thermal feedbacks are initiated at the same time and the thermal feedback response time reduction method is performed, the delay time is reduced, and thus the thermal event initiation time point may be advanced. That is, depending on whether the thermal feedback response time reduction method is performed, whether a thermal event scene reproduction time point coincides with a thermal event sensing time point may be determined. For example, when the thermal feedback response time reduction method is performed and the thermal feedback initiation time point is not adjusted, the thermal event scene reproduction time point is not synchronized with the thermal event sensing time point.

A method of providing a thermal experience in consideration of a reduced response time point when the thermal event response time reduction method is performed will be described below.

Figure 49:
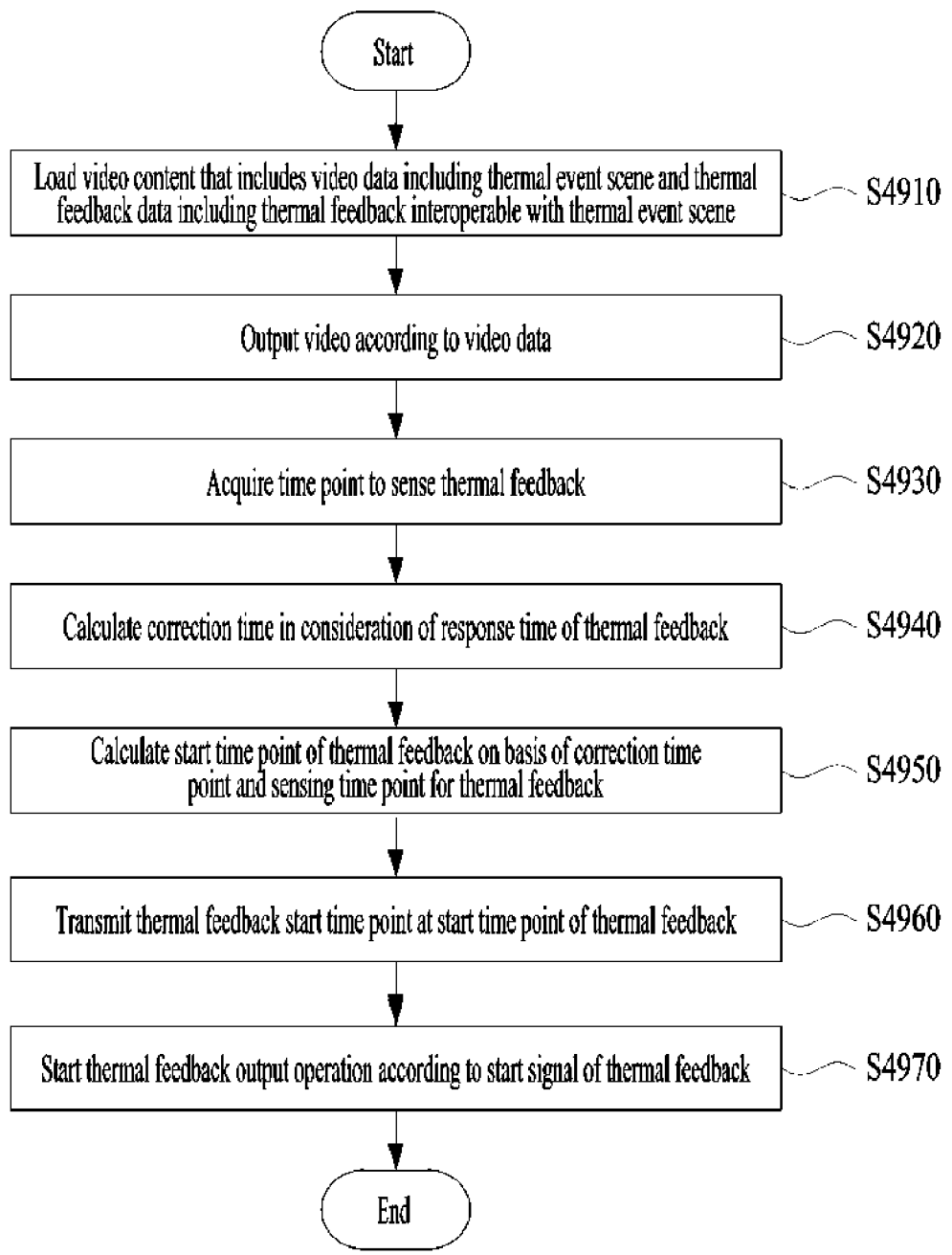
FIG. 49 is a flowchart showing a thermal experience providing method considering a reduced response time according to an embodiment of the present invention.

FIG. 49 is a flowchart showing a thermal experience providing method considering a reduced response time according to an embodiment of the present invention.

Referring to FIG. 49, the thermal experience providing method considering the reduced response time may include loading video content that includes image data including a thermal event scene and thermal feedback data including a thermal feedback linked to the thermal event scene (S4910), outputting an image according to the image data (S4920), acquiring a time point at which the thermal feedback is to be sensed (S4930), calculating a correction time in consideration of a response time of the thermal feedback (S4940), calculating an initiation time point of the thermal feedback on the basis of the correction time and a time point at which the thermal feedback is sensed (S4950), transmitting a thermal feedback initiation signal when a thermoelectric operation is initiated (S4960), and initiating the thermoelectric operation to output the thermal feedback according to the thermal feedback initiation signal (S4970).

The aforementioned steps of the embodiment will be described in detail below.

The content reproduction device 1200 may load video content that includes image data including a thermal event scene and thermal feedback data including a thermal feedback linked to the thermal event scene (S4910)

In detail, the controller 1260 may load video content prestored in the memory 1240 or may receive video content through the communication module 1220 in a downloading or streaming manner.

The video content may include the image data and the thermal feedback data. Here, the video content may be provided in the form of a single file including the image data and the thermal feedback data and also may be provided in a form that includes a video file including the image data and a separate file including the thermal feedback data.

The image data includes information regarding a scene to be output when the video content is reproduced. Also, the scene to be output may include a thermal event scene.

The thermal feedback data includes information regarding a thermal feedback to be output when the video content is reproduced, that is, thermal feedback information. For example, the thermal feedback information may include information regarding a thermal feedback target, a thermal feedback type, a thermal feedback intensity, and a thermal feedback sensing time point. According to an embodiment, the thermal feedback sensing time point may be set to be the same as the thermal event scene reproduction time point.

The content reproduction device 1200 may output an image according to the image data (S4920). For example, the controller 1260 may decode the image data with an image codec to output the image. The output of the image may be performed through an external or internal display.

The content reproduction device 1200 may acquire a time point at which the thermal feedback is to be sensed (S4930). In detail, the controller 1260 may acquire a time point at which a user should sense the thermal feedback from the thermal feedback data. Here, the time point at which the thermal feedback is sensed may be the same as a time point at which a specific scene to be linked to the thermal feedback is output.

The content reproduction device 1200 may calculate a correction time in consideration of a response time of the thermal feedback. Here, the correction time may be a time interval from a power application time point at which power is applied to the thermoelectric couple group up to a sensing time point at which the temperature of the contact surface 1641 reaches a temperature at which a user may sense the thermal feedback.

In detail, as described above, when the thermal feedback response time reduction method is performed on the feedback device 1600, the delay time may be reduced. Accordingly, the controller 1260 may determine the delay time in consideration of whether the thermal feedback response time reduction method is performed on the feedback device 1600.

To this end, the controller 1260 may acquire information regarding a response time of the feedback device 1600 from the feedback device 1600 through the communication module 1220. When the thermal feedback response time reduction method is performed on the feedback device 1600, the controller 1260 may reduce a correction time according to the reduced delay time. For example, when a correction time table is prestored in the memory 1240 and a correction time corresponding to the reduced delay time is stored in the correction time table, the controller 1260 may determine the correction time with reference to the prestored correction time table. Also, the correction time may be set differently in the correction time table on the basis of the type of the thermal feedback and/or the intensity of the thermal feedback, and information regarding the reduced delay time may be reflected in the correction time. In this case, the controller 1260 may determine the correction time with reference to the prestored correction time table.

Also, when the feedback device 1600 has correction time information that reflects the reduced delay time and that is stored therein, the controller 1260 may receive the correction time information from the feedback device 1600 and may set the correction time with reference to the received correction time information.

Also, since a degree to which the response time is reduced may be set differently depending on unique characteristics of the feedback device 1600, the controller 1260 may determine the correction time in consideration of identification information of the feedback device 1600. To this end, the controller 1260 may acquire the identification information of the feedback device 1600 through the communication module 1220, acquire a delay time of the feedback device 1600 through the identification information of the feedback device 1600, and determine the correction time on the basis of the acquired delay time.

Also, the content reproduction device 1200 may calculate an initiation time point of a thermoelectric operation for the thermal feedback on the basis of the correction time and the thermal feedback sensing time point (S4950). In detail, the controller 1260 may calculate the initiation time point of the thermoelectric operation for the thermal feedback by subtracting the correction time from the thermal feedback sensing time point.

The content reproduction device 1200 may transmit a thermal feedback initiation signal at the initiation time point of the thermal operation for the thermal feedback (S4960). When the thermoelectric operation initiation time point is determined and a current reproduction time (hereinafter referred to as a reproduction time point) reaches the initiation time point of the thermoelectric operation while the video content is reproduced, the controller 1260 may transmit the thermal feedback initiation signal to the feedback device 1600 through the communication module 1220.

The feedback device 1600 may initiate a thermal feedback output operation according to the thermal feedback initiation signal (S4970).

Figure 50:
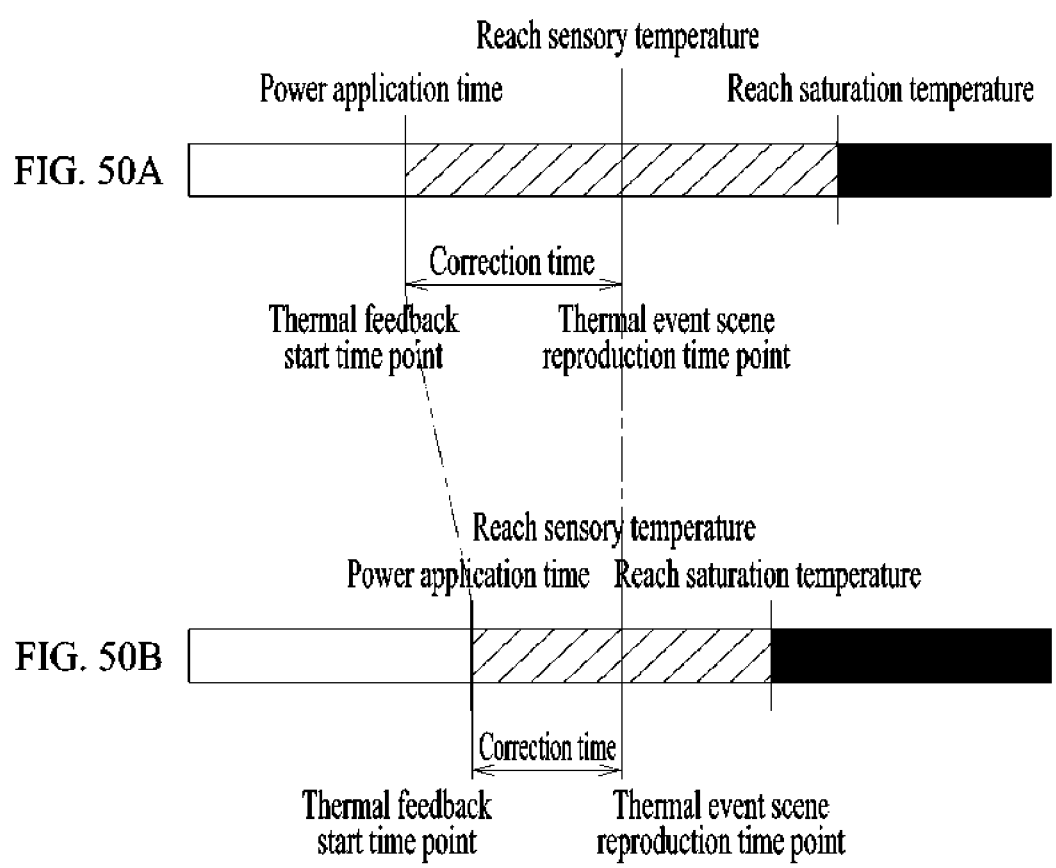
FIGS. 50A and 50B are diagrams showing a thermal feedback output operation of a thermal experience providing method considering a reduced response time according to an embodiment of the present invention.

FIG. 50 is a diagram showing a thermal feedback output operation of a thermal experience providing method considering a reduced response time according to an embodiment of the present invention.

In FIG. 50, FIG. 50A relates to a thermal feedback output operation when the reduced response time is not performed on the feedback device 1600, and FIG. 50B relates to a thermal feedback output operation when the reduced response time is considered in the feedback device 1600.

In detail, in FIG. 50B, the feedback device 1600 applies power to a thermoelectric couple group at a time point at which the initiation signal is received (which is substantially the same as a time point at which the thermoelectric operation is initiated). In this case, the initiation signal reception time point considers a response time reduced through the thermal experience providing method described in FIG. 49. The thermoelectric couple group performs an exothermic operation or endothermic operation from a thermoelectric couple group power application time point. When the correction time elapses from the power application time point, the temperature of the contact surface 1641 reaches a temperature at which a user may sense the thermal feedback. Accordingly, the user may sense the thermal feedback at a time point at which the thermal event scene is output after the multimedia content is reproduced.

Compared to FIG. 50A, the correction time in FIG. 50B may be shorter than the correction time in FIG. 50A. This is because the delay time in FIG. 50B is shorter than the delay time in FIG. 50A. Also, although the delay time is reduced, a time point at which the temperature of the contact surface reaches the sensible temperature in FIG. 50A may coincide with that in FIG. 50B because the reduced delay time is reflected in the correction time.

Accordingly, even when the thermal feedback response time reduction method is performed as shown in FIG. 50B, The feedback device 1600 may be controlled by the content reproduction device 1200 to apply power to a thermoelectric element at the initiation time point of the thermoelectric operation, which is set to precede the output time point of the specific scene to be linked to the thermal feedback. Thus, the thermoelectric operation may start to be performed, and a user may sense the thermal feedback at the output time point of the specific scene.

Although the above description assumes that an image is synchronized with a thermal feedback, a voice may be synchronized with the thermal feedback instead of the image. This may be easily understood by those skilled in the art by replacing the image data and the thermal event scene with voice data and a thermal event voice.

Figure 51:
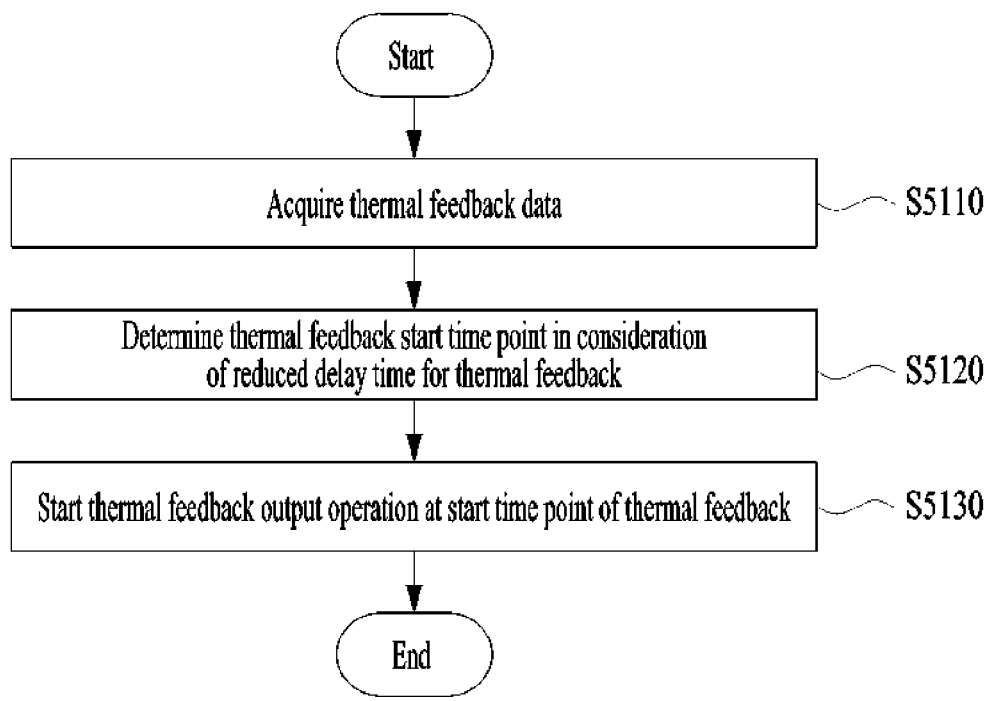
FIG. 51 is a flowchart showing a thermal experience providing method considering a reduced response time according to another embodiment of the present invention.

FIG. 51 is a flowchart showing a thermal experience providing method considering a reduced response time according to another embodiment of the present invention.

Referring to FIG. 51, the thermal experience providing method considering the reduced response time may include acquiring thermal feedback data (S5110), determining an initiation time point of a thermal feedback in consideration of a reduced delay time of the thermal feedback (S5120), and initiating a thermal feedback output operation at the initiation time point of the thermal feedback (S5130).

The aforementioned steps of the embodiment will be described in detail below.

The feedback device 1600 may acquire thermal feedback data from the content reproduction device 1200 (S5110). The thermal feedback data may include information regarding the types and intensities of thermal feedbacks output from thermoelectric couple groups and the output start times and/or end times of the thermal feedbacks.

Also, the feedback device 1600 may determine an initiation time point of a thermal feedback in consideration of a reduced delay time of the thermal feedback (S5120).

According to an embodiment of the present invention, when the thermal feedback response time reduction method is performed on the feedback device 1600, a delay time, which indicates a period from the initiation time point of the thermal feedback up to a sensing time point at which a user senses the thermal feedback, may be reduced. In some cases, the output time point of the thermal feedback included in the thermal feedback data may not reflect the delay time. In this case, when the thermal feedback is initiated according to the output time point of the thermal feedback included in the thermal feedback data, the user's sensing time point may be advanced. Accordingly, the thermal event scene and the thermal feedback may be out of synchronization to hinder the user's experience. In order to solve such a problem, the feedback device 1600 may determine the thermal feedback initiation time point on the basis of the reduced delay time and the thermal feedback output time point included in the thermal feedback data.

As an example, information regarding the reduced delay time (or the reduced response time) may be prestored in the memory of the feedback device 1600, and the feedback device may correct the thermal feedback output time point included in the thermal feedback data on the basis of the information regarding the reduced delayed time and then determine a thermal feedback initiation time point.

Also, the feedback device 1600 may initiate a thermal feedback output operation at the thermal feedback initiation time point (S5130). By the thermal feedback initiation time point being corrected by the feedback device 1600 on the basis of the reduced delay time, the thermal event scene may be synchronized with the thermal feedback, and thus the user's experience may be enhanced.

5. End Time Reduction Method for Thermal Feedback

An end time reduction method for a thermal feedback according to an embodiment of the present invention will be described below. Here, the end time may refer to the time it takes for the temperature of the contact surface of the thermoelectric couple group which is changed by the output of the thermal feedback to return to an initial temperature when the thermal feedback ends. Also, the end time reduction method for the thermal feedback may be understood as a method of reducing the end time.

In detail, the thermoelectric couple group 1644 or the contact surface 1641 has a predetermined heat capacity. Thus, when an exothermic operation or endothermic operation is initiated by applying power to the heat output module 1640, the temperature of the contact surface 1641 gradually changes from an initial temperature and reaches a saturation temperature instead of reaching the saturation temperature as soon as power is applied. On the other hand, when the exothermic operation or endothermic operation is stopped by shutting off the power, the temperature of the contact surface 1641 gradually changes and returns to the initial temperature instead of returning to the initial temperature directly from the saturation temperature.

In this case, the user may feel an unnecessary heat sensation due to the temperature of the contact surface 1641 gradually returning from the saturation temperature to the initial temperature. For example, when a hot feedback with a fifth intensity is output from the heat output module 1640, the saturation temperature of the contact surface 1641 may increase up to the saturation temperature of the hot feedback with the fifth intensity. When the output of the hot feedback ends, the temperature of the contact surface 1641 may drop from the saturation temperature of the hot feedback with the fifth intensity to the initial temperature. In this case, as the temperature of the contact surface 1641 drops gradually, the user unintentionally feels hot feedbacks with first to fourth intensities. The hot feedbacks with the first to fourth intensities are heat unnecessary for the user, and thus the user's thermal experience is hindered.

However, in this case, by the feedback device 1600 performing the end time reduction method for the thermal feedback, when the end time is reduced, the temperature of the contact surface 1641 reaches the initial temperature within a short time after the thermoelectric operation ends.

Accordingly, as the end time is reduced, the user does not feel the unnecessary heat, and thus the user's thermal experience may be enhanced.

The end time reduction method for the thermal feedback will be described below. Also, for convenience of description, the following description assumes that the end time reduction method is performed by the feedback device 1600. However, the present invention is not limited thereto, and the end time reduction method may be performed by the content reproduction device 1200 and may be performed by a third apparatus other than the feedback device 1600 and the content reproduction device 1200.

Figure 52:
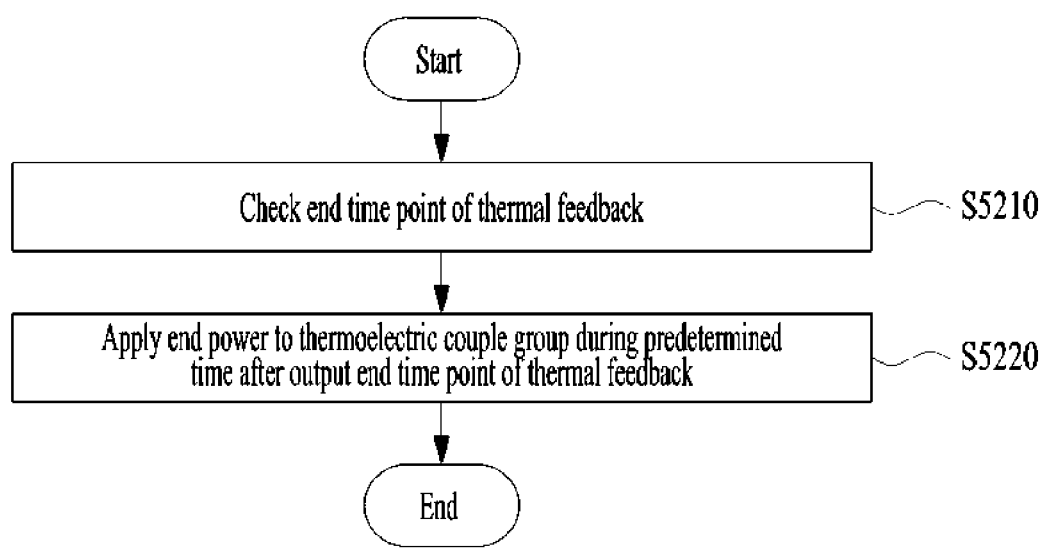
FIG. 52 is a flowchart showing an end time reduction method for a thermal feedback according to an embodiment of the present invention.

FIG. 52 is a flowchart showing an end time reduction method for a thermal feedback according to an embodiment of the present invention.

Referring to FIG. 52, the end time reduction method may include checking an output end time point of the thermal feedback (S5210) and applying end power to a thermoelectric couple group during a predetermined time after the output end time point of the thermal feedback (S5220).

In detail, the feedback device 1600 may check the output end time point of the thermal feedback (S5210). The type of the thermal feedback may be any one of a hot feedback, a cold feedback, or a thermal grill feedback. Also, the type (forward voltage/reverse voltage) and magnitude of a voltage applied to the thermoelectric couple group may be predetermined according to the type and intensity of the thermal feedback.

According to an embodiment of the present invention, the feedback device 1600 may acquire thermal feedback data from the content reproduction device 1200. The thermal feedback data may include information regarding the types and intensities of thermal feedbacks output from thermoelectric couple groups and the output start times and/or end times of the thermal feedbacks. The feedback device 1600 may check the output end time point of the thermal feedback output from the thermoelectric couple group on the basis of the thermal feedback data.

Also, the feedback device 1600 may apply end power to the thermoelectric couple group for a predetermined time after the output end time point of the thermal feedback (S5220).

In order to reduce the end time, which is the time it takes for the temperature of the contact surface of the thermoelectric couple group changed by the output of the thermal feedback to return to an initial temperature, the feedback device 1600 may apply end power during a predetermined time after the output end time point of the thermal feedback instead of stopping the application of the power for outputting the thermal feedback. Here, the end power may refer to power applied to reduce the time it takes for the temperature of the contact surface to reach the initial temperature when the output of the thermal feedback ends (hereinafter, the voltage and current of the end power are referred to as a "end voltage" and a "end current"). Also, the end power may be in the opposite direction to power (hereinafter referred to as "operating power") applied to output the thermal feedback (hereinafter, the voltage and current of the operating power are referred to as an "operating voltage" and an "operating current"). For example, the end voltage may be a reverse voltage when the operating voltage is a forward voltage, and the end voltage may be a forward voltage when the operating voltage is a reverse voltage.

As the feedback device 1600 applies the end power to the thermoelectric couple group during a predetermined time after the output end time point of the thermal feedback, the temperature of the contact surface may reach the initial temperature at an earlier time, and thus the end time may be reduced. Also, the feedback device 1600 may stop the application of the end power after the predetermined time elapses.

However, the magnitude of the end power applied to reduce the end time, the application time (i.e., the predetermined time) of the end power, and the like may differ depending on various situations, for example, the type and intensity of the thermal feedback output from the thermoelectric couple group.

Implementations of the end time reduction method for the thermal feedback in the various situations will be described below. Also, for convenience of description, the following description focuses on a case in which a hot feedback is to be output from the thermoelectric couple group. However, the present invention is not limited thereto, and it will be appreciated that the following description may be applied to cases in which a cold feedback or a thermal grill feedback is to be output from the thermoelectric couple group.

5.1. Implementation of End Time Reduction Method for Thermal Feedback

Figure 53:
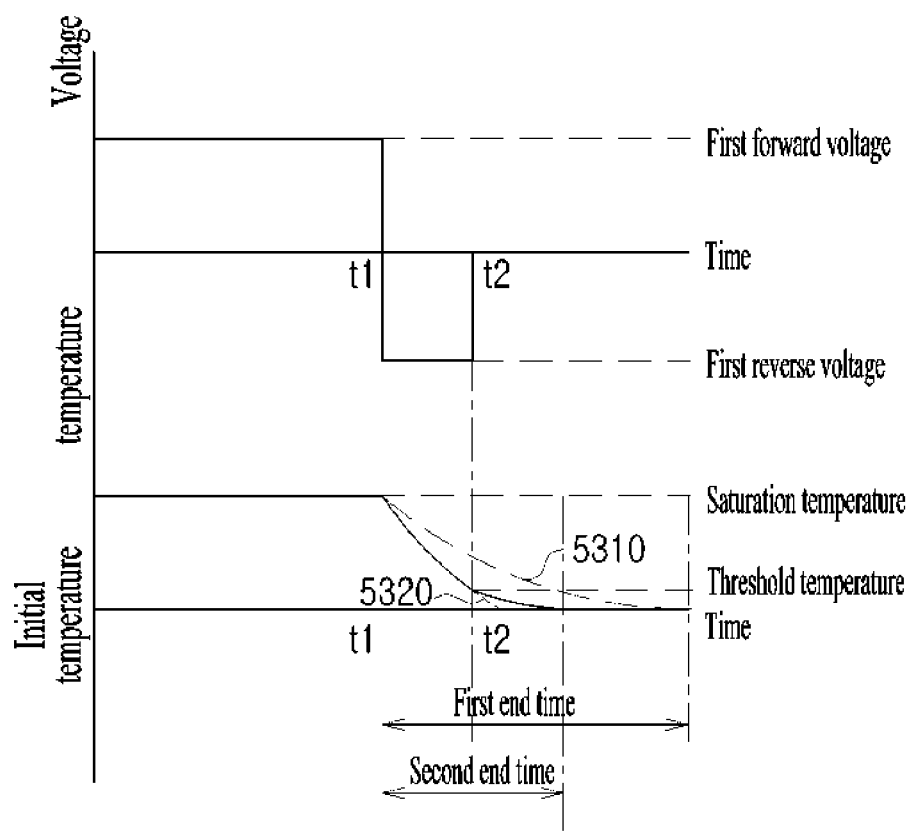
FIG. 53 is a diagram showing a change in temperature on a contact surface and a change in applied voltage according to the end time reduction method for the thermal feedback when a hot feedback is output from a thermoelectric couple group according to an embodiment of the present invention.

FIG. 53 is a diagram showing a change in temperature on a contact surface and a change in applied voltage according to the end time reduction method for the thermal feedback when a hot feedback is output from a thermoelectric couple group according to an embodiment of the present invention.

Referring to FIG. 53, the feedback device 1600 may apply, to the thermoelectric couple group, an operating voltage (a first forward voltage in the example of FIG. 53) for outputting the hot feedback. Accordingly, the temperature of the contact surface of the thermoelectric couple group may become a saturation temperature. Also, the feedback device 1600 may confirm that an output stop time point of the hot feedback is a first time point and may stop the application of the first forward voltage at the first time point in order to stop outputting the hot feedback. Accordingly, the temperature of the contact surface may drop from the saturation temperature along a first reference temperature curve 5310 to gradually reach the initial temperature. In this case, the period from the first time point to the time point at which the temperature of the contact surface reaches the initial temperature may be an end time for the thermal feedback (hereinafter referred to as a first end time).

According to an embodiment of the present invention, the feedback device 1600 may perform the thermal feedback end time reduction method in order to reduce the end time. In detail, the feedback device 1600 may apply an end voltage (a first reverse voltage in the example of FIG. 53) between the first time point, which is the thermal feedback output end time point, and a predetermined second time point. In this case, the end voltage may be in the opposite direction to the operating voltage. As the end voltage is applied between the first time point and the second time point, the temperature of the contact surface may drop along a second reference temperature curve 5320. As the temperature of the contact surface drops along the second reference temperature curve 5320, a temperature drop rate of the contact surface when the end voltage is applied to the thermoelectric couple group may be faster than a temperature drop rate of the contact surface when the end voltage is not applied to the thermoelectric couple group between the first time point and the second time point. In this case, the period from the first time point to the time point at which the temperature of the contact surface reaches the initial temperature may be an end time for the thermal feedback (hereinafter referred to as a second end time), and the second end time may be shorter than the first end time. As a result, when the feedback device 1600 performs the thermal feedback end time reduction method, the end time of the thermal feedback may be reduced by a time difference between the first end time and the second end time. Accordingly, as the end time is reduced, the user does not feel the unnecessary heat caused by the end of the thermal feedback such that the user's thermal experience may be enhanced.

According to an embodiment of the present invention, the magnitude of the end voltage may be predetermined. For example, as shown in the example of FIG. 53, the intensity of the end voltage may be the same as, or higher or lower than, that of the operating voltage. However, the end voltage may be in the opposite direction to the operating voltage.

According to an embodiment of the present invention, the feedback device 1600 may determine the magnitude of the end voltage so that a threshold temperature does not exceed an initial temperature. This is because when the threshold temperature exceeds the initial temperature, the user may misunderstand that a thermal feedback other than a previous thermal feedback is output. According to an embodiment, the feedback device 1600 may determine the magnitude of the end voltage so that the temperature of the contact surface does not reach the initial temperature while the end voltage is applied. When the temperature of the contact surface does not reach the initial temperature while the end voltage is applied, the temperature of the contact surface does not exceed the initial temperature after the application of the end voltage ends.

Also, according to an embodiment of the present invention, the end voltage may be determined depending on the intensity of the thermal feedback, that is, the magnitude of the operating voltage. For example, since the intensity of the thermal feedback is a second intensity, the end voltage may be a second reverse voltage when the magnitude of the operating voltage is a second forward voltage. Also, when the intensity of the thermal feedback is a third intensity, the intensity of the operating voltage is a third forward voltage higher than the second forward voltage, and the intensity of the end voltage may be a third reverse voltage higher than the second reverse voltage. On the other hand, when the intensity of the thermal feedback is a first intensity, the intensity of the operating voltage is a first forward voltage lower than the second forward voltage, and the intensity of the end voltage may be a first reverse voltage lower than the second reverse voltage.

Also, according to an embodiment, the end voltage may be predetermined irrespective of the intensity of the thermal feedback.

Also, according to an embodiment of the present invention, the time point at which the application of the end voltage is stopped may be predetermined. According to an embodiment of the present invention, the time point at which the application of the end voltage is stopped may be determined depending on a threshold temperature indicating the temperature of the contact surface at the second time point. That is, the time point at which the application of the end voltage is stopped affects the threshold temperature, and thus the time point at which the application of the end voltage is stopped may be predetermined in consideration of a relation between the threshold temperature and the time point at which the application of the end voltage is stopped. For example, the feedback device 1600 may stop applying the end voltage when the temperature of the contact surface 1641 reaches a predetermined threshold temperature.

Also, the time point at which the application of the end voltage is stopped (i.e., a time at which the end voltage is applied) may be determined as a time point before the threshold temperature reaches the initial temperature. As described above, this is because when the threshold temperature exceeds the initial temperature, the user may misunderstand that a thermal feedback other than a previously output thermal feedback is output. Accordingly, the feedback device 1600 may determine the time point at which the application of the end voltage is stopped so that the threshold temperature does not exceed the initial temperature. According to an embodiment, the feedback device 1600 may determine the time point at which the application of the end voltage is stopped so that the temperature of the contact surface does not reach the initial temperature while the end voltage is applied. When the temperature of the contact surface does not reach the initial temperature while the end voltage is applied, the temperature of the contact surface does not exceed the initial temperature after the application of the end voltage ends.

Also, according to another embodiment of the present invention, the time point at which the application of the end voltage is stopped may be determined on the basis of the intensity of the thermal feedback. For example, the time point at which the application of the end voltage is stopped may be t seconds when the intensity of the thermal feedback is the first intensity and may be t+a seconds (or t−a seconds) when the intensity of the thermal feedback is the second intensity.

Also, according to an embodiment of the present invention, whether to apply the end voltage to the thermoelectric couple group may be determined depending on the intensity of the thermal feedback, that is, the magnitude of the operating voltage. For example, when the intensity of the thermal feedback is lower than a predetermined intensity, the temperature of the contact surface may quickly reach the initial temperature although the end voltage is not applied. In this case, the effect of reducing the end time according to the application of the end voltage is small. Thus, when the intensity of the thermal feedback is lower than the predetermined intensity, the feedback device 1600 may not apply the end voltage. Likewise, when the intensity of the thermal feedback is higher than the predetermined intensity, the feedback device 1600 may apply the end voltage to the thermoelectric couple group in order to reduce the end time because the effect of reducing the end time according to the application of the end voltage is large.

Figure 54:
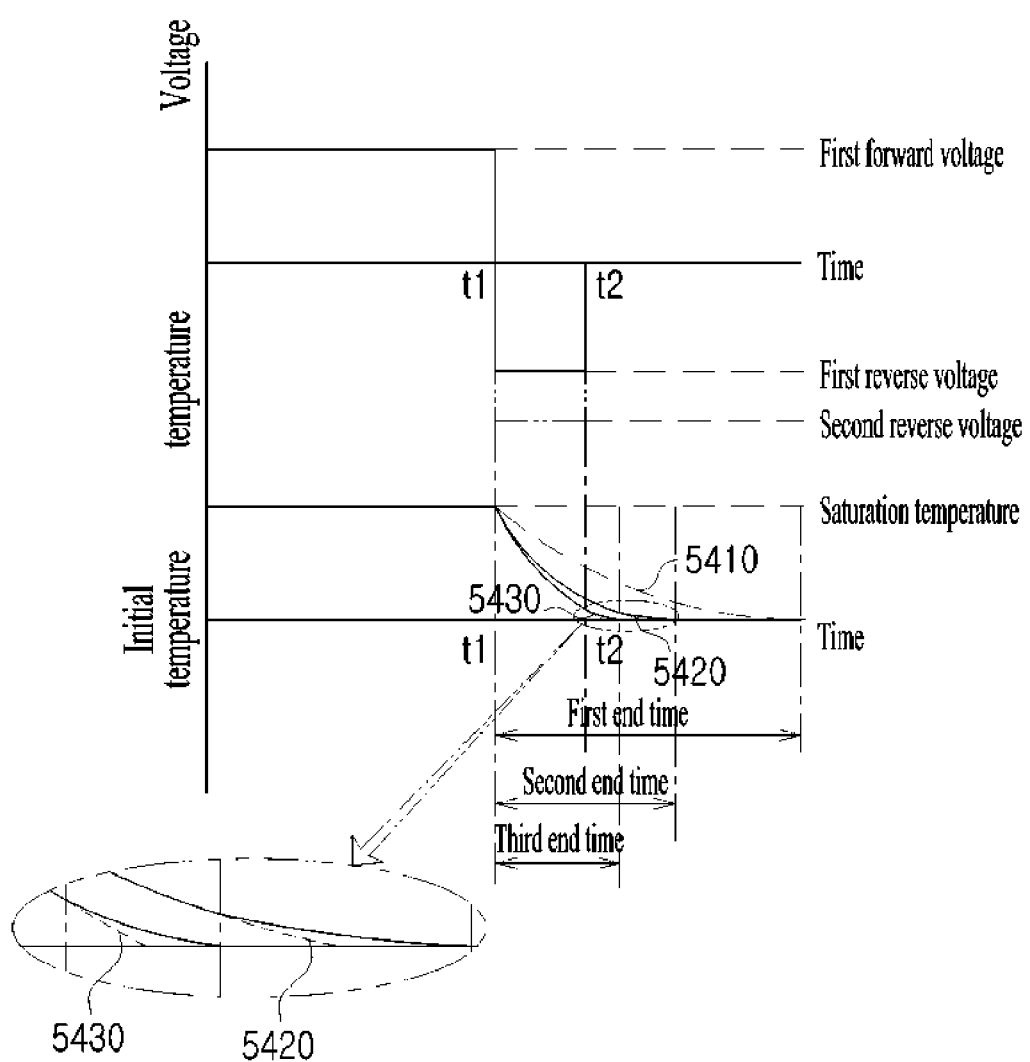
FIG. 54 is a diagram showing a change in temperature on a contact surface and a change in applied voltage according to the end time reduction method for the thermal feedback when a hot feedback is output from a thermoelectric couple group according to another embodiment of the present invention.

FIG. 54 is a diagram showing a change in temperature on a contact surface and a change in applied voltage according to the end time reduction method for the thermal feedback when a hot feedback is output from a thermoelectric couple group according to another embodiment of the present invention.

Referring to FIG. 54, the feedback device 1600 may apply, to the thermoelectric couple group, an operating voltage (a first forward voltage in the example of FIG. 54) for outputting the hot feedback and then may stop applying the operating voltage at a first time point, which is a time point at which the output of the hot feedback is stopped. Accordingly, the temperature of the contact surface may drop from a saturation temperature along a first reference temperature curve 5410 to reach an initial temperature after a first end time elapses.

Also, according to an embodiment of the present invention, the feedback device 1600 may apply a first end voltage (a first reverse voltage in the example of FIG. 54) between a first time point and a second time point. As the first end voltage is applied, the temperature of the contact surface may drop along a second reference temperature curve 5420 between the first time point and the second time point. As the temperature of the contact surface drops along the second reference temperature curve 5420, the temperature of the contact surface may reach the initial temperature after a second end time, which is shorter than the first end time, elapses.

Also, according to an embodiment of the present invention, the feedback device 1600 may apply a second end voltage (a second reverse voltage in the example of FIG. 54) higher than the first end voltage between the first time point and the second time point. As the second end voltage is applied between the first time point and the second time point, the temperature of the contact surface may drop along a third reference temperature curve 5430. Accordingly, the temperature of the contact surface may reach the initial temperature after a third end time, which is shorter than the second end time, elapses.

In summary, as the magnitude of the end voltage increases, the end time of the thermal feedback may be reduced. Thus, the user may not feel unnecessary heat caused by the end of the thermal feedback.

However, when the magnitude of the end voltage increases over a predetermined critical voltage, the temperature of the contact surface may be lower than the initial temperature. When the temperature of the contact surface is lower than the initial temperature, the user may feel an unnecessary cold sensation. Thus, the feedback device 1600 may adjust the magnitude of the end voltage so that the temperature of the contact surface of the thermoelectric couple group does not fall below the initial temperature.

Figure 55:
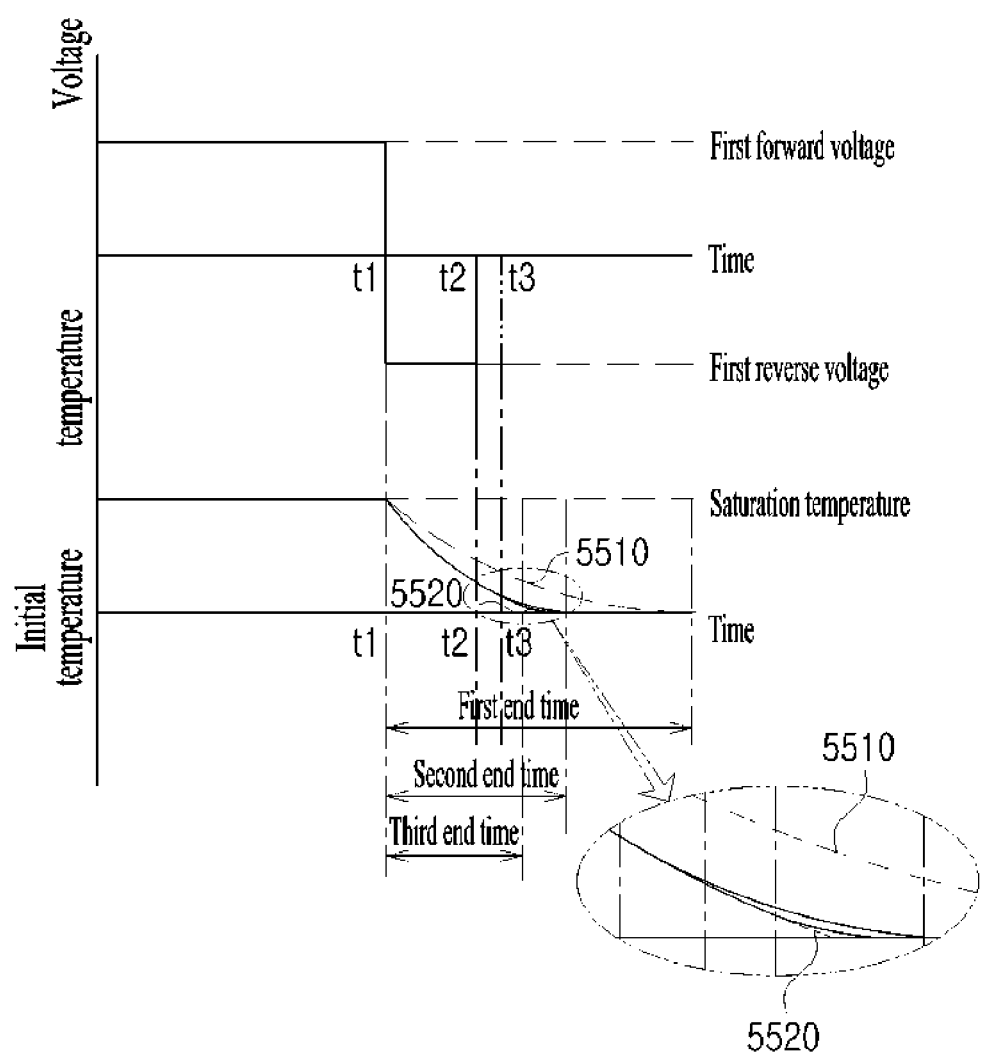
FIG. 55 is a diagram showing a change in temperature on a contact surface and a change in applied voltage according to the end time reduction method for the thermal feedback when a hot feedback is output from a thermoelectric couple group according to still another embodiment of the present invention.

FIG. 55 is a diagram showing a change in temperature on a contact surface and a change in applied voltage according to the end time reduction method for the thermal feedback when a hot feedback is output from a thermoelectric couple group according to still another embodiment of the present invention.

Referring to FIG. 55, the feedback device 1600 may apply, to the thermoelectric couple group, an operating voltage (a first forward voltage in the example of FIG. 55) for outputting the hot feedback and then may stop applying the operating voltage at a first time point, which is a time point at which the output of the hot feedback is stopped. Accordingly, the temperature of the contact surface may drop from a saturation temperature along a first reference temperature curve 5510 to reach an initial temperature after a first end time elapses.

Also, according to an embodiment of the present invention, the feedback device 1600 may apply the end voltage (a first reverse voltage in the example of FIG. 55) between a first time point and a second time point. As the end voltage is applied, the temperature of the contact surface may drop along a second reference temperature curve 5520 between the first time point and the second time point. As the temperature of the contact surface drops along the second reference temperature curve 5520, the temperature of the contact surface may reach the initial temperature after a second end time, which is shorter than the first end time, elapses.

Also, according to an embodiment of the present invention, the feedback device 1600 may apply the end voltage from the first time point up to a third time point. As the end voltage is applied up to the third time point, which is after the second time point, the temperature of the contact surface may drop along a second reference temperature curve 5520 from the first time point up to the third time point through the second time point. Accordingly, the temperature of the contact surface may reach the initial temperature after the third end time, which is shorter than the second end time, elapses.

In summary, as the time during which the end voltage is applied increases, the end time of the thermal feedback may be reduced. Thus, the user may not feel unnecessary heat caused by the end of the thermal feedback.

However, when the time during which the end voltage is applied exceeds a predetermined critical time, the temperature of the contact surface of the thermoelectric couple group may decrease below the initial temperature. According to an embodiment of the present invention, the feedback device 1600 may adjust the time during which the end voltage is applied so that the temperature of the contact surface of the thermoelectric couple group does not fall below the initial temperature.

Figure 56:
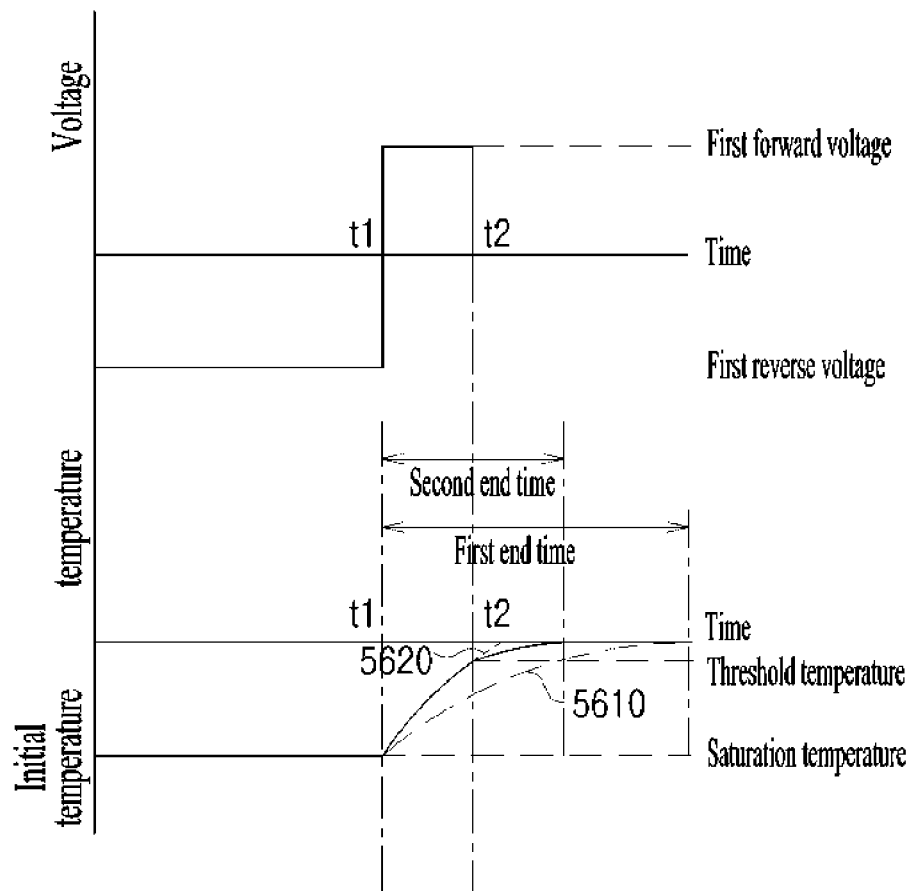
FIG. 56 is a diagram showing a change in temperature on a contact surface and a change in applied voltage according to the end time reduction method for the thermal feedback when a cold feedback is output from a thermoelectric couple group according to an embodiment of the present invention.

FIG. 56 is a diagram showing a change in temperature on a contact surface and a change in applied voltage according to the end time reduction method for the thermal feedback when a cold feedback is output from a thermoelectric couple group according to an embodiment of the present invention.

Referring to FIG. 56, the feedback device 1600 may apply, to the thermoelectric couple group, an operating voltage (a first reverse voltage in the example of FIG. 56) for outputting the cold feedback and then may stop applying the operating voltage at a first time point, which is a time point at which the output of the cold feedback is stopped. Accordingly, the temperature of the contact surface may rise from a saturation temperature along a first reference temperature curve 5610 to reach an initial temperature after a first end time elapses.

As is the case in which a hot feedback is output from a thermoelectric couple group, the feedback device 1600 may apply an end voltage (a first forward voltage in the example of FIG. 56) between the first time point and a second time point by using the thermal feedback end time reduction method.

As the end voltage is applied, the temperature of the contact surface of the thermoelectric couple group may rise along a second reference temperature curve 5620 between the first time point and the second time point at a rate faster than a temperature rise rate of the contact surface when the end voltage is not applied to the thermoelectric couple group. As the temperature of the contact surface rises along the second reference temperature curve 5620, the temperature of the contact surface may reach the initial temperature after a second end time, which is shorter than the first end time, elapses. Thus, the cold feedback may more earlier ends by a reduction time, which is a difference between the first end time and the second end time.

According to an embodiment of the present invention, the magnitude of the end voltage may be predetermined, and the time point at which the application of the end voltage is stopped, that is, the time point at which the operating voltage is applied, may be predetermined.

Also, according to an embodiment of the present invention, a large end voltage may be applied at the first time point in order to further reduce the end time. The description with reference to FIGS. 53 to 55 may be applied to various implementations as it is, and thus a detailed description thereof will be omitted.

Figure 57:
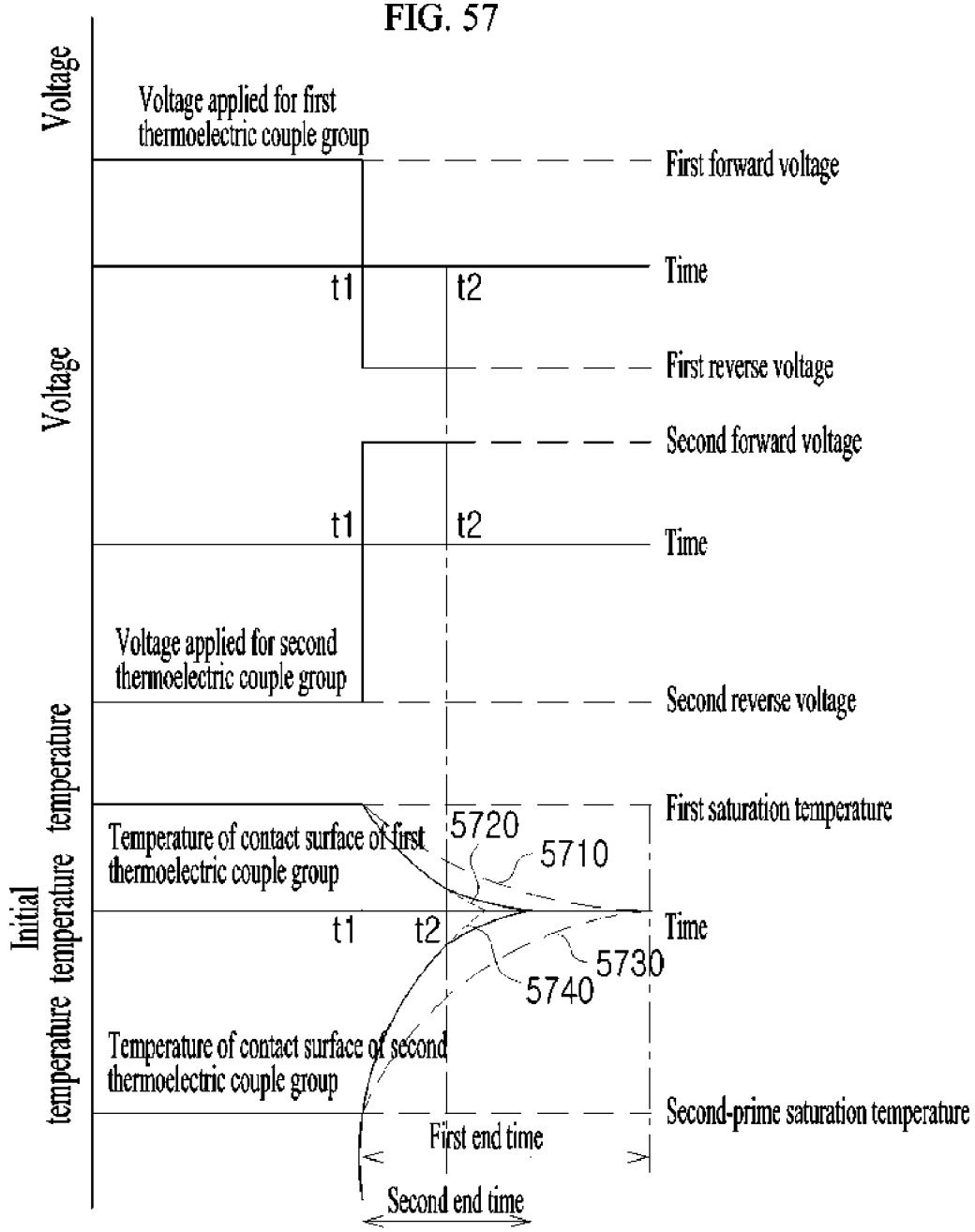
FIG. 57 is a diagram showing a change in temperature on a contact surface and a change in applied voltage according to the end time reduction method for the thermal feedback when a thermal grill feedback is output from a thermoelectric couple group according to an embodiment of the present invention.

FIG. 57 is a diagram showing a change in temperature on a contact surface and a change in applied voltage according to the end time reduction method for the thermal feedback when a thermal grill feedback is output from a thermoelectric couple group according to an embodiment of the present invention.

Referring to FIG. 57, a thermal grill feedback with a first intensity may be output from a first thermoelectric couple group and a second thermoelectric couple group in the feedback device 1600. When the neutral ratio is set to 2, the feedback device 1600 may apply, to the first thermoelectric couple group, a first operating voltage (a first forward voltage in the example of FIG. 57) for outputting a hot feedback with a first intensity and may apply, to the second thermoelectric couple group, a first operating voltage (a second reverse voltage in the example of FIG. 57) for outputting a cold feedback with a second intensity. Thus, the temperature of the contact surface of the first thermoelectric couple group may reach a first saturation temperature, and the temperature of the contact surface of the second thermoelectric couple group may reach a second-prime saturation temperature.

Also, when the output of the thermal grill feedback ends at a first time point, the feedback device 1600 may stop applying the first operating voltage and the second operating voltage at the first time point. Accordingly, the temperature of the surface area of the first thermoelectric couple group may drop along a first reference temperature intensity 5710, and the temperature of the surface area of the second thermoelectric couple group may rise along a third reference temperature intensity 5730 so that the temperature of the surface area of the first thermoelectric couple group and the temperature of the surface area of the second thermoelectric couple group may reach an initial temperature after a first end time elapses.

Also, by using the thermal feedback end time reduction method, the feedback device 1600 may apply, to the first thermoelectric couple group, a first end voltage (a first reverse voltage in the example of FIG. 57) for stopping output of the hot feedback with the first intensity and may apply, to the second thermoelectric couple group, a second end voltage (a second forward voltage in the example of FIG. 57) for stopping output of the cold feedback with the second intensity, between the first time point and a second time point.

Since the first end voltage is applied to the first thermoelectric couple group, the temperature of the contact surface of the first thermoelectric couple group may drop along a second reference temperature curve 5720 at a rate faster than a temperature drop rate of the contact surface when the first end voltage is not applied to the first thermoelectric couple group. Also, since the second end voltage is applied to the second thermoelectric couple group, the temperature of the contact surface of the second thermoelectric couple group may rise along a fourth reference temperature curve 5740 at a rate faster than a temperature rise rate of the contact surface when the second end voltage is not applied to the second thermoelectric couple group. Accordingly, the temperature of the contact surface of the first thermoelectric couple group and the temperature of the contact surface of the second thermoelectric couple group may reach the initial temperature at a second end time shorter than the first end time.

However, for convenience of description, it is assumed that a time point at which the temperature of the contact surface of the first thermoelectric couple group reaches the initial temperature and a time point at which the temperature of the contact surface of the second thermoelectric couple group reaches the initial temperature coincide with each other, but the present invention is not limited thereto. The time point at which the temperature of the contact surface of the first thermoelectric couple group reaches the initial temperature and the time point at which the temperature of the contact surface of the second thermoelectric couple group reaches the initial temperature may not coincide with each other. For example, in order for the cold feedback to be output from the second thermoelectric couple group, when electric energy is applied to the second thermoelectric couple group, a part of the electric energy induces an endothermic reaction while the remaining part of the electric energy is converted into heat energy. Here, the part directly converted into the heat energy is discharged through a heat sink or the like connected to the rear surface of the thermoelectric element, but a part thereof remains in the thermoelectric element in the form of residual heat. In some cases, due to the residual heat, the temperature of the contact surface of the second thermoelectric couple group may reach the initial temperature faster than the temperature of the contact surface of the first thermoelectric couple group.

As another example, a difference between the initial temperature and the second-prime saturation temperature may be greater than a difference between the initial temperature and the first saturation temperature. In some cases, due to the temperature difference, the temperature of the contact surface of the first thermoelectric couple group may reach the initial temperature faster than the temperature of the contact surface of the second thermoelectric couple group.

As described above, when the end time reduction method for the thermal feedback is performed on the feedback device 1600 although the temperature of the contact surface of the first thermoelectric couple group and the temperature of the contact surface of the second thermoelectric couple group reach the initial temperature at different time points, the time it takes for the temperature of the contact surface of the first thermoelectric couple group to reach the initial temperature and the time it takes for the temperature of the contact surface of the second thermoelectric couple group to reach the initial temperature are reduced. That is, as the time point at which the output of the thermal grill feedback ends is reduced, the user may not feel unnecessary heat.

5.2. Continuous Output of Thermal Feedback

Figure 58:
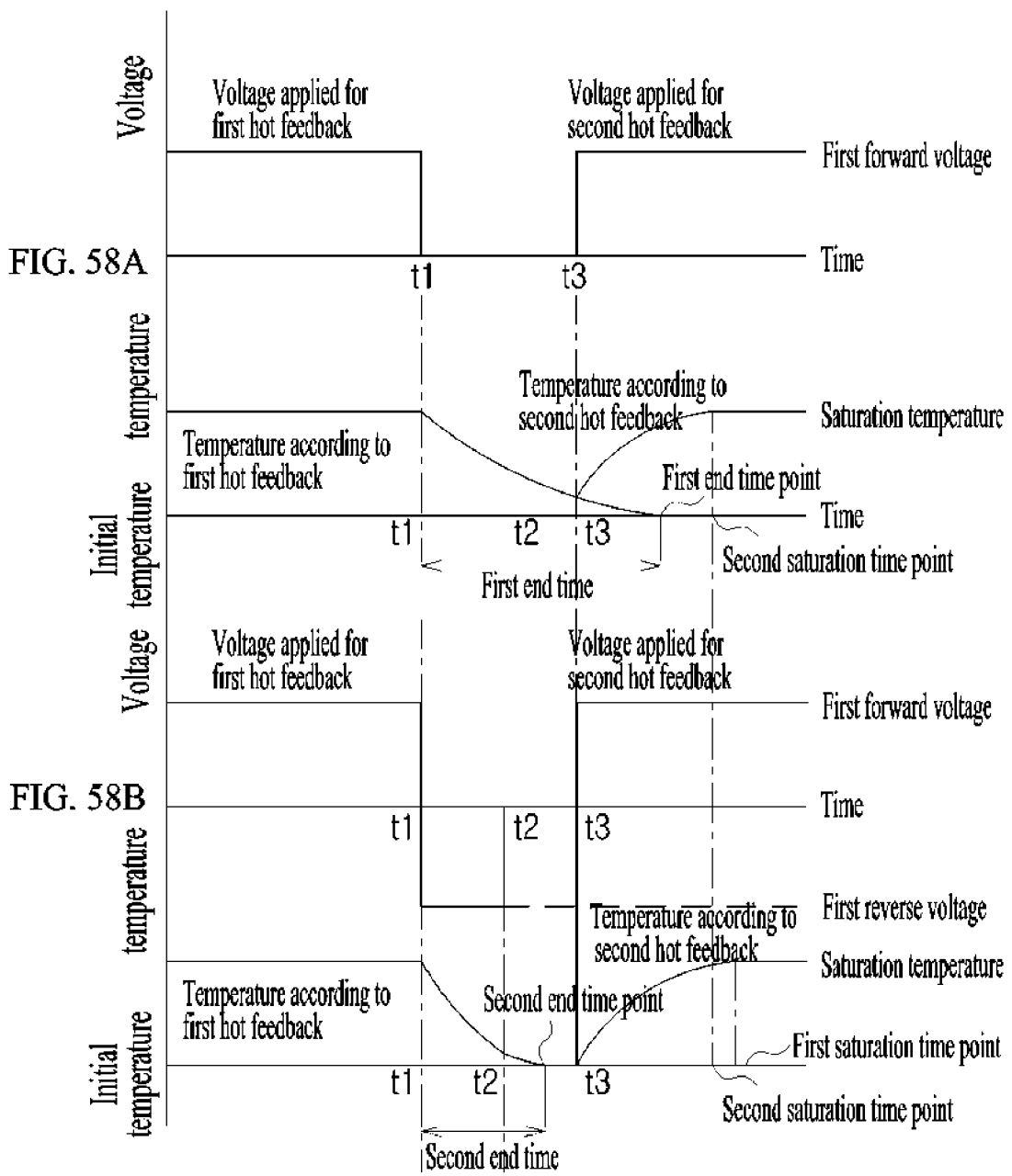
FIGS. 58A and 58B are diagrams showing a change in temperature on a contact surface and a change in applied voltage when a hot feedback is continuously output from a thermoelectric couple group according to an embodiment of the present invention.

FIG. 58 is a diagram showing a change in temperature on a contact surface and a change in applied voltage when a hot feedback is continuously output from a thermoelectric couple group according to an embodiment of the present invention.

Referring to FIG. 58, FIG. 58A relates to a continuous hot feedback output operation when the thermal feedback end time reduction method is not performed. In FIG. 58A, the feedback device 1600 may acquire thermal feedback data from the content reproduction device 1200 and may apply an operating voltage (a first forward voltage in FIG. 58) to a thermoelectric couple group up to a first time point according to the thermal feedback data. Accordingly, the temperature of the contact surface of the thermoelectric couple group may become a saturation temperature. Also, according to the thermal feedback data, the feedback device 1600 may stop applying the operating voltage at the first time point, and the temperature of the contact surface may drop during a first response time and reach the initial temperature at a first end time point. In this case, according to the thermal feedback data, the feedback device 1600 may apply the operating voltage to the thermoelectric couple group in order to output a second hot feedback at a third time point. When the temperature of the contact surface at the third time point is the initial temperature and the operating voltage is applied to the thermoelectric couple group, the temperature of the contact surface may be saturated at a first saturation time point. However, in FIG. 58A, the third time point is a time point preceding the first end time point, and the temperature of the contact surface at the third time point may be higher than the initial temperature. Thus, when the operating voltage is applied to the thermoelectric couple group at the third time point, the temperature of the contact surface may reach the saturation temperature at a second saturation time point, which is before the first saturation time point. Also, as the time it takes to reach the saturation temperature is reduced, a time point at which the user senses the thermal feedback through the contact surface may precede the user's sensing time point intended by the content reproduction device 1200.

According to an embodiment of the present invention, the user's sensing time point intended by the content reproduction device 1200 has to coincide with the time point at which the user senses the thermal feedback through the contact surface. The user's intended sensing time point may coincide with a thermal event scene reproduction time point. Thus, when the user's sensing time point does not coincide with the time point at which the user senses the thermal feedback through the contact surface, the thermal event scene reproduction time point and the time point at which the user senses the thermal feedback through the contact surface are out of synchronization, and thus the user's thermal experience may be degraded.

Accordingly, in FIG. 58A, since the time point at which the user senses the thermal feedback through the contact surface precedes the user's intended sensing time point, the user's thermal experience may be degraded.

FIG. 58B relates to a continuous hot feedback output operation when the thermal feedback end time reduction method is performed. In FIG. 58B, the feedback device 1600 may acquire thermal feedback data from the content reproduction device 1200 and may apply an operating voltage (a first forward voltage in FIG. 58) to a thermoelectric couple group up to a first time point according to the thermal feedback data. Also, according to the thermal feedback data, the feedback device 1600 may apply the end voltage (a first reverse voltage in FIG. 58) between the first time point and a second time point. Accordingly, the temperature of the contact surface may drop during a second response time and may reach the initial temperature at a second end time point, which is before the first end time point.

In this case, as in FIG. 58A, according to the thermal feedback data, the feedback device 1600 may apply the operating voltage to the thermoelectric couple group in order to output a second hot feedback at a third time point. However, unlike FIG. 58A, the temperature of the contact surface may be the initial temperature at the third time point. Thus, the temperature of the contact surface may be saturated at the first saturation time point by the operating voltage. That is, unlike FIG. 58A, the time it takes to reach the saturation temperature may not be reduced. Accordingly, the time point at which the user senses the thermal feedback through the contact surface may not be reduced. As a result, the user's sensing time point intended by the content reproduction device 1200 may coincide with the time point at which the user senses the thermal feedback through the contact surface.

Since the user's intended sensing time point may coincide with the thermal event scene reproduction time point, the thermal event scene reproduction time point may coincide with the time point at which the user senses the thermal feedback through the contact surface, and thus the user's thermal experience may not be degraded.

In summary, the end time of the first thermal feedback is reduced by the end time reduction method for the thermal feedback, and thus the output of a subsequent second thermal feedback may be more earlier initiated. In FIG. 58A, in order to not degrade the user's thermal experience, the output of the second thermal feedback should be initiated after the first end time point. On the other hand, in FIG. 58B, the user's thermal experience may not be degraded although the output of the second thermal feedback is initiated after a second end time point, which precedes the first end time point.

Accordingly, when the thermal feedback end time reduction method is performed, it is possible to continuously output a thermal feedback in a shorter time.

6. Feedback Device with Enhanced Waste Heat Dissipation Performance and Enhanced Cold Sensation Provision Performance FIG. 59 is a block diagram showing a configuration of the feedback device 1600 according to another embodiment of the present invention.

Figure 59:
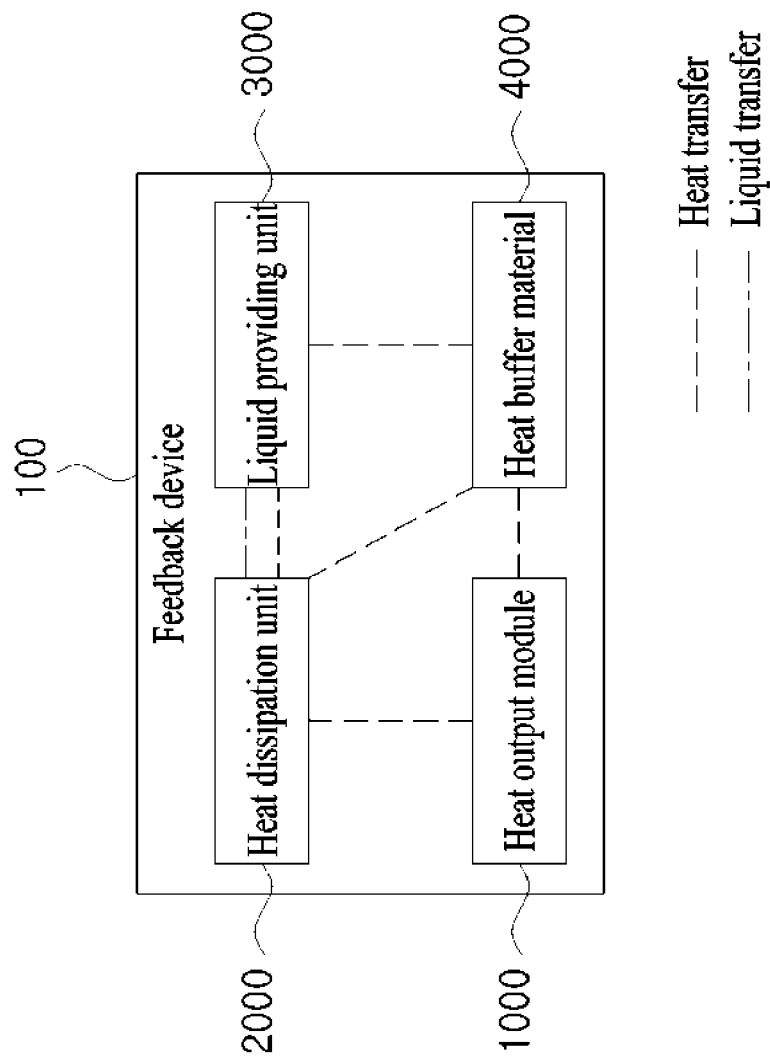
FIG. 59 is a block diagram showing a configuration of the feedback device 1600 according to another embodiment of the present invention.

Referring to FIG. 59, as described above, the feedback device 1600 may include a heat output module 1640, a heat dissipation unit 2000, a liquid provision unit 3000, and a heat buffer material 4000. Here, the heat buffer material 4000 may indicate a material that absorbs a predetermined amount of heat from the outside of the heat buffer material 4000 and holds the absorbed heat.

The heat output module 1640 may output a thermal feedback. The thermal feedback may be output by the heat output module 1640, which includes a contact surface 1641 brought into contact with a user's body and a thermoelectric element connected to the contact surface 1641, applying hot heat or cold heat, which is generated in the thermoelectric element when power is applied, to the user's body through the contact surface 1641. According to an embodiment of the present invention, the heat output module 1640 may perform an exothermic operation, endothermic operation, or thermal grill operation according to a thermal feedback signal received from an external device through a communication module (not shown) for communicating with the external device, instead of the feedback device 1600, to output a thermal feedback, and the user may experience a thermal experience due to the output thermal feedback. Also, when a temperature difference occurs near the heat output module 1640, an electromotive force may be generated, and the heat output module 1640 may provide electric power using the electromotive force.

The heat dissipation unit 2000 may be configured to dissipate waste heat generated by the thermoelectric module 1000 to the outside of the feedback device 1600. Here, the waste heat may refer to the remaining heat other than heat used to provide a thermal experience to the user among the heat generated by the feedback device 1600. For example, residual heat remaining in the feedback device 1600 after the thermal feedback is output by the heat output module 1640 may be included in the waste heat.

The liquid provision unit 3000 may be configured to allow the heat dissipation unit 2000 to dissipate the waste heat in the form of latent heat. According to an embodiment of the present invention, the liquid provision unit 3000 may provide liquid to the heat dissipation unit 2000, and the liquid provided by the heat dissipation unit 2000 may be vaporized by the waste heat delivered from the heat output module 1640. Due to the vaporization, a larger amount of waste heat may be discharged to the outside. Also, the temperature of the feedback device 1600 may drop due to the vaporization. For example, the vaporized liquid may take heat away from liquid that is provided to the heat dissipation unit 2000 but is not vaporized, and thus the temperature of the liquid that is provided to the heat dissipation unit 2000 but is not vaporized may decrease.

As the heat buffer material 4000 absorbs and holds a predetermined amount of heat, the degree to which the user's thermal experience is degraded by the waste heat may decrease, and the amount of cold heat transferred to the user may increase while waste heat absorbed by the heat buffer material 4000 is additionally generated.

According to an embodiment of the present invention, the heat buffer material 4000 may be provided in various shapes. For example, the heat buffer material 4000 may be provided in an independent material shape. As an example, the heat buffer material 4000 may be disposed in a partial region of the heat dissipation unit 2000 in a plurality of independent material shapes. As another example, the heat buffer material 4000 may be provided in the form of a layer. As an example, the heat buffer material 4000 may be disposed on one surface of at least one of the heat output module 1640, the heat dissipation unit 2000, or the liquid provision unit 3000 in the form of a layer.

It will be appreciated that the heat buffer material 4000 may be provided in any form capable of being included in the feedback device 1600 other than the independent material shape or layer shape. Also, according to an embodiment, the heat buffer material 4000 may be separated from the feedback device 1600. As an example, the heat buffer material 4000 may be separated from the feedback device 1600 and replaced with another heat buffer material. As another example, when the heat buffer material 4000 absorbs heat, the heat buffer material 4000 may be separated from the feedback device 1600 so that the heat is dissipated to the outside of the feedback device 1600.

According to an embodiment of the present invention, the heat buffer material 4000 may be a phase change material (PCM). The PCM, which is a material with high heat of fusion, may be melted or solidified at specific temperatures to store or release a large amount of heat energy. In an embodiment, the PCM may store or release heat through chemical bonding. As an example, it is assumed that the PCM is a solid-to-liquid phase transition material. When heat is applied while the PCM is solid, the temperature of the PCM increases. When the temperature of the PCM reaches the melting point or the transition temperature of the PCM, the PCM continues to absorb heat, but the temperature of the PCM does not increase. In this case, the PCM transitions from solid to liquid. Subsequently, when heat is not applied to the PCM, the PCM releases the accumulated heat to the outside so that the PCM may return from liquid to solid.

Thus, the temperature of the PCM increases from the initial temperature to the transition temperature but does not increase until the phase transition is completed after the transition temperature is reached. Also, each PCM may have an inherent transition temperature. When the PCM is composed of the heat buffer material 4000, the transition temperature of the PCM may fall within an internal temperature change range of the feedback device 1600. When the transition temperature of the PCM is not within the internal temperature change range of the feedback device 1600, the phase transition of the PCM does not occur although waste heat is accumulated in the feedback device 1600. Accordingly, the temperature of the PCM continuously increases, and thus the PCM cannot function as the heat buffer material 4000. For example, the transition temperature of the PCM may range between 5° C. and 60° C. or between 20° C. and 40° C.

According to an embodiment of the present invention, a PCM used for the heat buffer material 4000 may be composed of various materials. For example, the PCM may include hydrated inorganic salts including hydrated calcium chloride, lithium nitrogen oxide, glauber's salt, and the like; polyhydric alcohols including dimethyl propanediol (DMP), hexamethyl propanediol (HMP), xylitol, erythritol, and the like; and linear chain hydrocarbons including a polyethylene terephthalate (PET)-polyethylene glycol (PEG) copolymer, PEG, polytetramethyl glycol (PTMG), and paraffin.

Also, according to an embodiment of the present invention, a PCM used for the heat buffer material 4000 may be implemented in various forms. For example, the PCM may be included in a microcapsule, filled in fabric, or coated.

Figure 60:
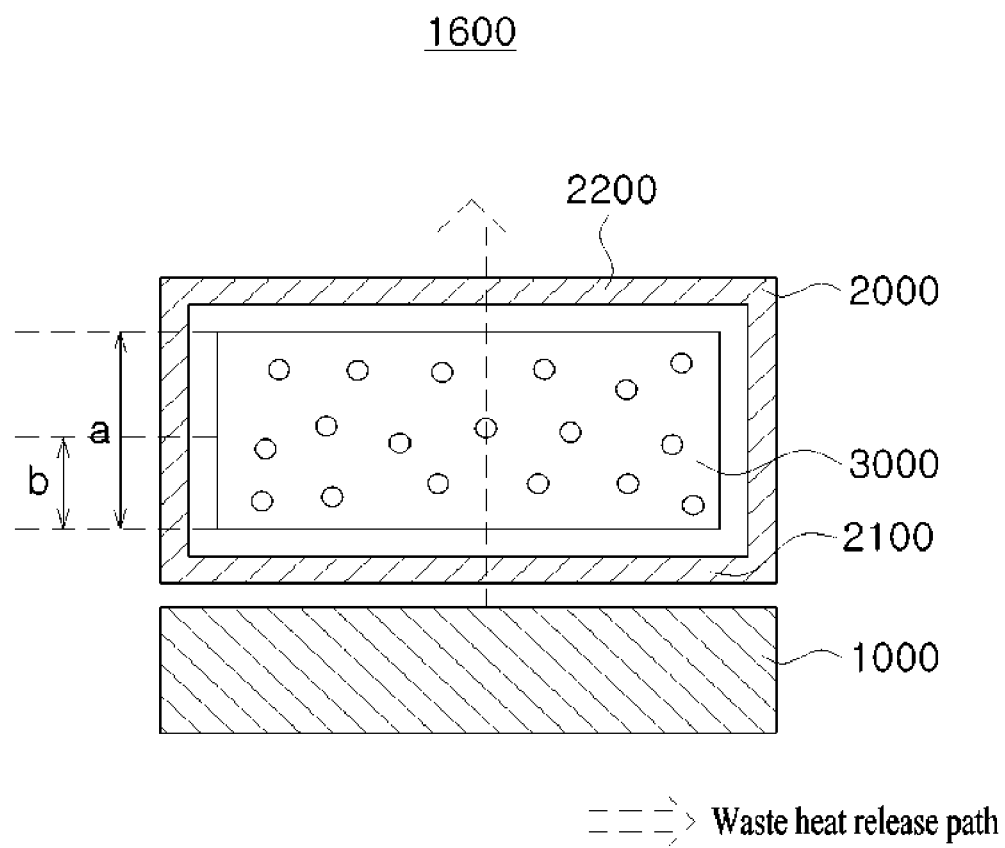
FIG. 60 is a diagram showing a configuration of the feedback device 1600 according to an embodiment of the present invention.

FIG. 60 is a diagram showing a structure of the feedback device according to an embodiment of the present invention.

FIG. 60 shows a cross-sectional view of the feedback device 1600 according to an embodiment of the present invention. Referring to FIG. 60, the feedback device 1600 may be stacked in the order of the heat output module 1640 and the heat dissipation unit 2000, and the liquid provision unit 3000 may be placed inside the heat dissipation unit 2000. Here, the heat output module 1640 may have a bottom surface in direct or indirect contact with a user to provide a thermal feedback to the user. For example, it is assumed that the feedback device is a wrist band type wearable device. When the wearable device is worn by a user, the heat output module 1640 may be placed at a portion in contact with the user, and the heat dissipation unit 2000 may be placed at a portion not in contact with the user. Also, a part to which waste heat is transferred from the heat dissipation unit 2000 may be a heat transfer unit 2100 (e.g., the bottom surface and a side surface of the heat dissipation unit 2000), and a part in which waste heat is evaporated in the form of latent heat may be a heat radiating unit 2200 (e.g., the top surface of the heat dissipation unit 2000).

In addition, according to an example embodiment of the present invention, a liquid blocking material (e.g., a waterproof membrane, a waterproof film) may be disposed between the liquid provision unit 3000 and the heat output module 1640 so that liquid may be prevented from being transferred from the liquid provision unit 3000 to the heat output module 1640.

According to an embodiment of the present invention, when the heat output module 1640 performs an endothermic operation, cold heat may be transferred to the bottom surface of the heat output module 1640, and hot heat may be transferred to the top surface of the thermoelectric module 1000. Such a hot heat may be waste heat that may degrade a user's thermal experience. In this case, the waste heat may be transferred from the thermoelectric module 1000 to the heat radiating unit 2200 through the heat transfer unit 2100 and the liquid provision unit 3000 and may be discharged by the heat radiating unit 2200. That is, a waste heat transfer path may be formed using the heat output module 1640, the heat transfer unit 2100, the liquid provision unit 3000, and the heat radiating unit 2200. In this case, the liquid provision unit 3000 may provide liquid contained in the liquid provision unit 3000 to the heat radiating unit 2200, and the liquid provided by the liquid provision unit 3000 may be evaporated in the heat radiating unit 2200 due to the waste heat. Due to the evaporation of the liquid, the waste heat may be discharged to the outside of the feedback device 1600.

Also, according to an embodiment of the present invention, the heat radiating unit 2200 may have liquid transfer directionality in a specific direction for each material. For example, the liquid transfer directionality of the heat radiating unit 2200 may be vertical or horizontal. According to an embodiment of the present invention, liquid may be transferred from the bottom of the heat radiating unit 2200 to the heat radiating unit 2200. Thus, according to an embodiment of the present invention, it may be advantageous, in terms of improving waste heat dissipation performance, for the heat radiating unit 2200 to have the vertical liquid transfer directionality.

Also, according to an embodiment of the present invention, the heat radiating unit 2200 may have evaporation directionality in a specific direction for each material. For example, the evaporation directionality of the heat radiating unit 2200 may be an upward direction or a lateral direction. According to an embodiment of the present invention, liquid may evaporate into the air on the top of the heat radiating unit 2200. Thus, according to an embodiment of the present invention, it may be advantageous, in terms of improving waste heat dissipation performance, for the heat radiating unit 2200 to have the upward evaporation directionality.

Also, in a structure according to an embodiment of the present invention, the length of the waste heat transfer path may vary depending on the thickness of the liquid provision unit 3000. For example, in the example of FIG. 60, a waste heat transfer path when the thickness of the liquid provision unit 3000 is "b" may be shorter than a waste heat transfer path when the thickness of the liquid provision unit 3000 is "a." As the waste heat transfer path is reduced, a time during which the waste heat remains in the liquid provision unit 3000 may be shortened, and thus the waste heat dissipation performance of the feedback device 1600 may be enhanced.

In an embodiment, when the thickness of the liquid provision unit 3000 decreases, the amount of liquid contained by the liquid provision unit 3000 may decrease. When no liquid remains in the liquid provision unit 3000, liquid has to be replenished. As the thickness of the liquid provision unit 3000 decreases, the time it takes to deplete liquid may also decrease. That is, depending on the thickness of the liquid provision unit 3000, the waste heat dissipation performance of the feedback device 1600 and the liquid holding performance of the liquid provision unit 3000 may be in a trade-off relationship.

Figure 61:
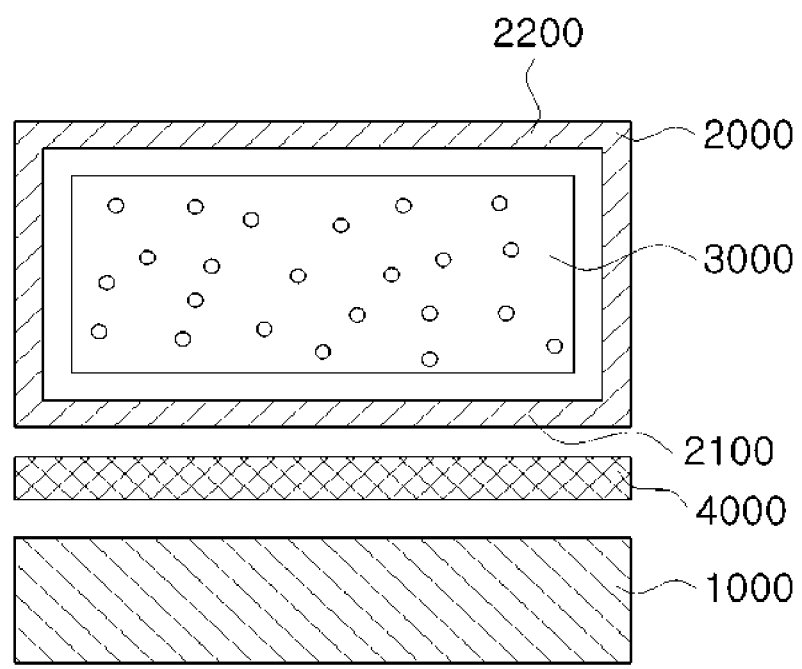
FIG. 61 is a diagram showing a structure of the feedback device 1600 to which a heat buffer material is applied according to an embodiment of the present invention.

FIG. 61 is a diagram showing a structure of the feedback device to which a heat buffer material is applied according to an embodiment of the present invention.

Referring to FIG. 61, the feedback device 1600 may be stacked in the order of the heat output module 1640 and the heat dissipation unit 2000, and the liquid provision unit 3000 may be placed inside the heat dissipation unit 2000. In this case, the heat buffer material 4000 may be placed between the heat dissipation unit 2000 and the heat output module

1640. Here, the heat buffer material 4000 may be implemented in the form of a layer. Also, the heat dissipation unit 2000 may be composed of a heat transfer unit 2100 and a heat radiating unit 2200. Also, a waste heat transfer path may be formed using the heat output module 1640, the heat buffer material 4000, the heat transfer unit 2100, the liquid provision unit 3000, and the heat radiating unit 2200.

According to an embodiment of the present invention, as the heat buffer material 4000 is placed between the heat output module 1640 and the heat transfer unit 2100, the amount of waste heat accumulated inside the feedback device 1600 during a predetermined time may decrease, and the transfer of the waste heat from the heat output module 1640 to the heat transfer unit 2100 may be delayed. As a specific example, when the heat output module 1640 performs an endothermic operation, waste heat may be generated in the heat output module 1640. Also, when the generated waste heat is transferred to the heat buffer material 4000, the temperature of the heat buffer material 4000 increases up to a transition temperature due to the waste heat, but the temperature of the heat buffer material 4000 may be maintained at the transition temperature until the phase transition of the heat buffer material 4000 is completed. In this case, while the temperature of the heat buffer material 4000 is maintained at the transition temperature, the waste heat is not accumulated inside the feedback device 1600 because the heat buffer material 4000 absorbs the waste heat. Also, the waste heat, which has a temperature higher than the transition temperature, may not be transferred from the heat buffer material 4000 to the heat transfer unit 2100. Subsequently, when the phase transition of the heat buffer material 4000 is completed, waste heat having a temperature higher than the transition temperature is additionally accumulated inside the feedback device 1600, and the waste heat may be transferred to the heat transfer unit 2100. Thus, while the heat buffer material 4000 is maintained at the transition temperature, the amount of waste heat inside the feedback device 1600 is reduced compared to the case where the heat buffer material 4000 is not included. As the effect of the waste heat on the user's thermal experience is reduced while the heat buffer material 4000 is maintained at the transition temperature, cold sensation provision performance of the feedback device 1600 may be enhanced.

The method according to an embodiment may be implemented as program instructions executable by a variety of computers and may be recorded on a computer-readable medium. The computer-readable recording medium may include a program instruction, a data file, a data structure, or a combination thereof. The program instruction recorded in the medium may be designed and configured specially for the embodiment or may be publicly known and available to those skilled in the field of computer software. Examples of the computer-readable recording medium include a magnetic medium, such as a hard disk, a floppy disk, and a magnetic tape, an optical medium, such as a compact disc read-only memory (CD-ROM), a digital versatile disc (DVD), etc., a magneto-optical medium such as a floptical disk, and a hardware device specially configured to store and perform program instructions, for example, a read-only memory (ROM), a random access memory (RAM), a flash memory, etc. Examples of the program instructions include not only machine code generated by a compiler or the like but also high-level language codes that may be executed by a computer using an interpreter or the like. The hardware device may be configured as at least one software module in order to perform operations of the embodiment and vice versa.

Although the present invention has been described with reference to specific embodiments and features, it will be appreciated that various variations and modifications can be made from the invention by those skilled in the art. For example, suitable results may be achieved if the described techniques are performed in a different order and/or if components in a described system, architecture, device, or circuit are combined in a different manner and/or replaced or supplemented by other components or their equivalents.

Accordingly, other implementations, embodiments, and equivalents are within the scope of the following claims.

The invention claimed is:

1. A method for an electronic device for outputting a thermal feedback through a contact surface of the electronic device in contact with a user's body part including:
    applying operating power related to a first direction to a thermoelectric element of the electronic device to output the thermal feedback, wherein the thermal feedback is generated based on at least one of an exothermic operation or an endothermic operation by the operating power;
    identifying a time point at which the thermal feedback ends;
    applying end power related to a second direction opposite to the operating power to the thermoelectric element, during a specific time from the time point at which the thermal feedback ends; and
    stopping the application of the end power after the specific time elapses.

2. The method of claim 1, wherein a voltage magnitude related to the end power corresponds to a voltage magnitude related to the operating power.

3. The method of claim 1, wherein a voltage magnitude related to the end power is different from a voltage magnitude related to the operating power.

4. The method of claim 1, wherein the applying of the end power further includes applying the end power in a form of a duty signal.

5. The method of claim 1, wherein, based on the applying of the end power, a temperature of the contact surface more quickly reaches an initial temperature of the contact surface when a first end voltage having a first voltage magnitude is applied to the thermoelectric element than when a second end voltage having a second voltage magnitude smaller than the first voltage magnitude is applied to the thermoelectric element.

6. The method of claim 1, wherein, based on the applying of the end power, a temperature of the contact surface more quickly reaches an initial temperature of the contact surface when the end voltage is applied during a first time interval from the end time point than when the end voltage is applied to the thermoelectric element during a second time interval smaller than the first time interval from the end time point.

7. The method of claim 1, wherein the applying of the end power further includes applying the end power so that an initial temperature of the contact surface is not exceeded after a temperature of the contact surface reaches the initial temperature.

8. The method of claim 7, wherein the applying of the end power further includes determining a voltage magnitude of the end power so that a temperature of the contact surface does not reach the initial temperature of the contact surface during the specific time during which the end power is applied.

9. The method of claim 7, wherein the applying of the end power further includes determining the specific time so that a temperature of the contact surface does not reach the initial temperature during the specific time during which the end power is applied.

10. The method of claim 7, wherein, when the thermal feedback corresponds to a hot feedback for making the user feel a hot sensation, the operating voltage is a forward voltage causing the exothermic operation, and the end voltage is a reverse voltage opposite to the forward voltage.

11. The method of claim 7, wherein, when the thermal feedback corresponds to a cold feedback for making the user feel a cold sensation, the operating voltage is a reverse voltage causing the endothermic operation in the thermoelectric element, and the end voltage is a forward voltage opposite to the reverse voltage.

12. The method of claim 1,
wherein the thermoelectric element is provided as a thermoelectric couple array including a plurality of thermoelectric couple groups individually controllable, and
wherein the applying of the end power further includes applying the end power to at least one of the plurality of thermoelectric couple groups.

13. The method of claim 12, wherein the thermoelectric couple array includes a first thermoelectric couple group and a second thermoelectric couple group that are individually controllable,
wherein when the thermal feedback is a thermal grill feedback for making the user feel a pain sensation,
wherein the applying of the operating power further includes applying a first forward voltage causing the exothermic operation in the first thermoelectric couple group to the first thermoelectric couple group and applying a first reverse voltage causing the endothermic operation in the first thermoelectric couple group to the second thermoelectric couple group, and
wherein the applying of the end power further includes applying a second reverse voltage being applied in the opposite direction to the first forward voltage to the first thermoelectric couple group and applying a second forward voltage being applied in the opposite direction to the first reverse voltage to the second thermoelectric couple group.

14. The method of claim 1, wherein the identifying of the end time point further includes acquiring thermal feedback data including information regarding at least one of the type or intensity of the thermal feedback from an external electronic device and identifying the end time point based on the thermal feedback data.

15. The method of claim 1, wherein, when a first thermal feedback and a second thermal feedback are output from the feedback device, the applying of the operating power further includes determining a time point at which the application of the operating power for outputting the second thermal feedback is applicable to the thermoelectric element according to a time in which the temperature of the contact surface reaches the initial temperature of the contact surface after the output of the first thermal feedback ends.

16. The method of claim 1, wherein the applying of the end power further includes applying the end power so that a temperature variation of the contact surface during the specific time in which the end power is applied is greater than a temperature variation of the contact surface after the application of the end power is stopped.

17. The method of claim 1, further comprising:
applying the end power when the intensity of the thermal feedback is greater than or equal to a specific intensity.

18. The method of claim 1, further comprising:
acquiring the intensity of the thermal feedback;
generating the operating power based on the intensity of the thermal feedback; and
determining whether to apply the end power according to whether the intensity of the thermal feedback is greater than or equal to a specific intensity.

19. An electronic device including:
a thermoelectric element configured to perform a thermoelectric operation including at least one of an exothermic operation and an endothermic operation,
a power supply configured to supply power to the thermoelectric element for the thermoelectric operation;
a contact surface provided on one side surface of the thermoelectric element to be contact with a user's body part, and
at least one processor configured to:
output a thermal feedback by transferring the heat generated by the thermoelectric operation to the user through the contact surface,
identify a time point at which the thermal feedback ends,
apply end power related to a second direction opposite to the operating power to the thermoelectric element, during a specific time from the time point at which the thermal feedback ends, and
stop the application of the end power after the specific time elapses.

20. A non-transitory recording medium storing an instructions, when executed, configured to cause an electronic device to:
output a thermal feedback by transferring the heat generated by the thermoelectric operation to the user through the contact surface,
identify a time point at which the thermal feedback ends,
apply end power related to a second direction opposite to the operating power to the thermoelectric element, during a specific time from the time point at which the thermal feedback ends, and
stop the application of the end power after the specific time elapses.

* * * * *